(12) United States Patent
Nishioka et al.

(10) Patent No.: US 12,402,537 B2
(45) Date of Patent: Aug. 26, 2025

(54) MAGNETORESISTANCE EFFECT ELEMENT, MAGNETIC MEMORY, AND FILM FORMATION METHOD FOR SAID MAGNETORESISTANCE EFFECT ELEMENT

(71) Applicant: TOHOKU UNIVERSITY, Sendai (JP)

(72) Inventors: Koichi Nishioka, Sendai (JP); Tetsuo Endoh, Sendai (JP); Shoji Ikeda, Sendai (JP); Hideo Sato, Sendai (JP); Hiroaki Honjo, Sendai (JP)

(73) Assignee: TOHOKU UNIVERSITY, Miyagi. (JP)

( * ) Notice: Subject to any disclaimer, the term of this patent is extended or adjusted under 35 U.S.C. 154(b) by 624 days.

(21) Appl. No.: 17/271,200

(22) PCT Filed: Aug. 30, 2019

(86) PCT No.: PCT/JP2019/034229
§ 371 (c)(1),
(2) Date: Feb. 24, 2021

(87) PCT Pub. No.: WO2020/045655
PCT Pub. Date: Mar. 5, 2020

(65) Prior Publication Data
US 2021/0399208 A1 Dec. 23, 2021

(30) Foreign Application Priority Data

Aug. 30, 2018 (JP) .................................. 2018-162077
Feb. 27, 2019 (JP) .................................. 2019-034916

(51) Int. Cl.
H10N 50/80 (2023.01)
H10B 61/00 (2023.01)
(Continued)

(52) U.S. Cl.
CPC ............. *H10N 50/80* (2023.02); *H10B 61/00* (2023.02); *H10N 50/01* (2023.02); *H10N 50/85* (2023.02)

(58) Field of Classification Search
CPC ........ H10N 50/80; H10N 50/01; H10N 50/85; H10N 50/10; H10B 61/00; H01F 10/16; H01F 10/32
See application file for complete search history.

(56) References Cited

U.S. PATENT DOCUMENTS

2005/0099724 A1* 5/2005 Nakamura ............... G11C 11/15
365/158
2008/0062578 A1 3/2008 Watanabe et al.
(Continued)

FOREIGN PATENT DOCUMENTS

JP 2007080952 A 3/2007
JP 2008010590 A * 1/2008 ........... G11C 11/161
(Continued)

OTHER PUBLICATIONS

Japanese Patent Office, Office Action for corresponding Japanese patent application No. 2020-539646 dispatched on Jul. 4, 2023, in 8 pages.
(Continued)

*Primary Examiner* — Shaun M Campbell
(74) *Attorney, Agent, or Firm* — Procopio, Cory, Hargreaves & Savitch LLP

(57) ABSTRACT

A magnetoresistance effect element includes a first reference layer, a first junction layer, a first divided recording layer, a second junction layer, a second divided recording layer, and a third junction layer. The first divided recording layer has a configuration having a high magnetoresistance ratio (MR
(Continued)

ratio), and the second divided recording layer (3) has a configuration having a high effective magnetic anisotropy energy density ($K_{eff}t$).

8 Claims, 35 Drawing Sheets

(51) Int. Cl.
  *H10N 50/01* (2023.01)
  *H10N 50/85* (2023.01)

(56) References Cited

U.S. PATENT DOCUMENTS

| | | | |
|---|---|---|---|
| 2012/0063221 A1 | 3/2012 | Yamane et al. | |
| 2012/0063222 A1 | 3/2012 | Yamane et al. | |
| 2012/0320666 A1 | 12/2012 | Ohno et al. | |
| 2014/0042573 A1 | 2/2014 | Yamane et al. | |
| 2014/0254253 A1 | 9/2014 | Uchida et al. | |
| 2014/0284736 A1 | 9/2014 | Toko et al. | |
| 2014/0319521 A1* | 10/2014 | Uchida | H10N 50/80 257/43 |
| 2016/0072053 A1 | 3/2016 | Yamane et al. | |
| 2016/0218279 A1 | 7/2016 | Yamane et al. | |
| 2017/0025600 A1 | 1/2017 | Ohno et al. | |
| 2017/0084823 A1 | 3/2017 | Uchida et al. | |
| 2017/0294571 A1 | 10/2017 | Park et al. | |
| 2018/0175286 A1* | 6/2018 | Sato | H10B 61/22 |
| 2019/0019944 A1* | 1/2019 | Sato | G11C 11/1695 |
| 2019/0304526 A1 | 10/2019 | Honjo et al. | |
| 2020/0044142 A1* | 2/2020 | Honjo | H01L 27/1222 |
| 2020/0090719 A1* | 3/2020 | Nishioka | G11C 11/161 |

FOREIGN PATENT DOCUMENTS

| | | | | |
|---|---|---|---|---|
| JP | 2012064625 A | 3/2012 | | |
| JP | 56000344 B2 | 10/2014 | | |
| JP | 2014187169 A | 10/2014 | | |
| KR | 10-2018-0016678 A | 2/2018 | | |
| WO | 2013080436 A1 | 6/2013 | | |
| WO | 2017212895 A1 | 12/2017 | | |
| WO | WO-2018134929 A1 * | 7/2018 | | G11C 11/161 |

OTHER PUBLICATIONS

Intellectual Patent Office, Office Action for corresponding Korean patent application No. 10-2021-7008712 dispatched on Jul. 25, 2023, in 10 pages.
International Search Report and Written Opinion for related PCT App No. PCT/JP2019/034229 dated Nov. 5, 2011, 20 pgs.
International Preliminary Report on Patentability for related PCT App No. PCT/JP2019/034229 dated Jul. 14, 2020, 11 pgs.
Office Action for corresponding Japanese patent application No. 2020-539646, dated Jan. 30, 2024, 6 pages.
Decision to Grant a Patent for corresponding Japanese patent application No. 2020-539646, dated May 21, 2024, 5 pages.
Notice of Allowance for corresponding Korean patent application No. 10-2021-7008712, dated Jul. 29, 2024, 6 pages.

* cited by examiner

MRa>MRb $K_{sp}t_a > K_{sp}t_b$

| MgO(1.13) |
|---|
| CoFeB25(1.0) |
| W(t) |
| CoFeB25(1.4) |
| MgO(1.0) |

FIG.45A
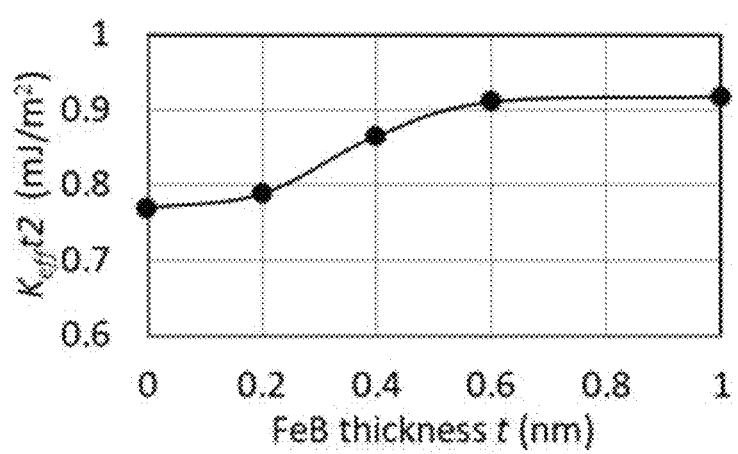
400°C×1h
FIG.45B
FIG.46
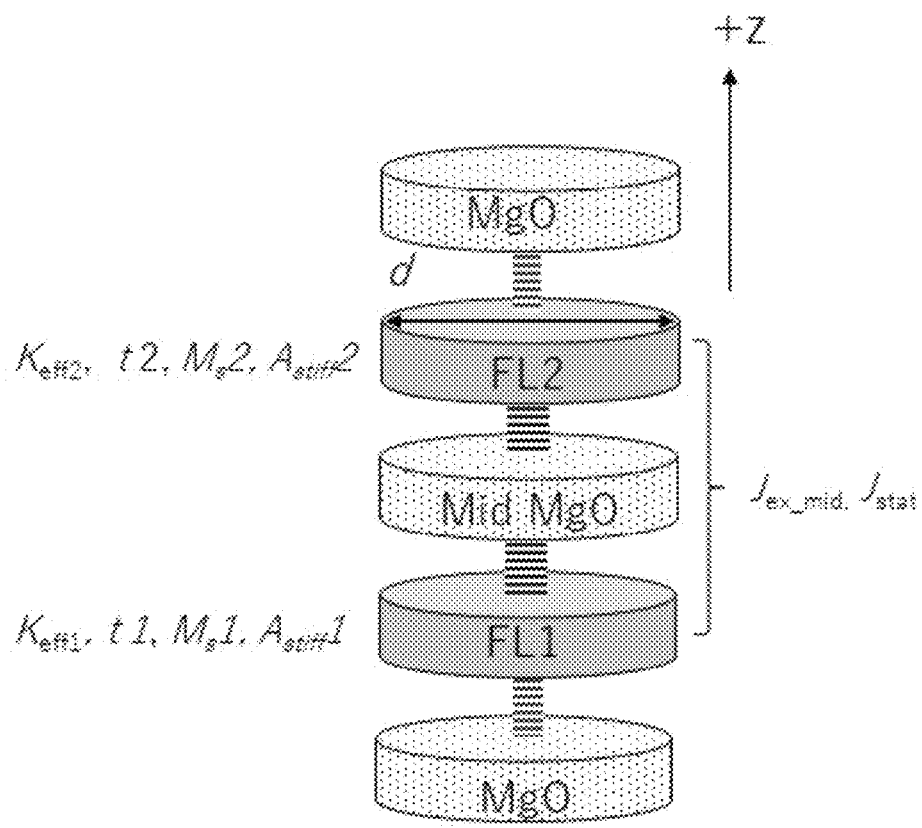

Top view $J_{ex\_mid} = 0.04$ mJ/m², $K_{ueff}t2=0.21$ mJ/m², $K_{ueff}t2=0.65$ mJ/m², $J_{dip}=0.12$ mJ/m², $t1=2.7$nm, $t2=2.6$nm, $M_s1=M_s2=0.95$T, $A_{stiff}1 = A_{stiff}1 =5.3$ pJ/m, $d = 56$nm

MAGNETORESISTANCE EFFECT ELEMENT, MAGNETIC MEMORY, AND FILM FORMATION METHOD FOR SAID MAGNETORESISTANCE EFFECT ELEMENT

CROSS-REFERENCE TO RELATED APPLICATIONS

This application is a U.S. National Stage entry of PCT Application No: PCT/JP2019/034229 filed on Aug. 30, 2019, which claims priority to Japanese Patent Application Nos. 2019-034916 filed Feb. 27, 2019, and 2018-162077 filed Aug. 30, 2018, the contents of which are incorporated herein by reference.

TECHNICAL FIELD

The present invention relates to a magnetoresistance effect element, a magnetic memory including the magnetoresistance effect element, and a film formation method for the magnetoresistance effect element, and specifically to a magnetoresistance effect element including a recording layer interposed between three junction layers.

BACKGROUND ART

A magnetic random access memory (MRAM, magnetic memory) is a nonvolatile memory using a magnetic tunnel junction (MTJ).

The MRAM does not consume power during standby and has high-speed operability and high write resistance, and moreover the memory size thereof can be reduced, hence, has been attracting attention as a next-generation logic integrated circuit.

A magnetoresistance effect element used in the MRAM has a basic structure in which a non-magnetic layer serving as a tunnel barrier layer is interposed between a recording layer and a reference layer. Bit information recorded in a magnetic layer (recording layer) of the MRAM is transmitted through the tunnel barrier layer and is read using the effect of a tunnel magnetoresistance (TMR).

Here, characteristics important for application of a magnetoresistance effect element used in the MRAM include (i) a large thermal stability index Δ, (ii) a low write current $I_{C0}$, (iii) a large magnetoresistance ratio (MR ratio) of the magnetoresistance effect element, and (iv) a small element size. The characteristic (i) is required for a nonvolatile magnetic memory, the characteristic (ii) is required to reduce the size of a cell transistor, reduce the cell size, and reduce power consumption, the characteristic (iii) is required to deal with reading at a high speed, and the characteristic (iv) is required to reduce the cell area and increase the capacity.

A magnetoresistance effect element having a so-called double interface, has been developed in which the number of interfaces (an interface between a magnetic layer containing Fe, Co, or the like and a layer containing O) in contact with a recording layer of the basic configuration of an MRAM is increased, (i) in order to increase the thermal stability index Δ from among the above characteristics, (refer to FIG. 15). As shown in FIG. 15, a recording layer A1 of a magnetoresistance effect element having a double interface has a configuration of being interposed between a tunnel barrier layer, i.e., a first junction layer 11, and a second junction layer 12. This configuration is based on a technical idea in which, since the thermal stability index Δ is represented by the following formula in Math. 1, by increasing the number of interfaces in contact with the recording layer, the interfacial magnetic anisotropy energy density $K_i$ is increased.

$$\Delta = \frac{E}{k_B T} = \frac{K_{\mathit{eff}} t S}{k_B T} = \left(K_1 + K_b t - \frac{M_s^2}{2\mu_0}t\right)\frac{S}{k_B T} \quad \text{[Math. 1]}$$

In the formula in Math. 1, E indicates an energy barrier, $K_B$ indicates a Boltzmann constant, T indicates an absolute temperature, $K_{\mathit{eff}}$ indicates an effective magnetic anisotropy energy density per unit volume, t indicates a film thickness, $K_{\mathit{eff}}t$ indicates an effective magnetic anisotropy energy density per unit area, S indicates an area of a recording layer, $K_i$ indicates an interfacial magnetic anisotropy energy density, $K_b$ indicates a bulk (crystal) magnetic anisotropy energy density, $M_s$ indicates a saturation magnetization, and $\mu_0$ indicates a vacuum magnetic permeability. Here, the effective magnetic anisotropy energy density per unit area of the entire element is represented by $K_{\mathit{eff}}t^*$.

However, also in a magnetoresistance effect element having a double interface, since the area(S) of the element is reduced when (iv) the element size is miniaturized, there is a problem of difficulties of securing a high effective magnetic anisotropy energy density $K_{\mathit{eff}}t^*$ for the entire element and increasing the thermal stability index Δ in order to increase the capacity.

In order to address the problem in such a magnetoresistance effect element having a double interface, the inventors have proposed a magnetoresistance effect element having a so-called quadruple interface having more interfaces (refer to PTL 1, FIG. 8, etc.). This is based on a technical idea in which by further increasing the number of interfaces of junction layers and barrier layers in contact with the recording layer, the interfacial magnetic anisotropy energy density $K_i$ is further increased, and a decrease in the thermal stability index Δ due to the decrease in the volume of the element is reduced.

CITATION LIST

Patent Literature

[PTL 1] Japanese Patent No. 5600344

SUMMARY OF INVENTION

Technical Problem

However, in the above magnetoresistance effect element having a quadruple interface disclosed in PTL 1, since the resistance area product RA also increases as the number of interfaces increases, it is also necessary to consider the reduction in the resistance area product RA in the consideration of the above characteristics that are important for application of the MRAM. Here, the resistance area product RA is a value obtained by multiplying the resistance by the element area and is ideally a constant value regardless of the element size.

In order to reduce the resistance area product RA of the magnetoresistance effect element, it is necessary to reduce the film thickness of the junction layer and the barrier layer in contact with the recording layer. However, when the film thickness of the barrier layer is simply reduced, since the (iii) magnetoresistance ratio (MR ratio) also decreases, there is a problem of inability of being compatible with one of the characteristics that are important for application of the magnetoresistance effect element.

In addition, compared with the magnetoresistance effect element having a so-called double interface, in the magnetoresistance effect element having a quadruple interface, the thermal stability index Δ can be increased by increasing the number of interfaces, but how to secure a higher effective magnetic anisotropy energy density $K_{eff}t^*$ even when the element is miniaturized still remains as an issue.

The present invention has been made in view of the above circumstances, and for implementation of a next generation magnetoresistance effect element having a smaller size, for a magnetoresistance effect element having a so-called quadruple interface, a configuration of a magnetoresistance effect element having a small resistance area product RA, a large magnetoresistance ratio (MR ratio), and a large effective magnetic anisotropy energy density $K_{eff}t^*$ has been found, whereby the present invention has thus been completed.

Solution to Problem

In order to solve the above problems, there is provided a magnetoresistance effect element of the present invention including a first reference layer (B1), a first junction layer (11) that is provided adjacent to the first reference layer (B1), a first divided recording layer (2) that is provided adjacent to an opposite side of the first junction layer (11) to the first reference layer (B1), a second junction layer (12) that is provided adjacent to an opposite side of the first divided recording layer (2) to the first junction layer (11), a second divided recording layer (3) that is provided adjacent to an opposite side of the second junction layer (12) to the first divided recording layer (2), and a third junction layer (13) that is provided adjacent to an opposite side of the second divided recording layer (3) to the second junction layer (12), wherein the first junction layer (11), the second junction layer (12) and the third junction layer (13) contain oxygen (O), and the first junction layer (11) is a tunnel barrier layer, wherein the first divided recording layer (2), the second junction layer (12) and the second divided recording layer (3) constitute a first recording layer (A1), wherein a magnetoresistance ratio (MR ratio) due to a magnetic tunnel junction of the first divided recording layer (2), the first junction layer (11) and the first reference layer (B1) is larger than a magnetoresistance ratio (MR ratio) when the second divided recording layer (3), the first junction layer (11) and the first reference layer (B1) are magnetically tunnel-junctioned, and wherein an effective magnetic anisotropy energy density ($K_{eff}t$) of the second divided recording layer (3) adjacently interposed between the second junction layer (12) and the third junction layer (13) is larger than an effective magnetic anisotropy energy density ($K_{eff}t$) of the first divided recording layer (2) when the first divided recording layer (2) is adjacently interposed between the second junction layer (12) and the third junction layer (13).

Desirably, the first divided recording layer (2) contains at least Co, the second divided recording layer (3) contains at least Fe, and a Co/Fe ratio of the first divided recording layer (2) is larger than a Co/Fe ratio of the second divided recording layer (3).

The second divided recording layer (3) may include a third magnetic layer (3a1) that is provided adjacent to the second junction layer (12), a second non-magnetic coupling layer (3b1) that is provided adjacent to an opposite side of the third magnetic layer (3a1) to the second junction layer (12), a magnetic coupling layer (3a2) that is provided adjacent to an opposite side of the second non-magnetic coupling layer (3b1) to the third magnetic layer (3a1), a third non-magnetic coupling layer (3b2) that is provided adjacent to an opposite side of the magnetic coupling layer (3a2) to the second non-magnetic coupling layer (3b1), and a fourth magnetic layer (3a3) that is provided adjacent to an opposite side of the third non-magnetic coupling layer (3b2) to the magnetic coupling layer (3a2) and provided adjacent to the third junction layer (13).

The first divided recording layer (2) may include a first magnetic layer (2a1) that is provided adjacent to the first junction layer (11), a first non-magnetic coupling layer (2b1) that is provided adjacent to an opposite side of the first magnetic layer (2a1) to the first junction layer (11), and a second magnetic layer (2a2) that is adjacent to an opposite side of the first non-magnetic coupling layer (2b1) to the first magnetic layer (2a1) and provided adjacent to the second junction layer (12).

In addition, a magnetic memory of the present invention includes the above magnetoresistance effect element.

In addition, a film formation method for a magnetoresistance effect element of the present invention includes a step of depositing a first junction layer (11) on a deposited first reference layer (B1); a step of performing treatment of heating a film in which the deposited first junction layer (11) is the uppermost part; a step of performing treatment of cooling the film that has been applied the treatment of heating; a step of depositing a first divided recording layer (2) on the first junction layer (11) of the film that has been applied the treatment of cooling; a step of depositing a second junction layer (12) on the deposited first divided recording layer (2); a step of depositing a second divided recording layer (3) on the deposited second junction layer (12); a step of depositing a third junction layer (13) on the deposited second divided recording layer (3); and a step of depositing a second reference layer (B2) or an upper electrode (E2) on the deposited third junction layer (13), wherein the second junction layer (12) is not applied treatment of heating and cooling before the step of depositing the second divided recording layer (3); and wherein the third junction layer (13) is not applied treatment of heating and cooling before the step of depositing the second reference layer (B2) or the upper electrode (E2).

Advantageous Effects of Invention

According to the present invention, for implementation of a magnetoresistance effect element having a so-called quadruple interface configuration in which a recording layer is in contact with three junction layers and four surfaces, it is possible to provide a magnetoresistance effect element in which both a high magnetoresistance ratio and a high effective magnetic anisotropy energy density $K_{eff}t^*$ are achieved while the resistance area product RA is reduced.

In addition, it is possible to provide a magnetoresistance effect element in which the recording layer is separately optimized so that a part (first divided recording layer) adjacent to the barrier layer has a high magnetoresistance ratio and a part (second divided recording layer) not adjacent to the barrier layer has a high effective magnetic anisotropy energy density $K_{eff}t^*$. In addition, a magnetoresistance effect element having a quadruple interface with a high degree of freedom of optimization can achieve both a high magnetoresistance ratio and a high effective magnetic anisotropy energy density $K_{eff}t^*$ while the resistance area product RA is reduced by the composition of the recording layer being controlled, for example, by setting the Co/Fe ratio of the first divided recording layer of the recording layer to be larger than the Co/Fe ratio of the second divided recording layer.

BRIEF DESCRIPTION OF DRAWINGS

FIG. 1B(b) is a diagram explaining the relationship between magnetoresistance ratios of a first divided recording layer and a second divided recording layer of the magnetoresistance effect element of the present invention.

FIG. 1C(b) is a diagram explaining the relationship between effective magnetic anisotropy energy densities $K_{eff}t^*$ of a second divided recording layer and a first divided recording layer of the magnetoresistance effect element of the present invention.

FIG. 42A shows an example of the magnetoresistance effect element of prior art.

FIG. 42B shows an example of the magnetoresistance effect element of prior art.

FIG. 42C shows a vertical cross-sectional view of an example of the magnetoresistance effect element of the present invention.

FIG. 42D shows a vertical cross-sectional view of an example of the magnetoresistance effect element of the present invention.

FIG. 42E shows a vertical cross-sectional view of an example of the magnetoresistance effect element of the present invention.

FIG. 45A shows configuration of an element for evaluating performance when CoFeB of a third magnetic layer and a fourth magnetic layer in the second divided recording layer is replaced with FeB.

FIG. 45B shows a correlation between a film thickness of FeB and an effective magnetic anisotropy energy density $K_{eff}t2$.

FIG. 46 shows an evaluation model of the relationship between the thermal stability index Δ and the magnetic coupling force.

DESCRIPTION OF EMBODIMENTS

Figure 1A:
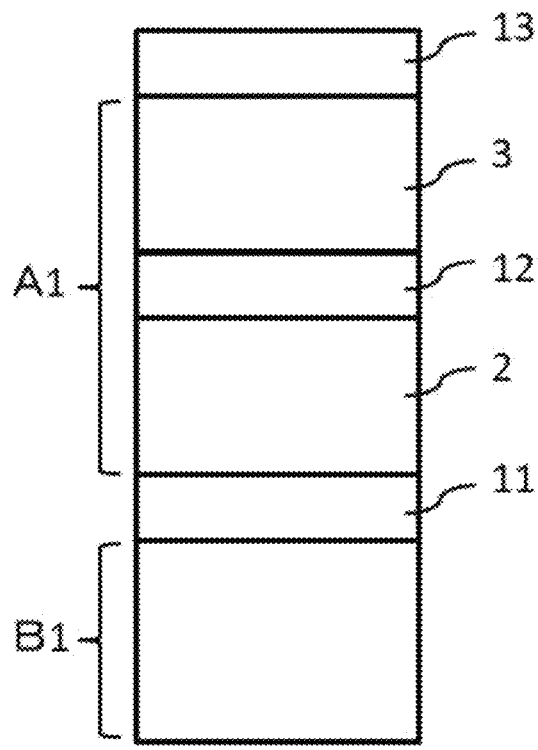
FIG. 1A is a vertical cross-sectional view of an example of a configuration of a magnetoresistance effect element of the present invention.

Hereinafter, a magnetoresistance effect element and a magnetic memory of the present invention will be described in detail with reference to the drawings.

Here, it should be noted that the drawings are only examples, and will be described with reference numerals, and do not limit the present invention.

Embodiment 1

-Configuration of Element-

FIG. 1A shows a basic configuration of Embodiment 1 of the present invention. The basic configuration of the magnetoresistance effect element includes a first reference layer B1/a first junction layer 11/a first divided recording layer 2/a second junction layer 12/a second divided recording layer 3/a third junction layer 13 adjacently disposed in this order. The first divided recording layer 2/the second junction layer 12/the second divided recording layer 3 constitute a first recording layer A1, and the first reference layer B1 and the first divided recording layer 2 are magnetically tunnel-junctioned by the first junction layer 11.

When the magnetoresistance effect element is connected to a magnetic memory cell, it has a lower electrode layer provided on the side opposite to the first junction layer 11 of the first reference layer B1 and an upper electrode layer provided on the side opposite to a third divided recording layer 3 of the third junction layer 13.

The first reference layer B1 is a ferromagnetic layer in which the magnetization direction is fixed. The magnetization direction is desirably a direction perpendicular to a film surface.

The first reference layer B1 includes a ferromagnetic component containing at least one of 3$d$ ferromagnetic transition metal elements, and more preferably contains at least one of Co, Fe, and Ni. Specifically, combinations of elements such as Co, Fe, Ni, CoFe, FeNi, CoNi, CoB, FeB, NiB, CoFeB, FePt, TbTeCo, MnAl, and MnGa may be exemplified. The first reference layer B1 may include an alloy further containing non-magnetic elements such as W, Ta, Hf, Zr, Nb, Mo, Ti, V, Cr, Si, Al, B, Pd, and Pt. Among the elements combined as described above, the content of some elements may be a very small amount, and additives and the like used for improving characteristics of the material may be further contained.

In addition, a thin non-magnetic coupling layer may be inserted between ferromagnetic components of the first reference layer B1. Examples of materials of the non-magnetic coupling layer include Ta, W, Hf, Zr, Nb, Mo, Ti, Mg, and MgO.

The first reference layer B1 may be a single layer, laminated or multi-layered, and may have a laminated or thin-layer ferri structure with Pt, Ru, Ir, Rh, W, Ni, or the like.

In addition, a fixing layer or the like may be adjacent to the opposite side of the first reference layer B1 to the first junction layer 11.

The film thickness of the first reference layer B1 depends on the material and the configuration of the layer and is about 1 nm to 13 nm.

The first junction layer 11 is a tunnel barrier layer in which a material containing oxygen (O) is used and which is dominated by the magnetoresistance of this magnetoresistance effect element. At least O and Mg are preferably contained so that the combination of materials of the first junction layer 11 interposed between the first reference layer B1 and the first divided recording layer 2 causes a large magnetoresistance change rate to be exhibited. In addition to MgO, oxygen-containing insulators such as $Al_2O_3$, $MgAl_2O_4$, $SiO_2$, TiO, and $Hf_2O$ may be used, and these insulators may contain a small amount of other elements. Among the elements combined as described above, the content of some elements may be a very small amount, and additives and the like used for improving characteristics of the material may be further contained.

In addition, for the first junction layer 11, it is more desirable to select an oxygen-containing material so that interfacial magnetic anisotropy is generated in the first divided recording layer 2 at an interface with the first divided recording layer 2, and MgO is more desirable in this respect.

The film thickness of the first junction layer 11 is preferably 0.5 nm or more and more preferably 0.8 nm or more in order to increase the magnetoresistance ratio. In addition, in order to reduce the resistance area product RA, the film thickness is preferably 1.2 nm or less, more preferably 1.1 nm or less, and still more preferably 1.0 nm or less. Therefore, the film thickness is adjusted within preferably in a range of 0.5 to 1.2 nm, and more preferably in a range of 0.8 to 1.1 nm.

The first divided recording layer 2 is a ferromagnetic layer in which the magnetization direction can be reversed. The magnetization direction is desirably a direction perpendicular to a film surface.

The first divided recording layer 2 is not particularly limited as long as it is formed of a material having a large magnetoresistance ratio due to the magnetic tunnel junction in the first junction layer 11 interposed between it and the first reference layer B1, and desirably contains at least a 3d ferromagnetic transition metal such as Co, Fe, or Ni and more desirably contains at least Co. Specific examples include Co, Fe, Ni, CoFe, FeNi, CoNi, CoB, FeB, NiB, CoFeB, FePt, TbTeCo, MnAl, MnGa, and the like, and among these, Co, CoFe, CoNi, CoB, and CoFeB are more desirable.

In addition, for the first divided recording layer 2, a material having interfacial magnetic anisotropy in a direction perpendicular to a film surface at an interface with the first junction layer 11 and at an interface with the second junction layer 12 are more desirable, and CoFe and CoFeB are still more desirable.

In addition, the first divided recording layer 2 may further contain a non-magnetic element such as W, Ta, Hf, Zr, Nb, Mo, Ti, V, Cr, Si, Al, B, Pd, Pt or the like. Among these, B and V are preferable in consideration of ease of handling.

In addition, in the first divided recording layer 2, one or more thin non-magnetic coupling layers may be inserted between ferromagnetic components, and the film thickness of the non-magnetic coupling layer is preferably 0.3 nm or less. Examples of materials of the non-magnetic coupling layer include Ta, W, Hf, Zr, Nb, Mo, Ti, and Mg, and Mo and W are more preferable.

The Co/Fe ratio of the entire first divided recording layer 2 is desirably larger than the Co/Fe ratio of the entire second divided recording layer 3. Here, the composition of the second divided recording layer 3 will be described below. Details of the Co/Fe ratio will be described below with reference to FIG. 19, but this is because the entire element allows both a high effective magnetic anisotropy energy density $K_{eff}t^*$ and a high magnetoresistance ratio to be achieved.

The Co/Fe ratio of the entire first divided recording layer 2 is preferably 0.05 or more, more preferably 0.09 or more, and still more preferably 0.18 or more and 0.33 or less. On the other hand, in order to obtain interface perpendicular magnetic anisotropy with MgO, the first divided recording layer 2 has a composition range in which the crystal structure becomes bcc in a thermal equilibrium state, and preferably, the crystal structure at an interface with the entire first divided recording layer 2 or the first junction layer 11 is desirably bcc. This is to match with the crystallinity of the first junction layer 11 such as MgO. In the Co—Fe alloy, if the Co composition exceeds 75 at. %, the crystal structure becomes fcc or hcp, which is not a preferable bcc structure. Therefore, the upper limit of the Co composition is desirably 75 at. %. Since the Fe composition in this case is 25 at. %, the Co/Fe ratio is preferably 3(=75/25) or less. Details of the Co/Fe ratio will be described below with reference to FIG. 20 and FIG. 21.

The B concentration of the entire first divided recording layer 2 is desirably lower than the B concentration of the entire second divided recording layer 3. Specifically, the B concentration of the entire first divided recording layer 2 is desirably 20 at. % or more and 35 at. % or less, more desirably 20 at. % or more and 30 at. % or less, and still more desirably 21.9 at. % or more and 30 at. % or less. Details of the B concentration will be described below with reference to FIG. 22 and FIG. 23.

The total film thickness of the magnetic layer part of the first divided recording layer 2 is preferably in a range of 1.6 nm to 3.2 nm and more preferably in a range of 2.0 nm to 2.6 nm. This is because, even if the film thickness is thinner or even if the film thickness is thicker, when MgO or the like is used for the first junction layer 11 and the second junction layer 12, perpendicular magnetic anisotropy is weakened.

For the second junction layer 12, a material containing oxygen (O) is used, and at least Mg and O are preferably contained. In addition to MgO, oxygen-containing insulators such as $Al_2O_3$, $MgAl_2O_4$, $SiO_2$, TiO, $Hf_2O$, Ta—O, and W—O may be used, and these insulators may contain a small amount of other elements. Among the elements combined as described above, the content of some elements may be a very small amount, and additives and the like used for improving characteristics of the material may be further contained.

The second junction layer 12 has a function of magnetically coupling the first divided recording layer 2 and the second divided recording layer 3 and imparting perpendicular magnetic anisotropy.

Here, "two magnetic layers are magnetically coupled" means that a magnetic coupling force $J_{ex}$ per unit area acts between magnetic layers, that is, the magnetic coupling force $J_{ex}$ is larger than zero. The magnetic coupling force $J_{ex}$ is represented by a formula in Math. 2 with a shift amount (shift magnetic field $H_{ex}$) of a magnetic field of a magnetization curve, a saturation magnetization $M_s$, and an area S of a film.

$$J_{ex}=M_s*H_{ex}/S \quad [\text{Math. 2}]$$

In order to reduce the resistance area product RA, the film thickness of the second junction layer 12 is preferably 1.2 nm or less, more preferably 1.1 nm or less, and still more preferably 1.0 nm or less. Details will be described below with reference to FIG. 18 and FIG. 25. On the other hand, in order to set the magnetic coupling force $J_{ex}$ to be larger than zero, the film thickness of the second junction layer 12 is preferably 1.0 nm or less, more preferably 0.9 nm or less, and still more preferably 0.8 nm or less. Details will be described below with reference to FIG. 24B and FIG. 25.

Therefore, the film thickness is preferably 1.0 nm or less, more preferably 0.9 nm or less, and still more preferably 0.8 nm or less, which achieves both a low resistance area product RA and a magnetic coupling force $J_{ex}$ larger than zero.

The second divided recording layer 3 is a ferromagnetic layer in which the magnetization direction can be reversed, and can be integrally magnetically reversed together with the first divided recording layer 2. The magnetization direction is desirably a direction perpendicular to a film surface.

The second divided recording layer 3 desirably contains at least a 3d ferromagnetic transition metal such as Co, Fe, or Ni, and more desirably contains at least Fe. Specific examples include Co, Fe, Ni, CoFe, FeNi, CoNi, CoB, FeB, NiB, CoFeB, FePt, TbTeCo, MnAl, MnGa, and the like, and among these, Fe, CoFe, FeB, CoFeB, and FePt are more desirable.

In addition, for the second divided recording layer 3, a material having interfacial magnetic anisotropy in a direction perpendicular to a film surface at an interface with the second junction layer 12 and at an interface with the third junction layer 13 is more desirable, and Fe, CoFe, FeB, and CoFeB are more desirable.

In addition to the above, the second divided recording layer 3 may further contain a non-magnetic element such as W, Ta, Hf, Zr, Nb, Mo, Ti, V, Cr, Si, Al, B, Pd, Pt or the like. Among these, B and V are preferable in consideration of ease of handling.

In addition, in the second divided recording layer 3, one or more thin non-magnetic coupling layers of about 0.3 nm or less may be inserted between ferromagnetic components. Examples of materials of the non-magnetic coupling layer include Ta, W, Hf, Zr, Nb, Mo, Ti, and Mg, and Mo and W are more preferable.

The Co/Fe ratio of the entire second divided recording layer 3 is desirably lower than the Co/Fe ratio of the entire first divided recording layer 2. Details will be described below with reference to FIG. 19, but this is because the entire element allows both a high effective magnetic anisotropy energy density $K_{eff}t*$ and a high magnetoresistance ratio to be achieved.

The Co/Fe ratio of the entire second divided recording layer 3 is preferably 0.11 or less and more preferably 0.07 or less. Details will be described below with reference to FIG. 26 and FIG. 27, but this is because the effective magnetic anisotropy energy density $K_{eff}t*$ of the entire element can be increased by increasing the effective magnetic anisotropy energy density $K_{eff}t2$.

The B concentration of the entire second divided recording layer 3 is desirably larger than the B concentration of the entire first divided recording layer 2. Details of the B concentration will be described below with reference to FIG. 22 and FIG. 23.

The total film thickness of the magnetic layer part of the second divided recording layer 3 is preferably in a range of 1.6 nm to 3.0 nm and more preferably in a range of 2.0 nm to 2.6 nm. This is because, even if the film thickness is thinner or even if the film thickness is thicker, when MgO or the like is used for the second junction layer 12 and the third junction layer 13, sufficient perpendicular magnetic anisotropy cannot be obtained for the second divided recording layer 3.

For the third junction layer 13, a material containing oxygen (O) is used, and at least Mg and O are preferably contained. In addition to MgO, oxygen-containing insulators such as $Al_2O_3$, $MgAl_2O_4$, $SiO_2$, TiO, $Hf_2O$, Ta—O, and W—O may be used, and these insulators may contain a small amount of other elements. Among the elements combined as described above, the content of some elements may be a very small amount, and additives and the like used for improving characteristics of the material may on further contained.

In order to reduce the resistance area product KA, the film thickness of the third junction layer 13 is preferably 1.2 nm or less, more preferably 1.1 nm or less, and still more preferably 1.0 nm or less.

The magnetoresistance ratio of the magnetoresistance effect element controlled in the above composition is about 60% or more, and the resistance area product RA is in a range of about 7 $\Omega\mu m^2$ or less. Here, when film formation conditions of the first junction layer 11, the second junction layer 12, and the third junction layer 13 are changed, it is possible to achieve a higher magnetoresistance ratio with a low resistance area product RA in the same film thickness range.

The magnetoresistance effect element composed of the layers described above has a characteristic that "the magnetoresistance ratio MRa according to the magnetic tunnel junction of the first divided recording layer 2, the first function layer 11 and the first reference layer B1 is larger than the magnetoresistance ratio MRb when the second divided recording layer 3, the first junction layer and the first reference layer B1 are magnetically tunnel-junctioned".

Figure 1B:
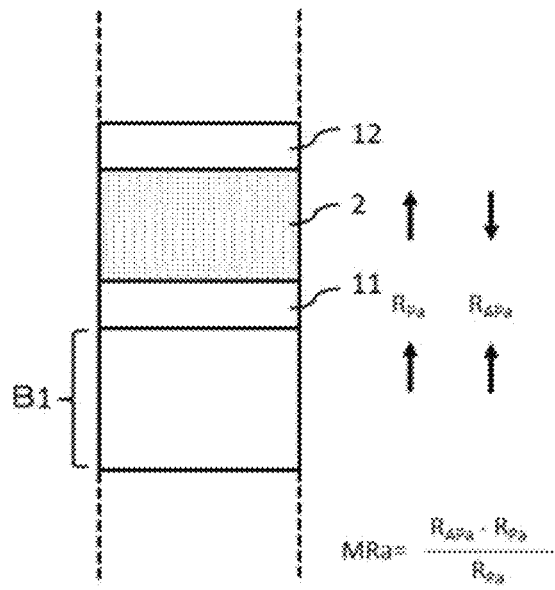
FIG. 1B(a) is a diagram explaining the relationship between magnetoresistance ratios of a first divided recording layer and a second divided recording layer of the magnetoresistance effect element of the present invention.
Figure 1B:
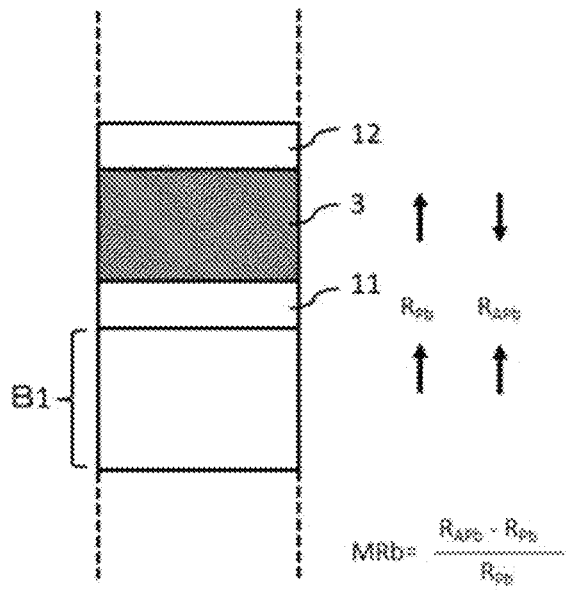

Here, "the magnetic tunnel junction of the first divided recording layer 2, the first junction layer 11 and the first reference layer B1" is a configuration of the present invention (refer to FIG. 1B(a)), and "a case in which the second divided recording layer 3, the First junction layer 11 and the first reference layer B1 are magnetically tunnel junctioned" is a configuration in which the first divided recording layer 2 of the magnetoresistance effect element according to the present invention is replaced with the second divided recording layer 3, and configurations of the other layers are the same (refer to FIG. 1B(b)).

As shown in FIG. 1B(a), MRa indicates a magnetoresistance ratio in the first junction layer 11 of the configuration of the magnetoresistance effect element of the present invention. $R_{Pa}$ indicates a resistance when magnetization directions of the first reference layer B1 and the first divided recording layer 2 are parallel, $R_{APa}$ indicates a resistance when magnetization directions of the first reference layer B1 and the first divided recording layer 2 are antiparallel, and MRa=$(R_{APa}-R_{Pa})/R_{Pa}$ is expressed.

On the other hand, as shown in FIG. 1B(b), MRb indicates a magnetoresistance ratio in the first junction layer 11 when the first divided recording layer 2 in FIG. 1B(a) is replaced with the second divided recording layer 3. $R_{Pb}$ indicates a resistance when magnetization directions of the first reference layer B1 and the second divided recording layer 3 are parallel, $R_{APb}$ indicates a resistance when magnetization directions of the first reference layer B1 and the second divided recording layer 3 are antiparallel, and MRb=$(R_{APb}-R_{Pb})/R_{Pb}$ is expressed.

Here, the magnitude of the magnetoresistance ratio MRa and the magnetoresistance ratio MRb is influenced by the composition and the film thickness of the first divided recording layer 2 and the second divided recording layer 3, and the magnetoresistance effect element of the present invention has a characteristic of MRa>MRb. Details of the magnetoresistance ratio will be described below with reference to FIG. 16, FIG. 19, Math. 3, and the like.

In addition, the magnetoresistance effect element composed of the layers described above has a characteristic that "the effective magnetic anisotropy energy density ($K_{eff}t_a$) of the second divided recording layer 3 adjacently interposed between the second junction layer 12 and the third junction layer 13 is larger than the effective magnetic anisotropy energy density ($K_{eff}t_b$) of the first divided recording layer 2 when the first divided recording layer 2 is adjacently interposed between the second junction layer 12 and the third junction layer 13".

Figure 1C:
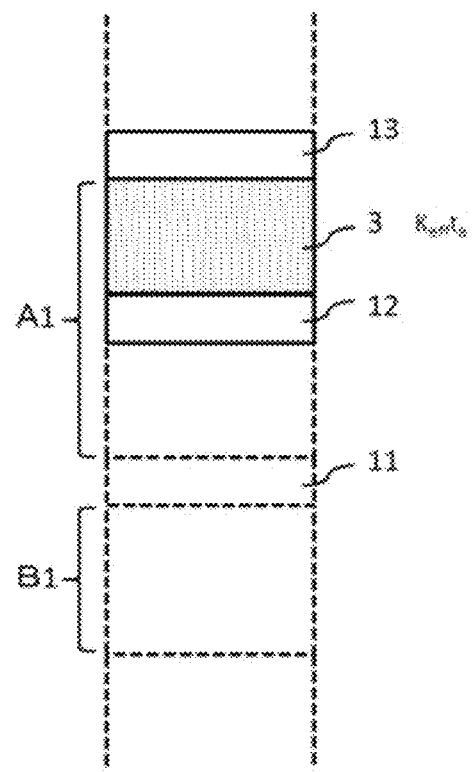
FIG. 1C(a) is a diagram explaining the relationship between effective magnetic anisotropy energy densities $K_{eff}t^*$ of a second divided recording layer and a first divided recording layer of the magnetoresistance effect element of the present invention.
Figure 1C:
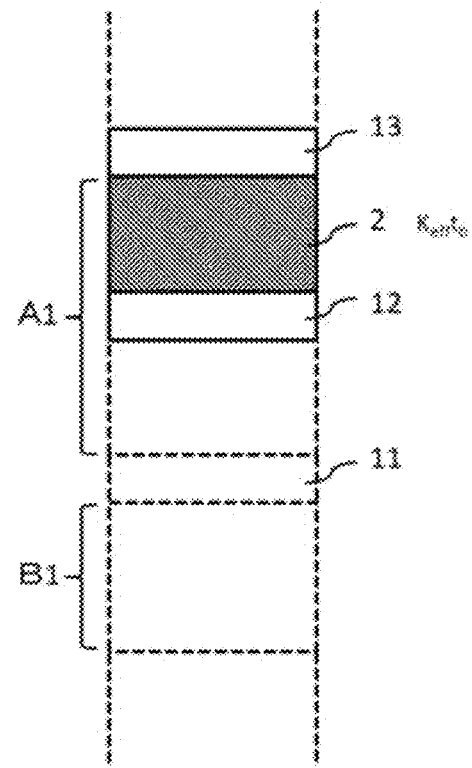

Here, "the second divided layer 3 adjacently interposed between the second junction layer 12 and the third junction layer 13" is a configuration of the present invention (refer to FIG. 1C(a)), and "a case in which the first divided recording layer 2 is adjacently interposed between the second junction layer 12 and the third junction layer 13" is a configuration in which the second divided recording layer 3 of the magnetoresistance effect element according to the present invention is replaced with the first divided recording layer 2, and configurations of the other layers are the same (refer to FIG. 1C(b)).

As shown in FIG. 1C(a), $K_{eff}t_a$ indicates an effective magnetic anisotropy energy density in the second divided recording layer 3 of the configuration of the magnetoresistance effect element of the present invention.

On the other hand, as shown in FIG. 1C(b), $K_{eff}t_b$ indicates an effective magnetic anisotropy energy density in the first divided recording layer 2 when the second divided recording layer 3 in FIG. 1C(a) is replaced with the first divided recording layer 2.

Here, as expressed by the formula in Math. 1, the magnitude of the effective magnetic anisotropy energy density $K_{eff}t_a$ and the effective magnetic anisotropy energy density $K_{eff}t_b$ is influenced by the interfacial magnetic anisotropy energy density $K_i$ between the second junction layer 12 and the third junction layer 13, the saturation magnetization $M_s$ of the second divided recording layer 3 and the first divided recording layer 2, or the like. That is, the magnetoresistance effect element of the present invention has a characteristic of $K_{eff}t_a > K_{eff}t_b$ according to the composition, the film thickness and the like of the second divided recording layer 3 and the first divided recording layer 2. Details of the effective magnetic anisotropy energy density $K_{eff}t$ will be described below with reference to FIG. 17, FIG. 19, Math. 4, and the like.

Hereinafter, examination details regarding the configuration of Embodiment 1 will be described.

-Magnetoresistance Ratio (MR Ratio)-

Regarding increasing the magnetoresistance ratio of the magnetoresistance effect element having a so-called quadruple interface, an examination is performed by decomposing MR, which is the magnetoresistance ratio of the entire magnetoresistance effect element, into a magnetoresistance ratio MR1 in the first junction layer 11 and a magnetoresistance ratio MR2 in the second junction layer 12.

Figure 16:
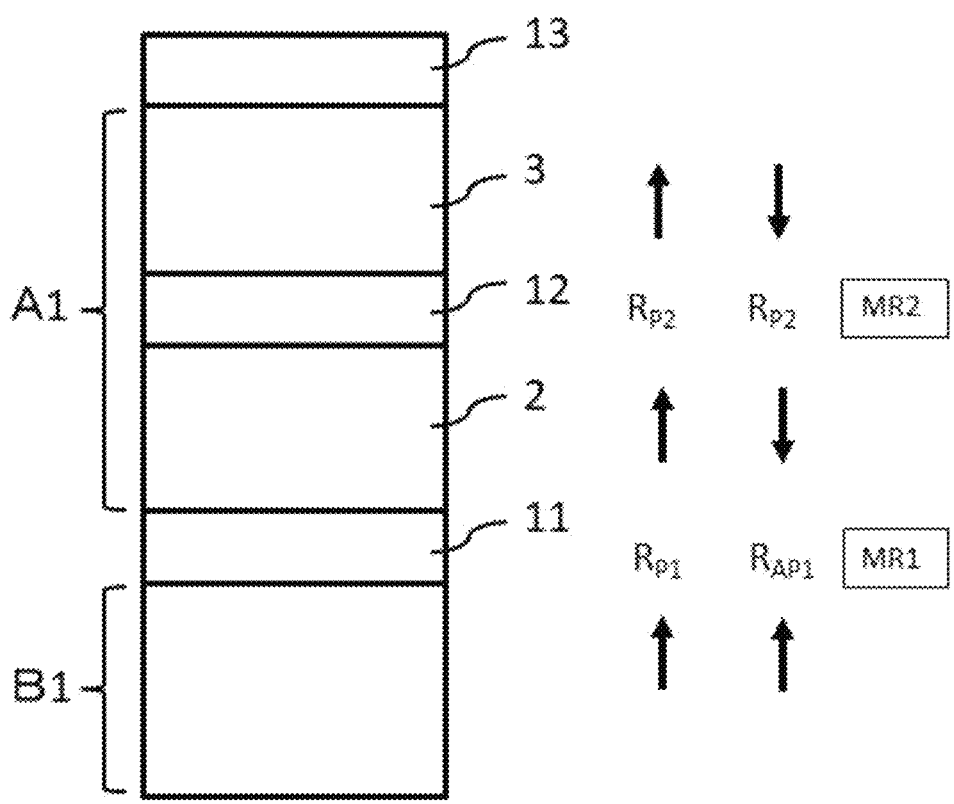
FIG. 16 is a diagram explaining a magnetoresistance ratio in a configuration of an example of the magnetoresistance effect element of the present invention.

The magnetoresistance ratio in the configuration of the magnetoresistance effect element of the present invention will be described with reference to FIG. 16. MR1 indicates a magnetoresistance ratio in the first junction layer 11, and MR2 indicates a magnetoresistance ratio in the second junction layer 12. In the first junction layer 11, $R_{P1}$ indicates a resistance when magnetization directions of the first reference layer B1 and the first divided recording layer 2 are parallel, and $R_{AP1}$ indicates a resistance when magnetization directions of the first reference layer B1 and the first divided recording layer 2 are antiparallel. In addition, in the second junction layer 12, $R_{P2}$ indicates a resistance when magnetization directions of the first divided recording layer 2 and the second divided recording layer 3 are parallel.

The magnetoresistance ratio MR of the entire element is represented by the following formula in Math. 3.

$$\begin{aligned} MR &= \frac{(R_{AP1}+R_{P2})-(R_{P1}+R_{P2})}{R_{P1}+R_{P2}} \quad \text{[Math. 3]} \\ &= \frac{R_{Ap1}-R_{P1}}{R_{P1}+R_{P2}} \\ &= MR1 \times \frac{R_{P1}}{R_{P1}+R_{P2}} \left( \therefore MR1 = \frac{R_{AP1}-R_{P1}}{R_{P1}}, MR1 \times R_{P1} = R_{AP1}-R_{P1} \right) \\ &= MR1 \times \frac{R_{P1}A}{R_{P1}A+R_{P2}A} \\ &= MR1 \times \frac{R_{P1}A}{RA} (\therefore RA = R_{P1}A+R_{P2}A) \end{aligned}$$

Here, A indicates an element size (area), and each RA indicates a resistance area product in each layer.

As derived in the formula in Math. 3, MR, which is the magnetoresistance ratio of the entire element, does not include the term of MR2, which is the magnetoresistance ratio in the second junction layer 12. That is, the second junction layer 12 does not contribute to MR of the entire element. The reason for this is expressed by MR2=($R_{AP2}$−$R_{P2}$)/$R_{P2}$, it is assumed that but magnetization directions of the first divided recording layer 2 and the second divided recording layer 3 are always parallel, and thus the term of $R_{AP2}$ does not appear in the resistance.

One of the important points to realize such assumption is that magnetizations of the first divided recording layer 2 and the second divided recording layer 3 are ferromagnetically (magnetically) coupled. Details will be described below with reference to FIG. 24B and FIG. 25.

It can be clearly understood in the formula in Math. 3 that the magnetoresistance ratio MR of the entire element depends on the magnetoresistance ratio MR1 in the first junction layer 11 but does not depend on the magnetoresistance ratio MR2 in the second junction layer 12. In addition, it is understood in the formula in Math. 3 that, in order to increase the magnetoresistance ratio MR of the entire element, the magnetoresistance ratio MR1 may be maximized and the resistance area product $R_{P2}A$ in the second junction layer 12 may be made as small as possible.

That is, it is inferred that the magnetoresistance ratio MR of the entire element can be increased when the material of the first divided recording layer 2 is examined so that the magnetoresistance ratio MR1 is maximized and when the film thickness of the second junction layer 12 is reduced so that the resistance area product $R_{P2}A$ of the second junction layer 12 is made as small as possible.

-Effective Magnetic Anisotropy Energy Density $K_{eff}t^*$-

In order to increase the effective magnetic anisotropy energy density $K_{eff}t^*$ of the magnetoresistance effect element having a so-called quadruple interface, an examination is performed by decomposing the effective magnetic anisotropy energy density $K_{eff}t^*$ of the entire magnetoresistance effect element into an effective magnetic anisotropy energy density $K_{eff}t1$ in the first divided recording layer 2 and an effective magnetic anisotropy energy density $K_{eff}t2$ in the second divided recording layer 3.

Figure 17:
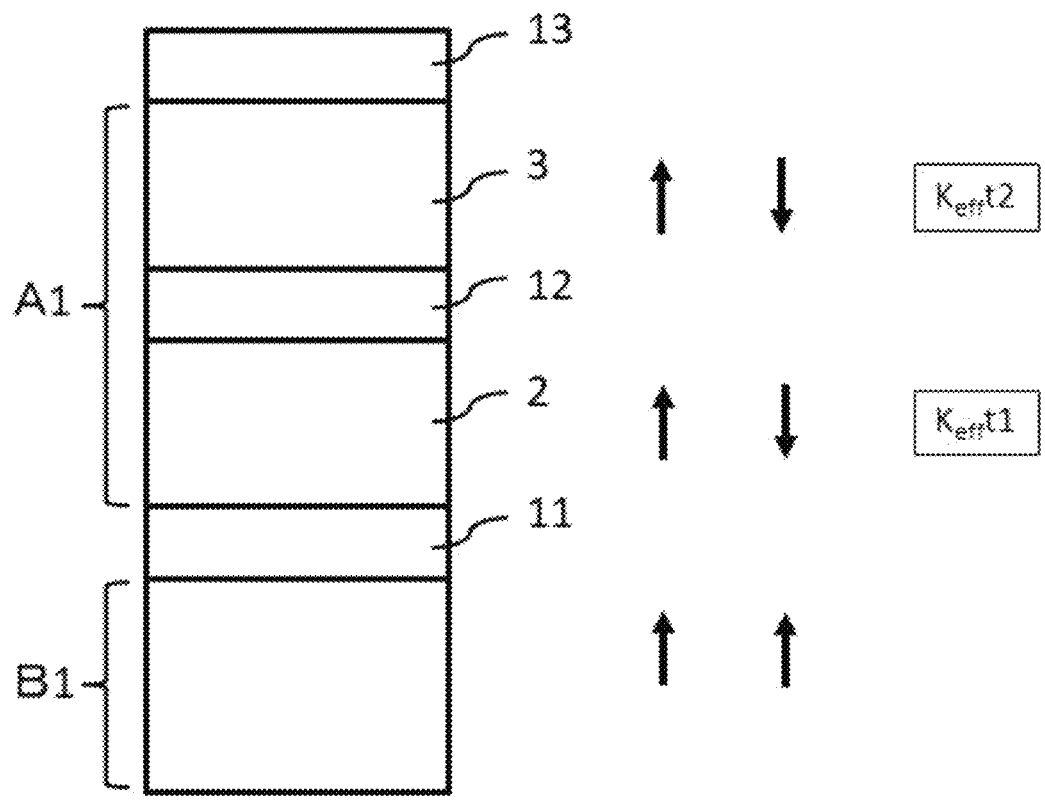
FIG. 17 is a diagram explaining an effective magnetic anisotropy energy density $K_{eff}t$ in a configuration of an example of the magnetoresistance effect element of the present invention.

The effective magnetic anisotropy energy density $K_{eff}t^*$ in the configuration of the magnetoresistance effect element of the present invention will be described with reference to FIG. 17. $K_{eff}t1$ indicates an effective magnetic anisotropy energy density in the first divided recording layer 2, and $K_{eff}t2$ indicates an effective magnetic anisotropy energy density in the second divided recording layer 3.

The effective magnetic anisotropy energy density $K_{eff}t^*$ of the entire element is represented by the following formula in Math. 4.

$$K_{eff}t^* = K_{eff}t1 + K_{eff}t2 \quad [\text{Math. 4}]$$

It can be clearly understood in the formulae in Math. 4 and Math. 1 that, in order to increase the effective magnetic anisotropy energy density $K_{eff}t^*$ of the entire element, the effective magnetic anisotropy energy density $K_{eff}t1$ and/or the effective magnetic anisotropy energy density $K_{eff}t2$ should be increased by increasing the interfacial magnetic anisotropy energy density $K_i$ between the first divided recording layer 2 and/or the second divided recording layer 3.

Here, in one layer, both increasing a magnetoresistance ratio and increasing the effective magnetic anisotropy energy density $K_{eff}t$ are not always achieved together. However, in the case of the magnetoresistance effect element of the present invention, when the effective magnetic anisotropy energy density $K_{eff}t2$ is increased by increasing the interfacial magnetic anisotropy energy density $K_i$ of the second divided recording layer 3 that does not influence the magnetoresistance ratio MR of the entire element, rather than the first divided recording layer 2 in which it is desirable to examine a material so that the magnetoresistance ratio MR1 is maximized, it is possible to achieve both a high magnetoresistance ratio MR and a high effective magnetic anisotropy energy density $K_{eff}t^*$ as the entire element.

That is, in the magnetoresistance effect element including the quadruple interface of the present invention, since the magnetic layer in the recording layer is divided into at least two parts, optimization of each parameter may be examined separately for the separated magnetic layer and the like, and thus it is possible to examine optimization of the element with a high degree of freedom.

-Dependence of Resistance Area Product RA on Film Thickness of Junction Layer-

It is known that a magnetoresistance effect element having a so-called quadruple interface has a resistance area product RA that increases as the number of interfaces increases. Therefore, the dependence of the resistance area product RA on the film thickness of the junction layer is evaluated.

The resistance area product RA is measured using an evaluation system in which MgO (1.0 nm) as the first junction layer 11, MgO (0.8 nm) as the third junction layer 13, and MgO (1.0 nm to 1.3 nm) as the second junction layer 12 are disposed.

Figure 18:
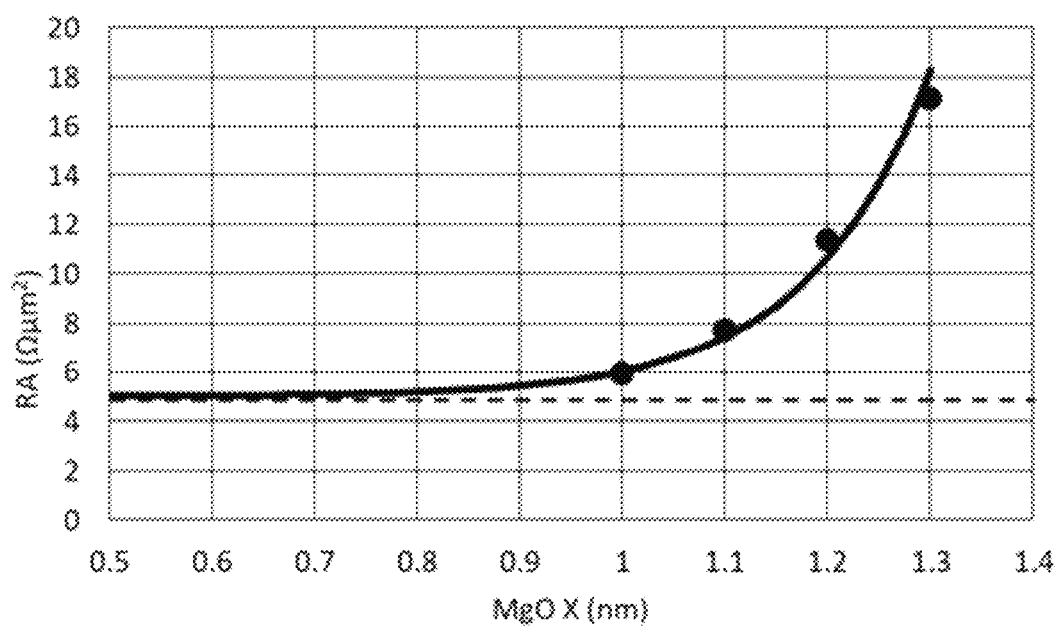
FIG. 18 is a graph showing the relationship between the film thickness of a second junction layer and a resistance area product RA.

Table 1 and FIG. 18 show the relationship between the film thickness of the second junction layer 12 and the obtained resistance area product RA.

TABLE 1

| Sample No. | First junction layer MgO1(nm) | Second junction layer MgO2 X (nm) | Third junction layer MgCO(nm) | RA($\Omega\mu m^2$) |
|---|---|---|---|---|
| 1-1 | 1.0 | 1.0 | 0.8 | 5.9 |
| 1-2 | 1.0 | 1.1 | 0.8 | 7.7 |
| 1-3 | 1.0 | 1.2 | 0.8 | 11.3 |
| 1-4 | 1.0 | 1.3 | 0.8 | 17.2 |

It is found in Table 1 and FIG. 18 that the resistance area product RA increases exponentially with respect to the film thickness of the second junction layer 12.

That is, it is found that, in order to obtain a small resistance area product RA, the film thickness of the second junction layer 12 is preferably 1.2 nm or less, more preferably 1.1 nm or less, and still more preferably 1.0 nm or less. Here, setting the film thickness of the second junction layer 12 to be small as 1.2 nm or less not only contributes to a low resistance area product RA but also contributes to obtaining a high magnetoresistance ratio as described above.

Here, the evaluation result of the dependence of this resistance area product RA on the film thickness of the junction layer can be described as follows because the resistance area product RA is a sum of resistances of three junction layers.

Since the third junction layer 13 is as thin as 0.8 nm, it is negligible, and since the first junction layer 11 is relatively thick at 1.0 nm, it contributes to the resistance area product RA at about 5 $\Omega\mu m^2$. On the other hand, the resistance area product RA depends on the film thickness of the second junction layer 12, but since MgO, which is the material of the second junction layer 12, is an insulator, the resistance area product RA exponentially increases.

Therefore, as shown in FIG. 18, when the film thickness of the second junction layer 12 is thin, the resistance area product RA asymptotically changes with respect to RA=5 Ωμm².

-Materials of First Divided Recording Layer 2 and Second Divided Recording Layer 3, and Magnetoresistance Ratio and Effective Magnetic Anisotropy Energy Density $K_{eff}t^*$-

In the analysis of the magnetoresistance ratio and the effective magnetic anisotropy energy density $K_{eff}t^*$, it is found that a material that can achieve a high magnetoresistance ratio may be examined for the first divided recording layer 2 and a material that can achieve a high effective magnetic anisotropy energy density $K_{eff}t^*$ may be examined for the second divided recording layer 3.

Therefore, it is verified what kind of element-containing material influences parameters of the magnetoresistance ratio and the effective magnetic anisotropy energy density $K_{eff}t^*$.

In the evaluation, in the element configuration in FIG. 1, materials shown in Table 2 are provided on the first divided recording layer 2 and the second divided recording layer 3, and the magnetoresistance ratio and the effective magnetic anisotropy energy density $K_{eff}t^*$ are measured.

Figure 19:
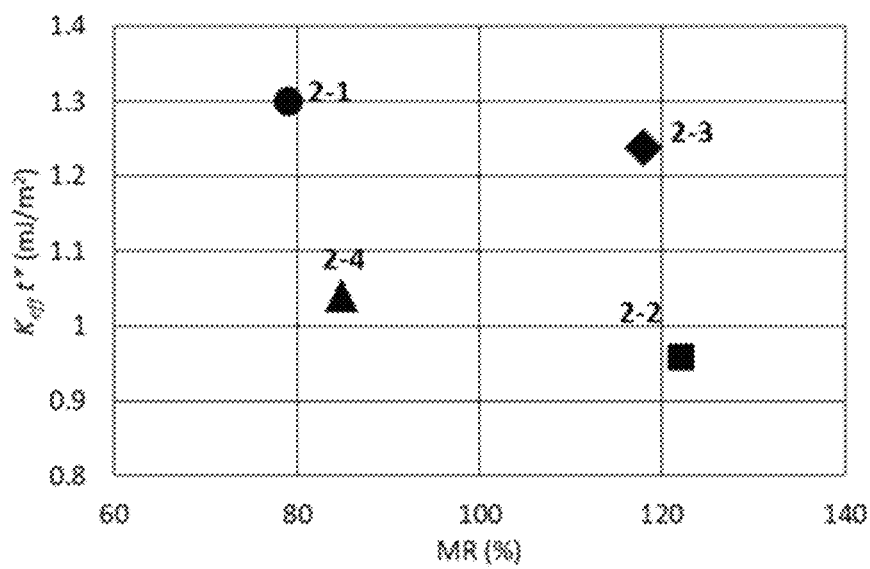
FIG. 19 is a graph showing the relationship between a magnetoresistance ratio and an effective magnetic anisotropy energy density $K_{eff}t^*$ when compositions of a first divided recording layer and a second divided recording layer are changed.

Table 2 and FIG. 19 show the relationship between the obtained magnetoresistance ratio and the effective magnetic anisotropy energy density $K_{eff}t^*$.

TABLE 2

| Sample No. | First divided recording layer | Second divided recording layer | MR (%) | $K_{eff}t^*$ (mJ/m²) |
|---|---|---|---|---|
| 2-1 | FeB | FeB | 79 | 1.30 |
| 2-2 | CoFeB | CoFeB | 122 | 0.96 |
| 2-3 | CoFeB | FeB | 118 | 1.24 |
| 2-4 | FeB | CoFeB | 85 | 1.04 |

It is found in Table 2 and FIG. 19 that, even in the part of the ferromagnetic layer in the same first recording layer A1, the magnetoresistance ratio is 1.5 times or more, and the effective magnetic anisotropy energy density $K_{eff}t^*$ is 1.35 times or more, which are significantly different, by making the materials of the magnetic layers the same or replacing them.

In addition, it is found that the sample No. 2-3 in which the first divided recording layer 2 is formed of CoFeB and the second divided recording layer 3 is formed of FeB has a high magnetoresistance ratio and a high effective magnetic anisotropy energy density $K_{eff}t^*$. On the other hand, it is found that the sample No. 2-4 in which the first divided recording layer 2 is formed of FeB and the second divided recording layer 3 is formed of CoFeB has a low magnetoresistance ratio and a low effective magnetic anisotropy energy density $K_{eff}t^*$.

As examined for the magnetoresistance ratio, the magnetoresistance ratio MR of the entire element depends on only the magnetoresistance ratio MR1 in the first junction layer 11, that is, the material of the first divided recording layer 2. Combining this finding with the results of Table 2 and FIG. 19, it is thought that, when CoFeB is used for the first divided recording layer 2 in order to impart a high magnetoresistance ratio and FeB is used for the second divided recording layer 3 in order to impart a high effective magnetic anisotropy energy density $K_{eff}t^*$, it is possible to provide a magnetoresistance effect element having both characteristics. In other words, it is thought that controlling may be performed by focusing on the configuration in which the Co content of the first divided recording layer 2 is higher than that of the second divided recording layer 3, that is, the Co/Fe ratio of each magnetic layer.

-Magnetoresistance Ratio with Respect to Co/Fe Ratio of First Divided Recording Layer 2-

As examined for the magnetoresistance ratio, in order to improve the magnetoresistance ratio of the entire element, the first divided recording layer 2 is desirably formed of a material having a high magnetoresistance ratio. In addition, in the examination in Table 2 and FIG. 19, it is found that, when the Co/Fe ratio of the first divided recording layer 2 increases, the magnetoresistance ratio also increases. Here, the magnetoresistance ratio with respect to the Co/Fe ratio of the first divided recording layer 2 is evaluated.

Figure 20:
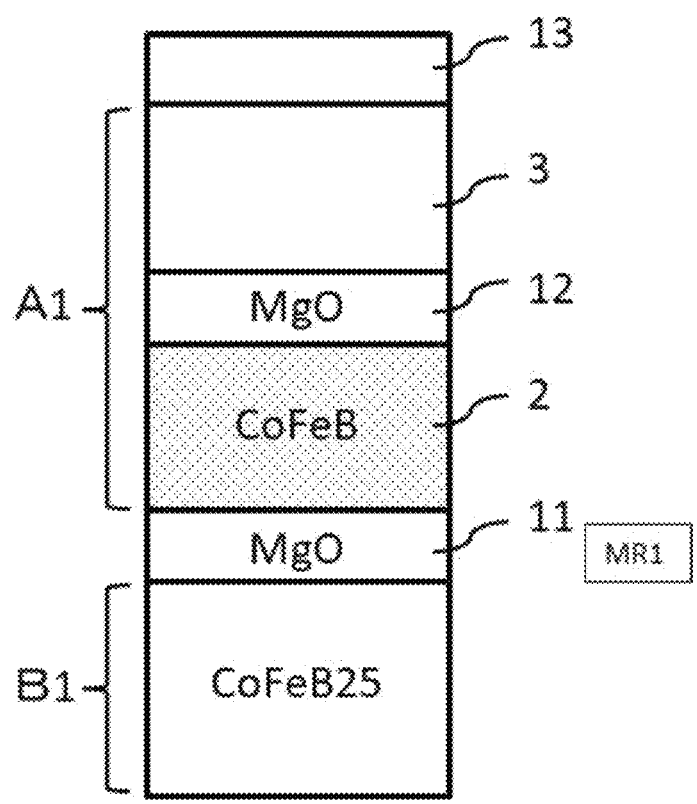
FIG. 20 shows a configuration of a magnetoresistance effect film used for evaluating the relationship between a Co/Fe ratio and a magnetoresistance ratio of the first divided recording layer.

The configuration of the evaluation element is shown in FIG. 20. The Co/Fe ratio of the first divided recording layer 2 is adjusted by laminating one or more different layers. With respect to the total film thickness t of the magnetic layers disposed in the first divided recording layer 2, the content of Fe, Co, or B in the layers is multiplied by the film thickness, and summed up to obtain the content of Fe, Co, or B in the entire first divided recording layer 2.

Figure 21:
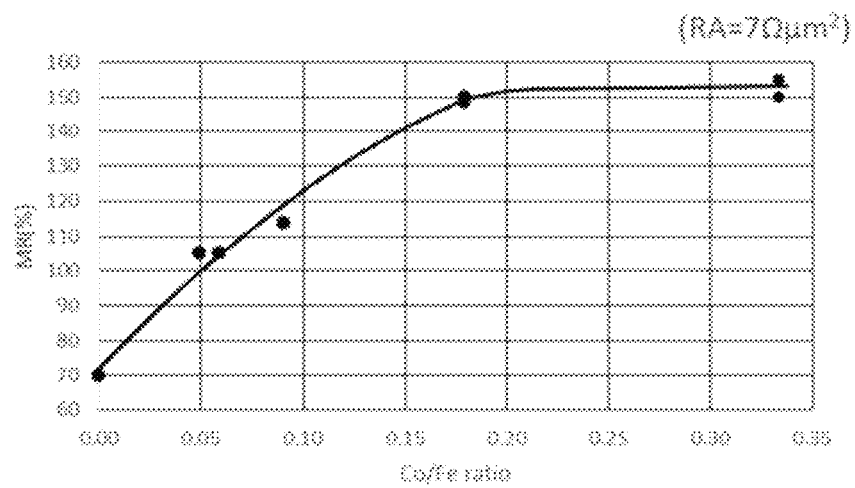
FIG. 21 is a graph showing the relationship between a Co/Fe ratio and a magnetoresistance ratio of the first divided recording layer.

Table 3 and FIG. 21 show the relationship between the Co/Fe ratio of the first divided recording layer 2 and the magnetoresistance ratio.

TABLE 3

| Sample No. | Fe | Co | B | t (nm) | Co/Fe | MR (%) (RA = 7 Ωμm²) |
|---|---|---|---|---|---|---|
| 3-1 | 1.88 | 0.00 | 0.63 | 2.5 | 0.0000 | 70 |
| 3-2 | 1.91 | 0.11 | 0.68 | 2.7 | 0.0588 | 105 |
| 3-3 | 1.96 | 0.10 | 0.65 | 2.7 | 0.0490 | 105 |
| 3-4 | 1.77 | 0.16 | 0.58 | 2.5 | 0.0907 | 114 |
| 3-5 | 1.46 | 0.26 | 0.58 | 2.3 | 0.1795 | 148 |
| 3-6 | 1.56 | 0.28 | 0.46 | 2.3 | 0.1795 | 150 |
| 3-7 | 1.35 | 0.45 | 0.60 | 2.4 | 0.3333 | 150 |
| 3-8 | 1.44 | 0.48 | 0.48 | 2.4 | 0.3333 | 155 |

It is found in Table 3 and FIG. 21 that, when the first divided recording layer 2 does not contain Co in this evaluation system, the magnetoresistance ratio is 70%, but when the Co/Fe ratio is 0.05 or more, the magnetoresistance ratio exceeds 100%, and then a high magnetoresistance ratio is maintained up to about 0.33.

On the other hand, in order to obtain interface perpendicular magnetic anisotropy with MgO, the crystal structure of the first divided recording layer 2 is desirably bcc. This is to match with the crystallinity of the first junction layer 11 such as MgO. In the Co—Fe alloy, if the Co composition exceeds 75 at. %, the crystal structure becomes fcc, which is not a preferable bcc structure. Therefore, the upper limit of the Co composition is desirably 75 at. %. Since the Fe composition in this case is 25 at. %, the Co/Fe ratio is preferably 3(=75/25) or less.

-B Concentration of First Divided Recording Layer 2 and Second Divided Recording Layer 3-

As described above, the first divided recording layer 2 is desirably formed of a material having a high magnetoresistance ratio. In addition, the second divided recording layer 3 is desirably formed of a material having a high effective magnetic anisotropy energy density $K_{eff}t2$. Here, the correlation between the concentration of B contained as an example of the layer configuration other than Co and Fe and the magnetoresistance ratio is evaluated.

Figure 22:
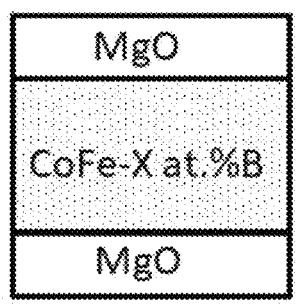
FIG. 22 shows a configuration of a film used for evaluating the relationship between a B concentration and a magnetoresistance ratio of the recording layer.

The configuration of the evaluation element is shown in FIG. 22.

Figure 23:
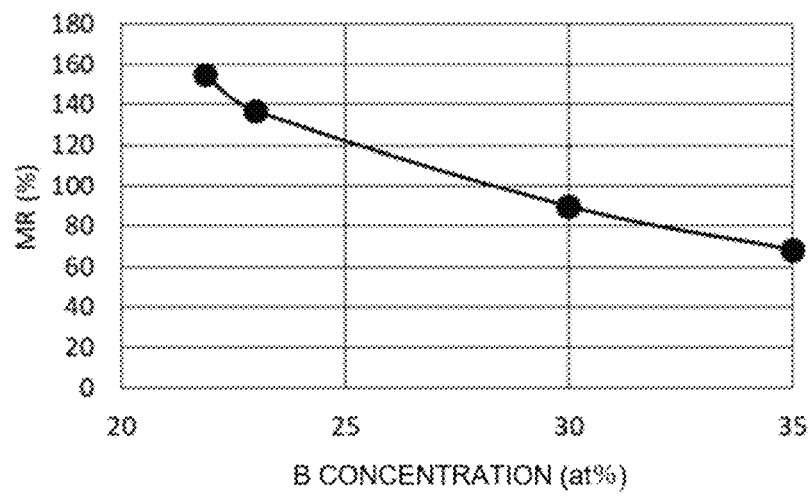
FIG. 23 is a graph showing the relationship between a B concentration and a magnetoresistance ratio of the recording layer.

Table 4 and FIG. 23 show the relationship between the B concentration of the magnetic layer interposed between two MgO and the magnetoresistance ratio.

TABLE 4

| Sample No. | B (at %) | MR (%) |
|---|---|---|
| 4-1 | 21.9 | 154 |
| 4-2 | 23.0 | 137 |
| 4-3 | 30.0 | 90 |
| 4-4 | 35.0 | 68 |

It is found in Table 4 and FIG. 23 that there is a relationship in which the magnetoresistance ratio increases when the B concentration decreases. This result is consistent with the common technical knowledge that, when the amount of B in the magnetic layer decreases, the saturation magnetization $M_s$ increases, and the magnetoresistance ratio also increases.

Therefore, a material having a low B concentration is used for the first divided recording layer 2, and in this evaluation system, specifically, the magnetoresistance ratio is in a range exceeding 60%, the B concentration is desirably 20 at. % or more and 35 at. % or less, more desirably 20 at. % or more and 30 at. % or less, and still more desirably 21.9 at. % or more and 30 at. % or less.

On the other hand, when the B concentration increases, the saturation magnetization $M_s$ decreases, but the effective magnetic anisotropy energy density $K_{eff}t$ increases (refer to Math. 1, etc.).

Therefore, for the second divided recording layer 3 which is desirable to have a high effective magnetic anisotropy energy density $K_{eff}t$, it is more desirable to use a material having a higher B concentration than that of the first divided recording layer 2.

-Film Thickness of Second Junction Layer 12-

As shown in FIG. 18, in order to reduce the resistance area product RA, the film thickness of the second junction layer 12 is preferably 1.2 nm or less, more preferably 1.1 nm or less, and still more preferably 1.0 nm or less. On the other hand, the magnetic coupling force $J_{ex}$ is set to be larger than zero and preferably set to 0.05 mJ/m² or more, and thus the relationship between the film thickness of the second junction layer 12 and the magnetic coupling force $J_{ex}$ is evaluated.

Figure 24A:
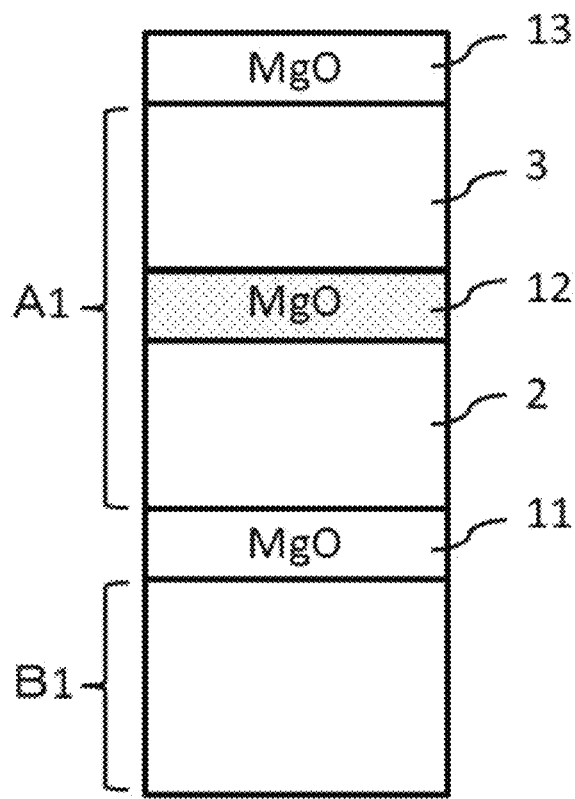
FIG. 24A shows a configuration of a magnetoresistance effect film used for evaluating the relationship between a film thickness and a resistance area product RA of the second junction layer.
Figure 24B:
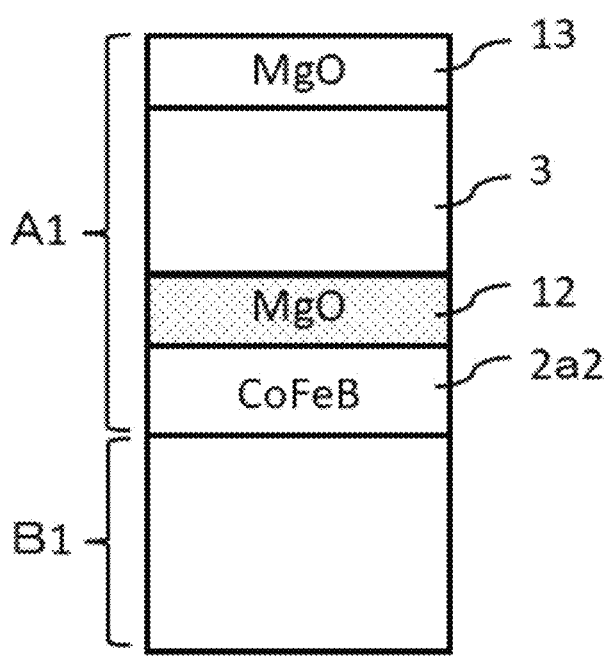
FIG. 24B shows a configuration of a magnetoresistance effect film used for evaluating the relationship between a film thickness and a magnetic coupling force $J_{ex}$ of the second junction layer.

FIG. 24A shows a configuration of a film for evaluating the relationship between the film thickness of the second junction layer and the resistance area product RA, and FIG. 24B shows a configuration of a film for evaluating the relationship between the film thickness of the second junction layer and the magnetic coupling force $J_{ex}$. In order to evaluate the magnetic coupling force $J_{ex}$ acting through the second junction layer 12 in the recording layer A1, an evaluation film in which a second magnetic layer 2a2 in direct contact with the second junction layer 12 within the first divided recording layer 2 is brought into direct contact with a reference layer B1, and magnetically fixed is used.

Figure 25:
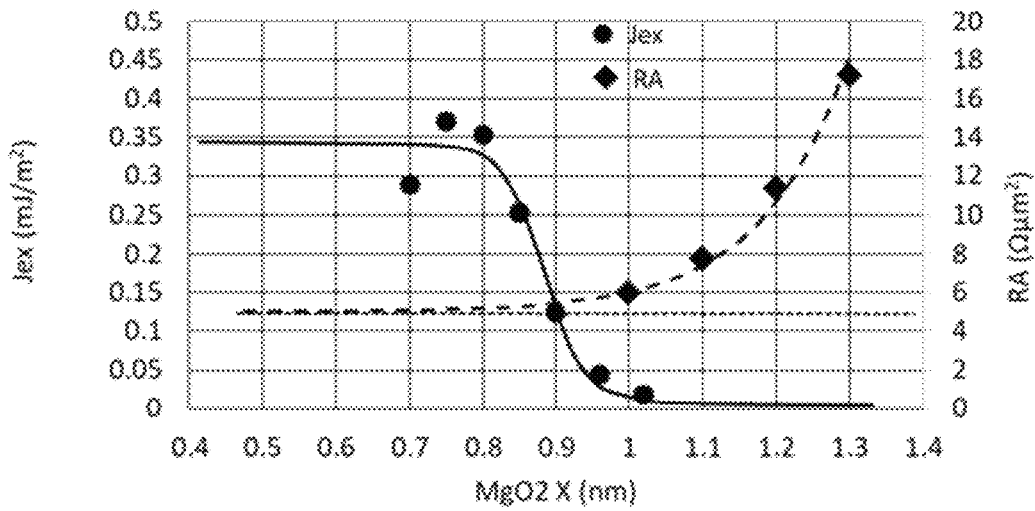
FIG. 25 is a graph showing the relationship between a film thickness, a magnetic coupling force $J_{ex}$ and a resistance area product RA of the second junction layer.

A shift magnetic field $H_{ex}$ from a zero magnetic field of magnetization reversal of the second divided recording layer 3 is calculated from the magnetization curve that sweeps the magnetic field in a direction perpendicular to a film surface and a magnetic coupling force $J_{ex}$ is determined using Math. 2. Table 5 and FIG. 25 show the relationship between the film thickness of the second junction layer 12 and the magnetic coupling force $J_{ex}$. FIG. 25 shows the resistance area product RA of the corresponding entire element and each fitting curve. Table 5 shows the magnetic coupling force $J_{ex}$ when the second junction layer 12 is formed of MgO and the film thickness is changed.

TABLE 5

| Sample No. | MgO X (nm) | Jex (mJ/m²) |
|---|---|---|
| 5-1 | 0.70 | 0.29 |
| 5-2 | 0.75 | 0.37 |
| 5-3 | 0.80 | 0.35 |
| 5-4 | 0.85 | 0.25 |
| 5-5 | 0.90 | 0.12 |
| 5-6 | 0.96 | 0.04 |
| 5-7 | 1.02 | 0.02 |

It is found in FIG. 25 that the film thickness of the second junction layer 12 is preferably 1.0 nm or less at which the magnetic coupling force $J_{ex}$ is larger than zero, and more preferably 0.9 nm or less and still more preferably 0.8 nm or less at which the magnetic coupling force $J_{ex}$ is 0.05 mJ/m² or more. Here, it is also confirmed that the resistance area product RA in this film thickness range is sufficiently small.

-Effective Magnetic Anisotropy Energy Density $K_{eff}t2$ with Respect to Co/Fe Ratio of Second Divided Recording Layer 3-

As described above, the second divided recording layer 3 desirably has a high effective magnetic anisotropy energy density $K_{eff}t2$. In addition, as examined in FIG. 19, it is found that, when the Co/Fe ratio of the second divided recording layer 3 is reduced, the effective magnetic anisotropy energy density $K_{eff}t^*$ increases. In addition, the effective magnetic anisotropy energy density $K_{eff}t^*$ of the entire element is a sum of the effective magnetic anisotropy energy densities $K_{eff}t$ of the magnetic layers constituting the recording layer (refer to Math. 4, etc.). Here, the effective magnetic anisotropy energy density $K_{eff}t2$ with respect to the Co/Fe ratio of the second divided recording layer 3 is evaluated.

Figure 26:
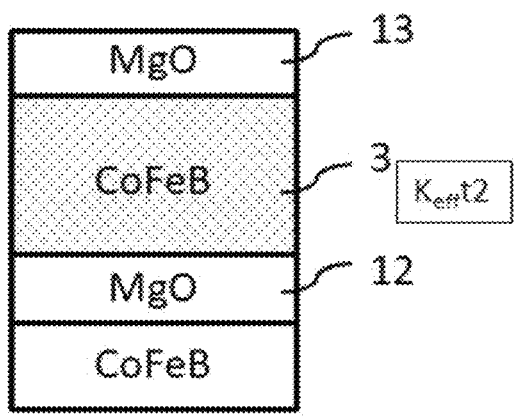
FIG. 26 shows a configuration of a magnetoresistance effect film used for evaluating the relationship between a Co/Fe ratio and an effective magnetic anisotropy energy density $K_{eff}t2$ of the second divided recording layer.

The configuration of the evaluation element is shown in FIG. 26. The Co/Fe ratio of the second divided recording layer 3 is adjusted by laminating one or more different layers. With respect to the total film thickness t of the magnetic layers disposed in the second divided recording layer 3, the content of Fe, Co, or B in the layers is multiplied by the film thickness and summed up to obtain the content of Fe, Co, or B in the entire second divided recording layer 3.

Figure 27:
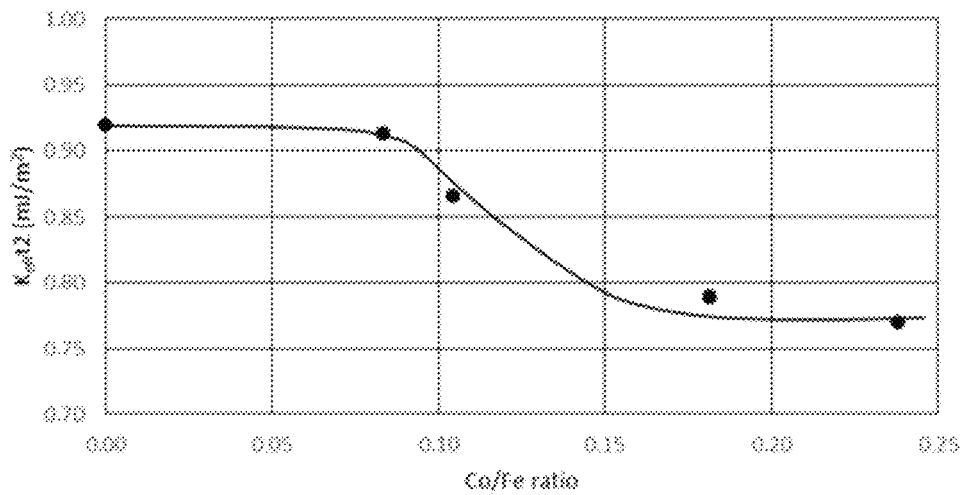
FIG. 27 is a graph showing the relationship between a Co/Fe ratio and an effective magnetic anisotropy energy density $K_{eff}t2$ of the second divided recording layer.

Table 7 and FIG. 27 show the relationship between the Co/Fe ratio of the second divided recording layer 3 and the effective magnetic anisotropy energy density $K_{eff}t2$.

TABLE 6

| Sample No | Fe | Co | B | t (nm) | Co/Fe | $K_{eff}t2$ (mJ/m²) |
|---|---|---|---|---|---|---|
| 6-1 | 1.68 | 0.40 | 0.52 | 2.6 | 0.236 | 0.77 |
| 6-2 | 1.76 | 0.32 | 0.52 | 2.6 | 0.182 | 0.79 |
| 6-3 | 1.84 | 0.19 | 0.52 | 2.6 | 0.104 | 0.87 |
| 6-4 | 1.92 | 0.16 | 0.52 | 2.6 | 0.083 | 0.91 |
| 6-5 | 2.08 | 0.00 | 0.52 | 2.6 | 0.000 | 0.92 |

It is found in FIG. 27 that, when the Co/Fe ratio is smaller, the effective magnetic anisotropy energy density $K_{eff}t2$, that is, the effective magnetic anisotropy energy density $K_{eff}t^*$ of the entire element is higher.

When the Co/Fe ratio of the entire second divided recording layer 3 is preferably 0.11 or less, and more preferably 0.07 or less, the effective magnetic anisotropy energy density $K_{eff}t^*$ can be increased.

-Film Formation Method and Magnetoresistance Ratio of First Junction Layer 11, Second Junction Layer 12 and Third Junction Layer 13-

In Embodiment 1, in order to improve the magnetoresistance ratio MR1 in the first junction layer 11 and increase the magnetoresistance ratio of the entire element, it is desirable to perform film formation by a film formation method including a step of controlling the heating and cooling treatment after deposition of the first junction layer 11, the second junction layer 12 and the third junction layer 13 and before deposition of the next layer in addition to adjusting the composition and the film thickness of each layer as described above. Specifically, it is preferable that the heat treatment be not performed after deposition of the second junction layer 12 and the third junction layer 13 and before deposition of the next layer. In addition, it is more preferable that the heat treatment be not performed after deposition of the second junction layer 12 and the third junction layer 13 and before deposition of the next layer and also the heat treatment and the cooling treatment be performed after deposition of the first junction layer 11 and before deposition of the next layer.

The temperature of the heat treatment is desirably in a range of 150° C. to 400° C., and more desirably in a range of 200° C. to 300° C. In addition, the time of the heat treatment is desirably in a range of 100 seconds to 400 seconds and more desirably in a range of 250 seconds to 350 seconds.

The cooling treatment method after the heat treatment is not limited, and natural cooling for 300 seconds or longer may be exemplified.

As described above, the reason why it is desirable to perform film formation by the film formation method including a step of controlling the heating and cooling treatment will be described below.

First, it is known that, when the heat treatment is performed after deposition of the layer, the magnetoresistance ratio increases because the crystal structure change. However, the heat treatment not only increases the magnetoresistance ratio but also increases the resistance area product RA.

Here, based on the examination results of the magnetoresistance ratio MR and the resistance area product RA of the entire element described above, in order to increase the magnetoresistance ratio of MR the entire element, the magnetoresistance ratio MR1 of the first junction layer 11 may be maximized and the resistance area product $R_{P2}A$ in the second junction layer 12 and the resistance area product $R_{P3}A$ in the third junction layer 13 may be made as small as possible. That is, it is desirable to lower the resistance area product RA without performing the heat treatment after deposition of the second junction layer 12 and the third junction layer 13. In addition, it is more desirable to increase the magnetoresistance ratio by performing the heat treatment continuously after deposition of the first junction layer 11.

An example of applying a film formation method including a step of controlling heating and cooling treatments to Embodiment 1 includes steps of depositing the first junction layer 11 on the deposited first reference layer B1, heating a film in which the first junction layer 11 is the uppermost part before deposition of the next layer, cooling the heated film, depositing the first divided recording layer 2 on the cooled first junction layer 11, subsequently depositing the second junction layer 12 on the first divided recording layer 2, subsequently depositing the second divided recording layer 3 on the second junction layer 12, subsequently depositing the third junction layer 13 on the second divided recording layer 3, and subsequently depositing a second reference layer B2 or an upper electrode E2 on the third junction layer 13, and the second junction layer 12 is not heated or cooled before the step of depositing the second divided recording layer 3, and the third junction layer 13 is not heated or cooled before the step of depositing the second reference layer B2 or the upper electrode E2.

Another example of applying a film formation method including a step of controlling heating and cooling treatments to Embodiment 1 includes steps of depositing the second divided recording layer 3 on the deposited third junction layer 13, subsequently depositing the second junction layer 12 on the second divided recording layer 3, subsequently depositing the first divided recording layer 2 on the second junction layer 12, subsequently depositing the first junction layer 11 on the first divided recording layer 2, heating a film in which the first junction layer 11 is the uppermost part before deposition of the next layer, cooling the heated film, and depositing the cooled first reference layer B1, and the second junction layer 12 is not heated or cooled before the step of depositing the first divided recording layer 2, and the third junction layer 13 is not heated or cooled before the step of depositing the second divided recording layer 3.

Embodiment 2

-Configuration of Element-

Figure 2:
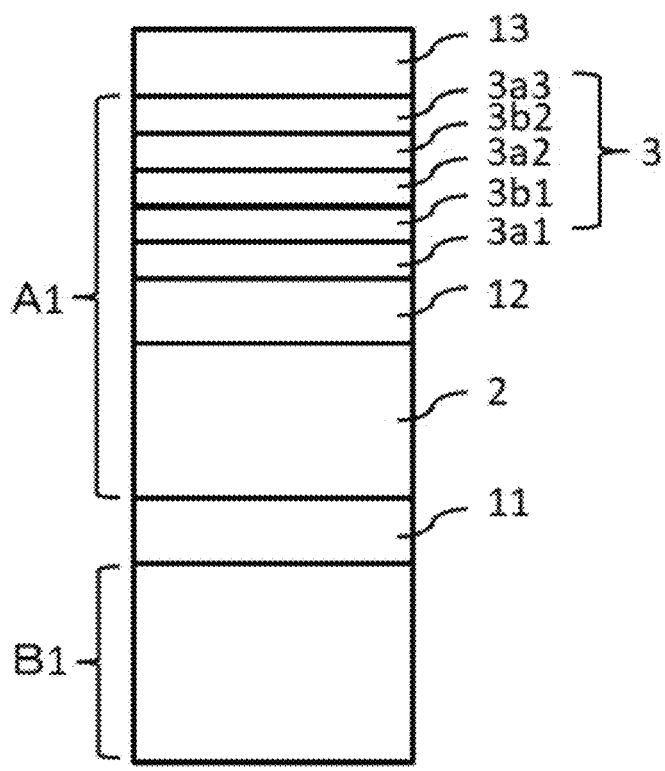
FIG. 2 shows a vertical cross-sectional view of another example of the configuration of the magnetoresistance effect element of the present invention.

FIG. 2 shows a basic configuration of Embodiment 2 of the present invention. The basic configuration of the magnetoresistance effect element includes the first reference layer B1/the first junction layer 11/the first divided recording layer 2/the second junction layer 12/a third magnetic layer 3a1/a second non-magnetic coupling layer 3b1/a magnetic coupling layer 3a2/a third non-magnetic coupling layer 3b2/a fourth magnetic layer 3a3/the third junction layer 13 adjacently disposed in this order. The first divided recording layer 2/the second junction layer 12/the third magnetic layer 3a1/the second non-magnetic coupling layer 3b1/the magnetic coupling layer 3a2/the third non-magnetic coupling layer 3b2/the fourth magnetic layer 3a3 constitute the first recording layer A1, and the first reference layer B1 and the first divided recording layer 2 are magnetically tunnel-junctioned by the first junction layer 11. In addition, the third magnetic layer 3a1/the second non-magnetic coupling layer 3b1/the magnetic coupling layer 3a2/the third non-magnetic coupling layer 3b2/the fourth magnetic layer 3a3 constitute the second divided recording layer 3.

When the magnetoresistance effect element is connected to a magnetic memory cell, it has a lower electrode layer provided on the side opposite to the first junction layer 11 of the first reference layer B1 and an upper electrode layer provided on the side opposite to the third divided recording layer 3 of the third junction layer 13.

Embodiment 2 is the same as Embodiment 1 except that it has the following characteristics.

The third magnetic layer 3a1 and the fourth magnetic layer 3a3 is a ferromagnetic layer in which the magnetization direction can be reversed. The magnetization direction is desirably a direction perpendicular to a film surface.

The third magnetic layer 3a1 and the fourth magnetic layer 3a3 desirably contains at least a 3d ferromagnetic transition metal such as Co, Fe, or Ni, and more desirably contains at least Fe. Specific examples include Co, Fe, Ni, CoFe, FeNi, CoNi, CoB, FeB, NiB, CoFeB, FePt, TbTeCo, MnAl, MnGa, and the like, and among these, Fe, CoFe, FeB, CoFeB, and FePt are more desirable.

In addition, for the third magnetic layer 3*al*, a material having interfacial magnetic anisotropy in a direction perpendicular to a film surface at an interface with the second junction layer 12, and for the fourth magnetic layer 3*a*3, a material having interfacial magnetic anisotropy in a direction perpendicular to a film surface at an interface with the third junction layer 13 are more desirable, and Fe, CoFe, FeB, and CoFeB are still more desirable.

In addition, the third magnetic layer 3*a*1 and the fourth magnetic layer 3*a*3 may further contain a non-magnetic element such as W, Ta, Hf, Zr, Nb, Mo, Ti, V, Cr, Si, Al, B, Pd, Pt or the like. Among these, B and V are preferable in consideration of ease of handling.

The magnetic coupling layer 3*a*2 is a ferromagnetic layer in which the magnetization direction can be reversed. The magnetization direction is desirably a direction perpendicular to a film surface. In addition, the magnetic coupling layer 3*a*2 is inserted for bridging so that the third magnetic layer 3*a*1 and the fourth magnetic layer 3*a*3 are magnetically coupled and integrally magnetically reversed.

The magnetic coupling layer 3*a*2 desirably contains at least a 3*d* ferromagnetic transition metal such as Co, Fe, or Ni, and more desirably contains at least Fe. Specific examples include Co, Fe, Ni, CoFe, FeNi, CoNi, CoB, FeB, NiB, CoFeB, FePt, TbTeCo, MnAl, MnGa, and the like, and among these, Fe, CoFe, FeB, CoFeB, and FePt are more desirable.

In addition, the magnetic coupling layer 3*a*2 may further contain a non-magnetic element such as W, Ta, Hf, Zr, Nb, Mo, Ti, V, Cr, Si, Al, B, Pd, Pt or the like. Among these, B and V are preferable in consideration of ease of handling.

The film thickness of the magnetic coupling layer 3*a*2 is preferably 0.2 nm or more and more preferably 0.4 nm or more and 1.0 nm or less, which can increase the effective magnetic anisotropy energy density $K_{eff}t^*$. Details will be described below with reference to FIGS. 28 to 30.

The total film thickness of the third magnetic layer 3*al*, the magnetic coupling layer 3*a*2 and the fourth magnetic layer 3*a*3 is preferably in a range of 1.6 nm to 3.0 nm and more preferably in a range of 2.0 nm to 2.6 nm. This is because, even if the film thickness is thinner or even if the film thickness is thicker, when MgO or the like is used for the second junction layer 12 and the third junction layer 13, sufficient perpendicular magnetic anisotropy cannot be obtained for the second divided recording layer 3.

The Co/Fe ratio of the third magnetic layer 3*al*, the magnetic coupling layer 3*a*2 and the fourth magnetic layer 3*a*3 in combination is desirably smaller than the Co/Fe ratio of the entire first divided recording layer 2. This is because the entire element allows both a high effective magnetic anisotropy energy density $K_{eff}t^*$ and a high magnetoresistance ratio to be achieved.

The Co/Fe ratio of the third magnetic layer 3*al*, the magnetic coupling layer 3*a*2 and the fourth magnetic layer 3*a*3 in combination is preferably 0.11 or less and more preferably 0.07 or less. This is to increase the effective magnetic anisotropy energy density $K_{eff}t^*$.

The B concentration of the third magnetic layer 3*a*1, the magnetic coupling layer 3*a*2 and the fourth magnetic layer 3*a*3 in combination is desirably larger than the B concentration of the entire first divided recording layer 2. This is because, when the B concentration increases, the saturation magnetization $M_s$ decreases, but the effective magnetic anisotropy energy density $K_{eff}t$ increases (refer to Math. 1, etc.).

The second non-magnetic coupling layer 3*b*1 and the third non-magnetic coupling layer 3*b*2 are inserted between ferromagnetic components, and contain non-magnetic elements such as W, Ta, Hf, Zr, Nb, Mo, Ti, V, Cr, Si, Al, B, Pd, and Pt. Among these, W, Ta, Hf, Zr, Nb, Mo, Ti, V and the like are preferable, and W, Ta, Mo, and V are more preferable.

In addition, in order to further increase the magnetic coupling force $J_{ex}$ between two magnetic layers (the third magnetic layer 3*al* and the fourth magnetic layer 3*a*3) and further increase the thermal stability index $\Delta$ of the recording layer of the magnetoresistance effect element, the film thickness of the second non-magnetic coupling layer 3*b*1 and the third non-magnetic coupling layer 3*b*2 is preferably 0.3 nm or less and more preferably 0.2 nm or less.

Here, when the film thickness of any of the second non-magnetic coupling layer 3*b*1 and the third non-magnetic coupling layer 3*b*2 is less than 0.2 nm, layers with a film thickness that is close to or smaller than the atomic size are produced by adjusting the sputtering time, and both continuous layers and non-continuous layers may be included. In this regard, if there is a gap in the lattice that absorbs B and the like in the magnetic layer, it can contribute to the perpendicular magnetic anisotropy, and thus the layers may or may not be continuous.

-Insertion of Magnetic Coupling Layer 3*a*2-

As described in Embodiment 1, the second divided recording layer 3 is expected to have a layer configuration that increases the effective magnetic anisotropy energy density $K_{eff}t2$.

Therefore, when the magnetic coupling layer is inserted into the magnetic layer, how it contributes to the effective magnetic anisotropy energy density $K_{eff}t^*$ and the magnetoresistance ratio is evaluated.

Figure 28:
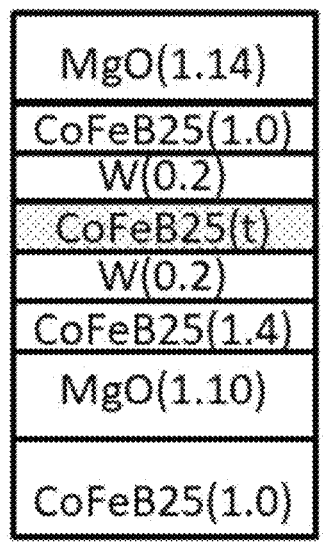
FIG. 28 shows a configuration of an element used for evaluating an influence of a magnetic coupling layer on an effective magnetic anisotropy energy density $K_{eff}t^*$ and a magnetoresistance ratio.

The configuration of the evaluation element is shown in FIG. 28.

Figure 29:
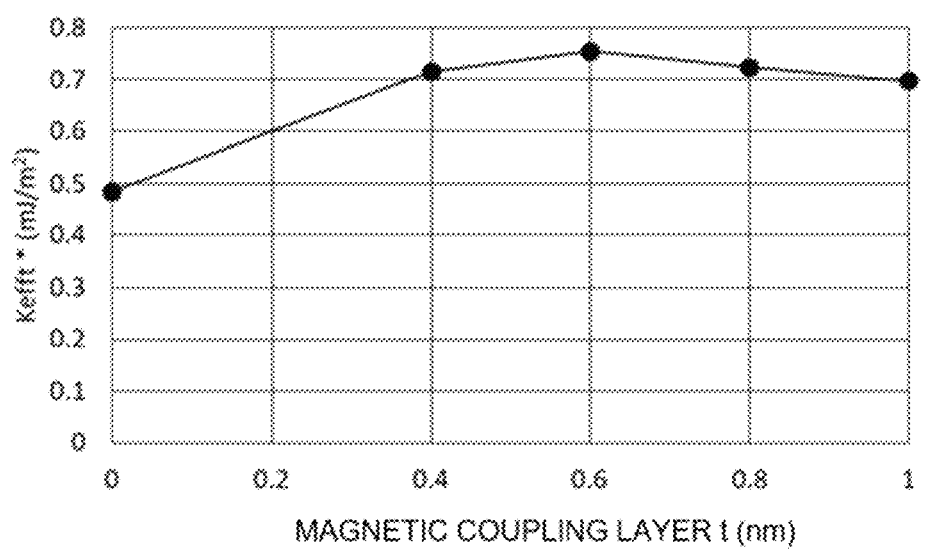
FIG. 29 is a graph showing the relationship between a film thickness and an effective magnetic anisotropy energy density $K_{eff}t^*$ of the magnetic coupling layer.
Figures 30, 31:
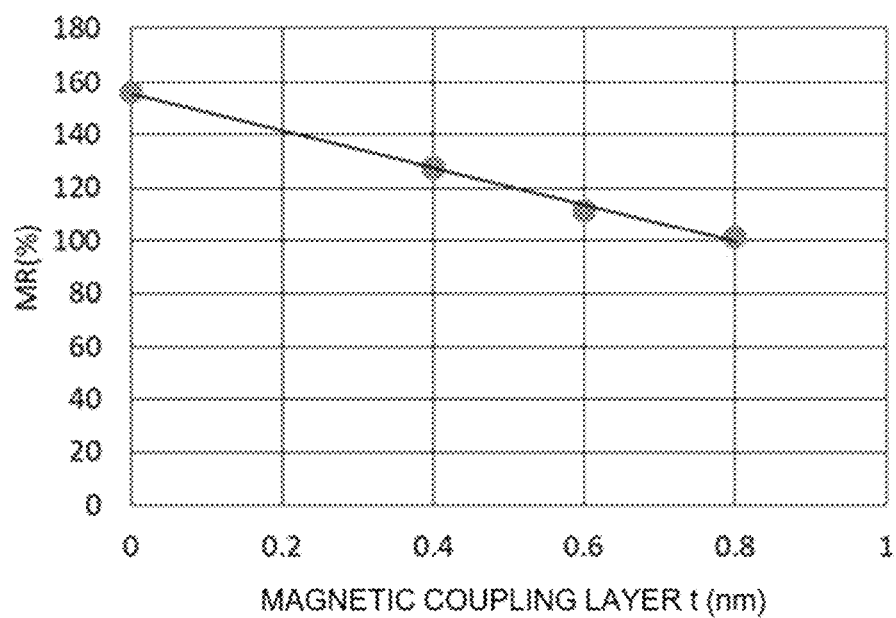
FIG. 30 is a graph showing the relationship between a film thickness and a magnetoresistance ratio of the magnetic coupling layer.
FIG. 31 shows a configuration of a film used for evaluating the relationship between a film thickness, a magnetoresistance ratio and a resistance area product RA of a first non-magnetic coupling layer.

Table 7 and FIG. 29 show the relationship between the film thickness of the magnetic coupling layer and the effective magnetic anisotropy energy density $K_{eff}t^*$. In addition, Table 8 and FIG. 30 show the relationship between the film thickness of the magnetic coupling layer and the magnetoresistance ratio.

TABLE 7

| Sample No. | Magnetic coupling layer t (nm) | $K_{eff}t^*$ (mJ/m²) |
| --- | --- | --- |
| 7-1 | 0.0 | 0.48 |
| 7-2 | 0.4 | 0.72 |
| 7-3 | 0.6 | 0.76 |
| 7-4 | 0.8 | 0.72 |
| 7-5 | 1.0 | 0.70 |

TABLE 8

| Sample No. | Magnetic coupling layer t (nm) | MR (%) |
| --- | --- | --- |
| 8-1 | 0 | 156 |
| 8-2 | 0.4 | 127 |
| 8-3 | 0.6 | 112 |
| 8-4 | 0.8 | 102 |

It is found in Table 7 and FIG. 29 that, when the magnetic coupling layer is inserted, the effective magnetic anisotropy energy density $K_{eff}t^*$ increases. That is, it is desirable to insert the magnetic coupling layer 3*a*2 into the second divided recording layer 3, which is expected to have a high effective magnetic anisotropy energy density $K_{eff}t^*$. In consideration of the high effective magnetic anisotropy energy density $K_{eff}t^*$, the film thickness of the magnetic coupling layer 3a2 is preferably 0.2 nm or more and more preferably 0.4 nm or more. On the other hand, in order to constitute two magnetic layers (the third magnetic layer 3a1 and the fourth magnetic layer 3a3) so that they have perpendicular magnetic anisotropy, the film thickness of the magnetic coupling layer 3a2 is preferably 1.6 nm or less, more preferably 1.2 nm or less, and still more preferably 1.0 nm or less.

On the other hand, it is found in Table 8 and FIG. 30 that, when the magnetic coupling layer is inserted, the magnetoresistance ratio is reduced. Based on this finding, more desirably, no magnetic coupling layer is inserted into the first divided recording layer 2, which is expected to have a high magnetoresistance ratio, and the magnetic coupling layer 3a2 is inserted into the second divided recording layer 3.

Embodiment 3

-Configuration of Element-

Figure 3:
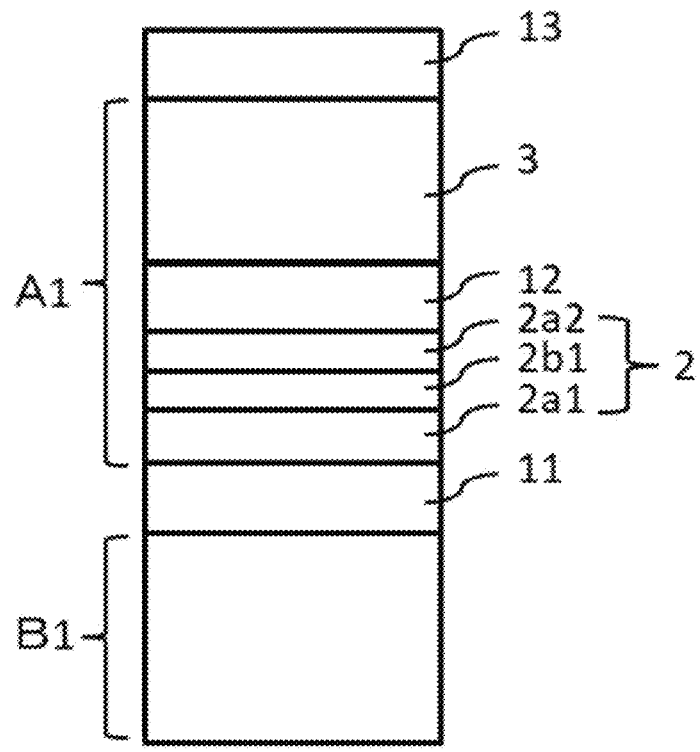
FIG. 3 shows a vertical cross-sectional view of another example of the configuration of the magnetoresistance effect element of the present invention.

FIG. 3 shows a basic configuration of Embodiment 3 of the present invention. The basic configuration of the magnetoresistance effect element includes the first reference layer B1/the first junction layer 11/a first magnetic layer 2a1/a first non-magnetic coupling layer 2b1/the second magnetic layer 2a2/the second junction layer 12/the second divided recording layer 3/the third junction layer 13 adjacently disposed in this order. The first magnetic layer 2a1/the first non-magnetic coupling layer 2b1/the second magnetic layer 2a2/the second junction layer 12/the second divided recording layer 3 constitute the first recording layer A1, and the first reference layer B1 and the first magnetic layer 2a1 are magnetically tunnel-junctioned by the first junction layer 11. In addition, the first magnetic layer 2a1/the first non-magnetic coupling layer 2b1/the second magnetic layer 2a2 constitute the first divided recording layer 2.

When the magnetoresistance effect element is connected to a magnetic memory cell, it has a lower electrode layer provided on the side opposite to the first junction layer 11 of the first reference layer B1 and an upper electrode layer provided on the side opposite to the third divided recording layer 3 of the third junction layer 13.

Embodiment 3 is the same as Embodiment 1 except that it has the following characteristics.

The first magnetic layer 2a1 and the second magnetic layer 2a2 are a ferromagnetic layer in which the magnetization direction can be reversed. The magnetization direction is desirably a direction perpendicular to a film surface.

The first magnetic layer 2a1 is not particularly limited as long as it is formed of a material having a large magnetoresistance ratio due to the magnetic tunnel junction in the first junction layer 11 interposed between it and the first reference layer B1, and desirably contains at least a 3d ferromagnetic transition metal such as Co, Fe, or Ni and more desirably contains at least Co. Specific examples include Co, Fe, Ni, CoFe, FeNi, CoNi, CoB, FeB, NiB, CoFeB, FePt, TbTeCo, MnAl, MnGa, and the like, and among these, Co, CoFe, CoNi, CoB, and CoFeB are more desirable.

In addition, for the first magnetic layer 2a1, a material having interfacial magnetic anisotropy in a direction perpendicular to a film surface at an interface with the first junction layer 11, and for the second magnetic layer 2a2, a material having interfacial magnetic anisotropy in a direction perpendicular to a film surface at an interface with the second junction layer 12 are more desirable, and CoFe and CoFeB are still more desirable.

In addition, the first magnetic layer 2a1 and the second magnetic layer 2a2 may further contain a non-magnetic element such as W, Ta, Hf, Zr, Nb, Mo, Ti, V, Cr, Si, Al, B, Pd, Pt or the like. Among these, B and V are preferable in consideration of ease of handling.

The Co/Fe ratio of the first magnetic layer 2a1 and the second magnetic layer 2a2 in combination is desirably larger than the Co/Fe ratio of the entire second divided recording layer 3. This is because the entire element allows both a high effective magnetic anisotropy energy density $K_{eff}t^*$ and a high magnetoresistance ratio to be achieved.

The Co/Fe ratio of the first magnetic layer 2a1 and the second magnetic layer 2a2 in combination is preferably 0.05 or more, more preferably 0.09 or more, and still more preferably 0.18 or more and 0.33 or less. On the other hand, in order to match the crystallinity of the first magnetic layer 2a1 with the crystallinity of the first junction layer 11 such as MgO, when the first magnetic layer 2a1 is formed of CoFeB, preferably, Co:Fe does not exceed 75:25, that is, the Co/Fe ratio is 3 or less.

The B concentration of the first magnetic layer 2a1 and the second magnetic layer 2a2 in combination is desirably smaller than the B concentration of the entire second divided recording layer 3. Specifically, the B concentration of the first magnetic layer 2a1 and the second magnetic layer 2a2 in combination is desirably 20 at. % or more and 35 at. % or less, more desirably 20 at. % or more and 30 at. % or less, and still more desirably 21.9 at. % or more and 30 at. % or less.

The total film thickness of the first magnetic layer 2a1 and the second magnetic layer 2a2 is preferably in a range of 1.6 nm to 3.0 nm, and more preferably in a range of 2.0 nm to 2.6 nm. This is because, even if the film thickness is thinner or even if the film thickness is thicker, when MgO or the like is used for the first junction layer 11 and the second junction layer 12, sufficient perpendicular magnetic anisotropy cannot be obtained for the first divided recording layer 2. In addition, the film thickness of the first magnetic layer 2a1 may be larger than the film thickness of the second magnetic layer 2a2.

The first non-magnetic coupling layer 2b1 is inserted between ferromagnetic components, and contains non-magnetic elements such as W, Ta, Hf, Zr, Nb, Mo, Ti, V, Cr, Si, Al, B, Pd, and Pt. Among these, W, Ta, Hf, Zr, Nb, Mo, Ti, V and the like are preferable, and W, Ta, Mo, and V are more preferable.

In addition, in order to further increase the magnetic coupling force $J_{ex}$ between two magnetic layers (the first magnetic layer 2a1 and the second magnetic layer 2a2) and further increase the thermal stability index $\Delta$ of the recording layer of the magnetoresistance effect element, the film thickness of the first non-magnetic coupling layer 2b1 is preferably 0.33 nm or less. Details will be described below with reference to FIG. 31 and FIG. 32.

Here, when the film thickness of the first non-magnetic coupling layer 2b1 is less than 0.2 nm, layers with a film thickness that is close to or smaller than the atomic size are produced by adjusting the sputtering time, and both continuous layers and non-continuous layers may be included. In this regard, if there is a gap in the lattice that absorbs B and the like in the magnetic layer, it can contribute to the perpendicular magnetic anisotropy, and thus the layers may or may not be continuous.

-Film Thickness of First Non-Magnetic Coupling Layer 2b1 and Magnetoresistance Ratio- As described in Embodiment 1, the first divided recording layer 2 is expected to have a layer configuration that increases the magnetoresistance ratio.

Here, when the non-magnetic coupling layer is inserted into the magnetic layer, how it contributes to the magnetoresistance ratio and the resistance area product RA is evaluated.

The configuration of the evaluation element is shown in FIG. 31.

Figure 32:
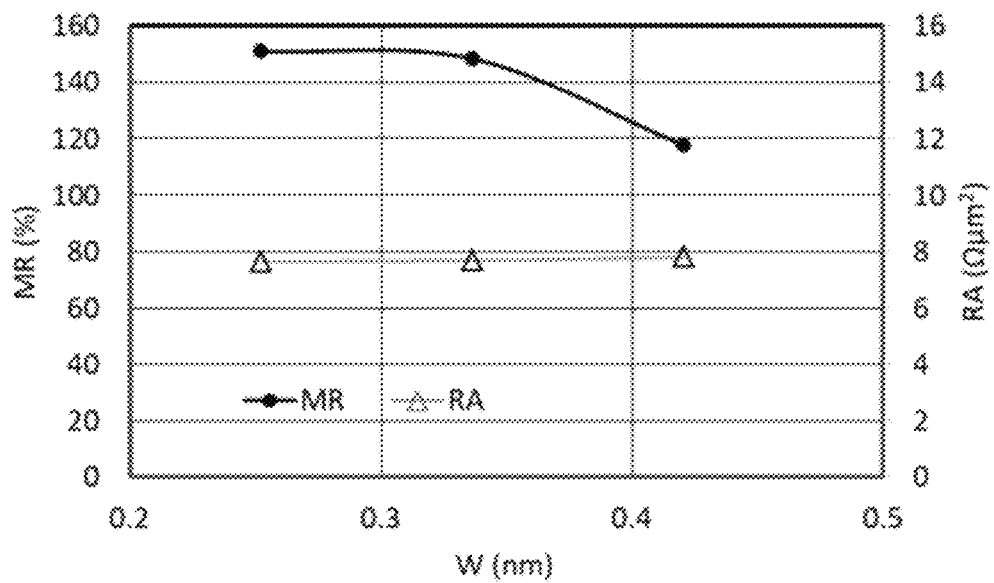
FIG. 32 is a graph showing the relationship between a film thickness, a magnetoresistance ratio and a resistance area product RA of the first non-magnetic coupling layer.

Table 9 and FIG. 32 show the relationship between the film thickness of the non-magnetic coupling layer, the magnetoresistance ratio, and the resistance area product RA.

TABLE 9

| Sample No. | Non-magnetic coupling layer (nm) | MR(%) | RA ($\Omega\mu m^2$) |
|---|---|---|---|
| 9-1 | 0.25 | 151 | 7.6 |
| 9-2 | 0.34 | 148 | 7.7 |
| 9-3 | 0.42 | 118 | 7.8 |

It is found in Table 9 and FIG. 32 that, when the film thickness of the non-magnetic coupling layer is increased, the magnetoresistance ratio decreases, although its absolute value is sufficiently high, and the resistance area product RA hardly change in the measurement range. That is, the first non-magnetic coupling layer 2b1 with a film thickness of desirably 0.4 nm or less and with a film thickness of more desirably 0.33 nm or less is inserted into the first divided recording layer 2 which is expected to have a high magnetoresistance ratio.

Embodiment 4

Figure 4:
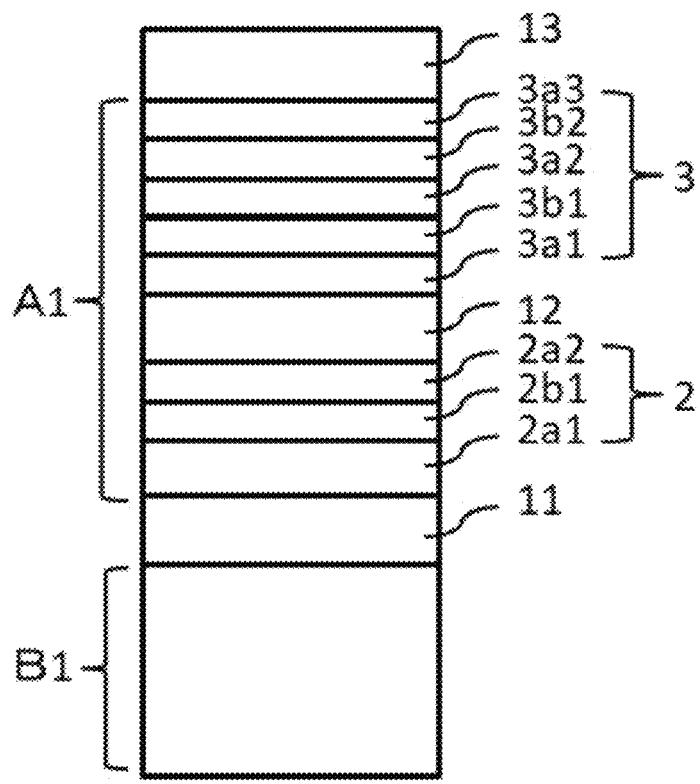
FIG. 4 shows a vertical cross-sectional view of another example of the configuration of the magnetoresistance effect element of the present invention.

FIG. 4 shows a basic configuration of Embodiment 4 of the present invention. The basic configuration of the magnetoresistance effect element includes the first reference layer B1/the first junction layer 11/the first magnetic layer 2a1/the first non-magnetic coupling layer 2b1/the second magnetic layer 2a2/the second junction layer 12/the third magnetic layer 3a1/the second non-magnetic coupling layer 3b1/the magnetic coupling layer 3a2/the third non-magnetic coupling layer 3b2/the fourth magnetic layer 3a3/the third junction layer 13 adjacently disposed in this order. The first magnetic layer 2a1/the first non-magnetic coupling layer 2b1/the second magnetic layer 2a2/the second junction layer 12/the third magnetic layer 3a1/the second non-magnetic coupling layer 3b1/the magnetic coupling layer 3a2/the third non-magnetic coupling layer 3b2/the fourth magnetic layer 3a3 constitute the first recording layer A1, and the first reference layer B1 and the first magnetic layer 2a1 are magnetically tunnel-junctioned by the first junction layer 11. In addition, the first magnetic layer 2a1/the first non-magnetic coupling layer 2b1/the second magnetic layer 2a2 constitute the first divided recording layer 2, and the third magnetic layer 3a1/the second non-magnetic coupling layer 3b1/the magnetic coupling layer 3a2/the third non-magnetic coupling layer 3b2/the fourth magnetic layer 3a3 constitute the second divided recording layer 3.

When the magnetoresistance effect element is connected to a magnetic memory cell, it has a lower electrode layer provided on the side opposite to the first junction layer 11 of the first reference layer B1 and an upper electrode layer provided on the side opposite to the third divided recording layer 3 of the third junction layer 13. Details of Embodiment 4 are the same as those of Embodiments 2 and 3.

Embodiment 5

Figure 5:
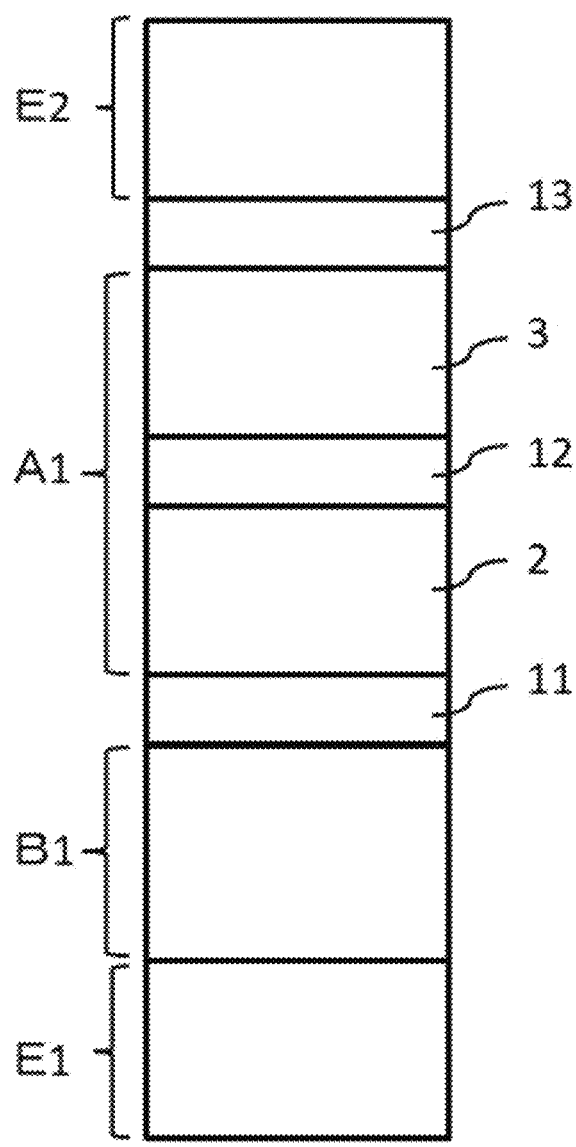
FIG. 5 shows a vertical cross-sectional view of another example of the configuration of the magnetoresistance effect element of the present invention.

FIG. 5 shows a basic configuration of Embodiment 5 of the present invention. The basic configuration of the magnetoresistance effect element includes a lower electrode E1/the first reference layer B1/the first junction layer 11/the first divided recording layer 2/the second junction layer 12/the second divided recording layer 3/the third junction layer 13/the upper electrode E2 adjacently disposed in this order. The first divided recording layer 2/the second junction layer 12/the second divided recording layer 3 constitute the first recording layer A1, and the first reference layer B1 and the first divided recording layer 2 are magnetically tunnel-junctioned by the first junction layer 11.

Embodiment 5 is the same as Embodiment 1 except that it has the following characteristics.

The lower electrode E1 is connected to the end surface on the side opposite to the first junction layer 11 of the first reference layer B1.

Examples of the laminated structure of the lower electrode E1 include Ta (5 nm)/Ru (5 nm)/Ta (10 nm)/Pt (5 nm), and Ta (5 nm)/TaN (20 nm).

The upper electrode E2 is connected to the end surface on the side opposite to the first recording layer A1 of the third junction layer 13.

Examples of the laminated structure of the upper electrode E2 include Ta (50 nm), Ta (5 nm)/Ru (50 nm), Ru (1 to 50 nm), Pt (1 to 50 nm), and CoFeB (0.2 to 1.5 nm)/Ru (5)/Ta (50 nm).

Embodiment 6

Figure 6:
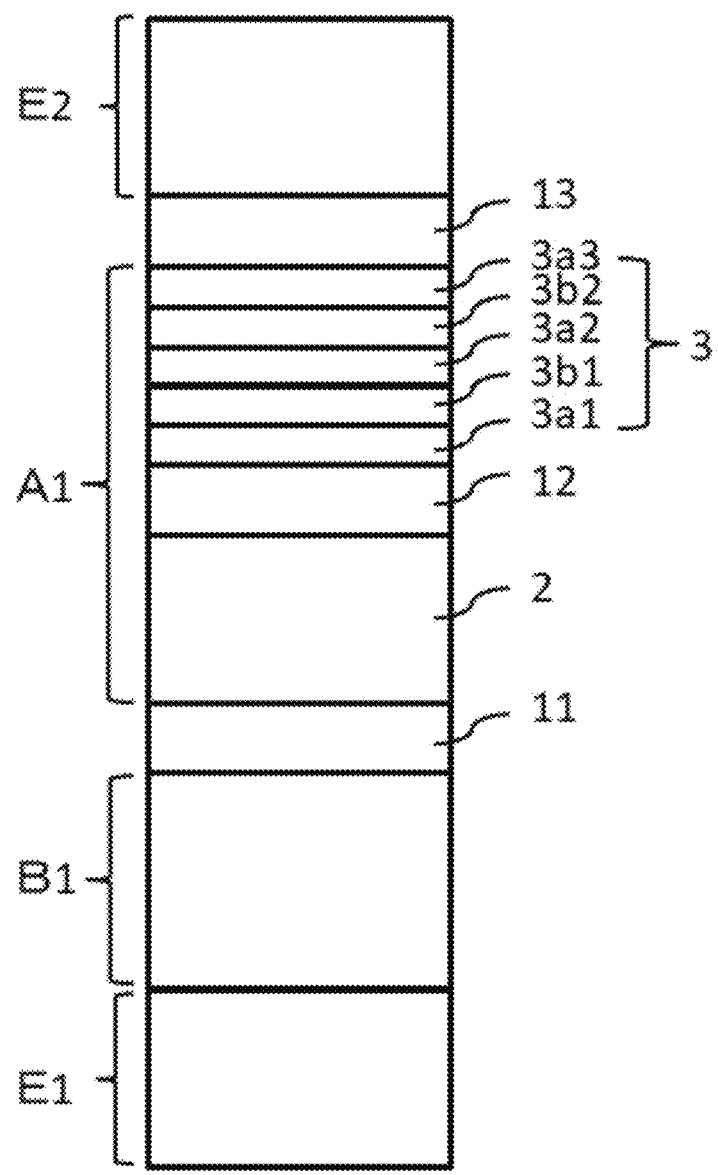
FIG. 6 shows a vertical cross-sectional view of another example of the configuration of the magnetoresistance effect element of the present invention.

FIG. 6 shows a basic configuration of Embodiment 6 of the present invention. The basic configuration of the magnetoresistance effect element includes the lower electrode E1/the first reference layer B1/the first junction layer 11/the first divided recording layer 2/the second junction layer 12/the third magnetic layer 3a1/the second non-magnetic coupling layer 3b1/the magnetic coupling layer 3a2/the third non-magnetic coupling layer 3b2/the fourth magnetic layer 3a3/the third junction layer 13/the upper electrode E2 adjacently disposed in this order. The first divided recording layer 2/the second junction layer 12/the third magnetic layer 3a1/the second non-magnetic coupling layer 3b1/the magnetic coupling layer 3a2/the third non-magnetic coupling layer 3b2/the fourth magnetic layer 3a3 constitute the first recording layer A1, and the first reference layer B1 and the first divided recording layer 2 are magnetically tunnel-junctioned by the first junction layer 11. In addition, the third magnetic layer 3a1/the second non-magnetic coupling layer 3b1/the magnetic coupling layer 3a2/the third non-magnetic coupling layer 3b2/the fourth magnetic layer 3a3 constitute the second divided recording layer 3.

Details of Embodiment 6 are the same as those of Embodiments 2 and 5.

Embodiment 7

Figure 7:
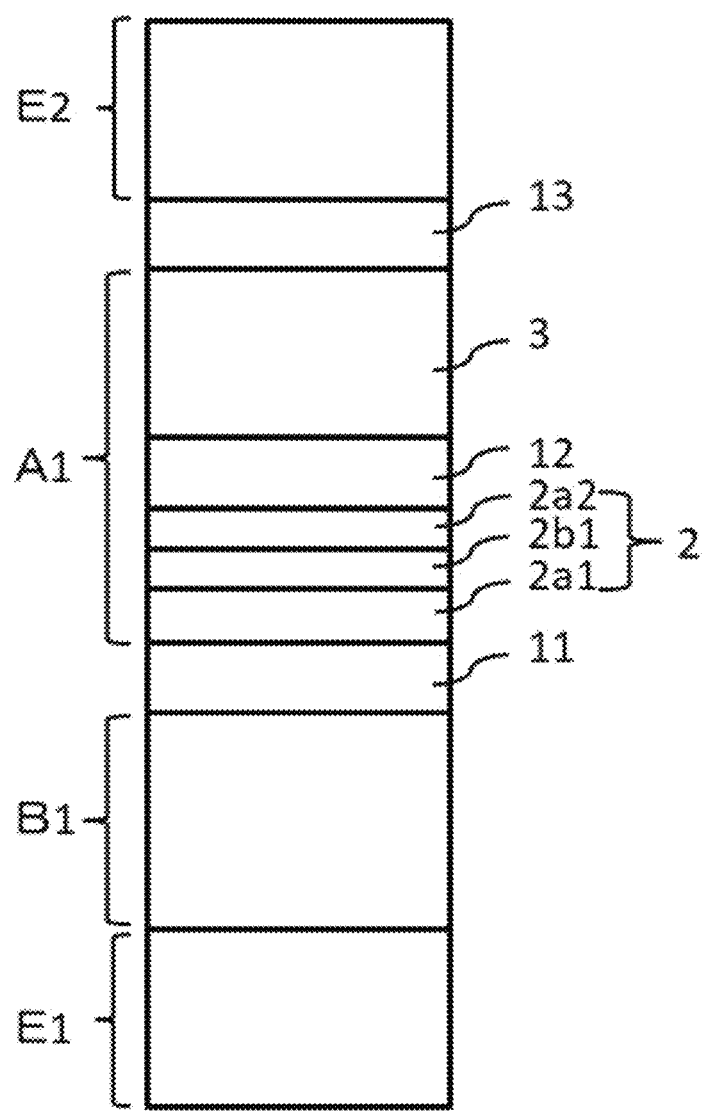
FIG. 7 shows a vertical cross-sectional view of another example of the configuration of the magnetoresistance effect element of the present invention.

FIG. 7 shows a basic configuration of Embodiment 7 of the present invention. The basic configuration of the magnetoresistance effect element includes the lower electrode E1/the first reference layer B1/the first junction layer 11/the first magnetic layer 2a1/the first non-magnetic coupling layer 2b1/the second magnetic layer 2a2/the second junction layer 12/the second divided recording layer 3/the third junction layer 13/the upper electrode E2 adjacently disposed in this order. The first magnetic layer 2a1/the first non-magnetic coupling layer 2b1/the second magnetic layer 2a2/the second junction layer 12/the second divided recording layer 3 constitute the first recording layer A1, and the first reference layer B1 and the first magnetic layer 2a1 are magnetically tunnel-junctioned by the first junction layer 11. In addition, the first magnetic layer 2a1/the first non-magnetic coupling layer 2b1/the second magnetic layer 2a2 constitute the first divided recording layer 2.

Details of Embodiment 7 are the same as those of Embodiments 3 and 5.

Embodiment 8

Figure 8:
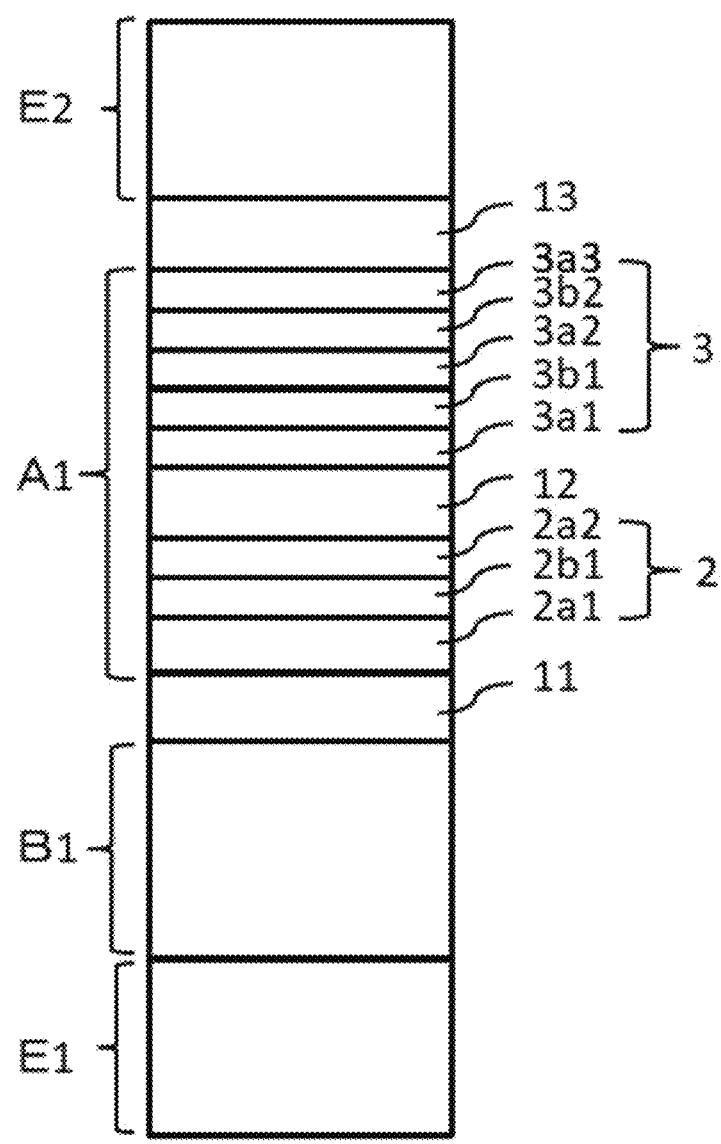
FIG. 8 shows a vertical cross-sectional view of another example of the configuration of the magnetoresistance effect element of the present invention.

FIG. 8 shows a basic configuration of Embodiment 8 of the present invention. The basic configuration of the magnetoresistance effect element includes the lower electrode E1/the first reference layer B1/the first junction layer 11/the first magnetic layer 2a1/the first non-magnetic coupling layer 2b1/the second magnetic layer 2a2/the second junction layer 12/the third magnetic layer 3a1/the second non-magnetic coupling layer 3b1/the magnetic coupling layer 3a2/the third non-magnetic coupling layer 3b2/the fourth magnetic layer 3a3/the third junction layer 13/the upper electrode E2 adjacently disposed in this order. The first magnetic layer 2a1/the first non-magnetic coupling layer 2b1/the second magnetic layer 2a2/the second junction layer 12/the third magnetic layer 3a1/the second non-magnetic coupling layer 3b1/the magnetic coupling layer 3a2/the third non-magnetic coupling layer 3b2/the fourth magnetic layer 3a3 constitute the first recording layer A1, and the first reference layer B1 and the first magnetic layer 2a1 are magnetically tunnel-junctioned by the first junction layer 11. In addition, the first magnetic layer 2a1/the first non-magnetic coupling layer 2b1/the second magnetic layer 2a2 constitute the first divided recording layer 2, and the third magnetic layer 3a1/the second non-magnetic coupling layer 3b1/the magnetic coupling layer 3a2/the third non-magnetic coupling layer 3b2/the fourth magnetic layer 3a3 constitute the second divided recording layer 3.

Details of Embodiment 8 are the same as those of Embodiments 4 and 5.

(Modified Example 1)

Modified Example 1 of the first divided recording layer 2 in Embodiment 3 and the like of the present invention will be described.

In Embodiment 3 (FIG. 3), the second magnetic layer 2a2 constitutes a part of the first divided recording layer 2 and desirably contains at least a 3d ferromagnetic transition metal such as Co, Fe, or Ni and more desirably contains at least Co so that it is formed of a material that increases the magnetoresistance ratio due to the magnetic tunnel junction in the first junction layer 11, which is the tunnel barrier layer, together with the first magnetic layer 2a1. That is, it is desirable to increase the Co/Fe ratio or the like.

However, as will be described below with reference to FIG. 33 and FIG. 34, it is found that, in the first magnetic layer 2a1 and the second magnetic layer 2a2 in which the first divided recording layer 2 is further divided, regarding the increase in the magnetoresistance ratio due to the magnetic tunnel junction in the first junction layer 11, the contribution of the second magnetic layer 2a2 is relatively small as compared with the first magnetic layer 2a1.

On the other hand, the second divided recording layer 3 desirably contains at least a 3d ferromagnetic transition metal such as Co, Fe, or Ni, and more desirably contains at least Fe so that it is formed of a material that increases the effective magnetic anisotropy energy density $K_{eff}t^*$. That is, it is desirable to reduce the Co/Fe ratio.

Here, it is found that, when the second magnetic layer 2a2 of the first divided recording layer 2 contains at least Fe so that is if formed of a material that increases the effective magnetic anisotropy energy density $K_{eff}t^*$ and the Co/Fe ratio is reduced, the effective magnetic anisotropy energy density $K_{eff}t^*$ of the entire element is further increased with no influence on the magnetoresistance ratio.

Figure 33:
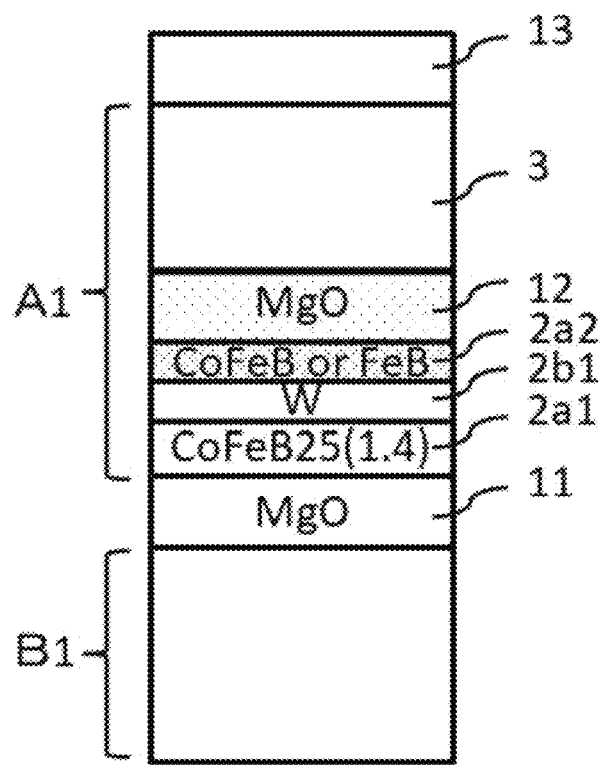
FIG. 33 shows a configuration of a film used for evaluating the relationship between a second junction layer and an effective magnetic anisotropy energy density $K_{eff}t^*$ when a second magnetic layer is formed of FeB or CoFeB.

The configuration of the element used for such evaluation is shown in FIG. 33.

The first magnetic layer 2a1 of the first divided recording layer 2 is formed of CoFeB25 (1.4 nm), and the material and the film thickness of the second magnetic layer 2a2 are set as FeB (0.9 nm) or CoFeB (1.0 nm), and the dependence of the effective magnetic anisotropy energy density $K_{eff}t^*$ on the film thickness of the second junction layer 12 is evaluated. The resistance area product RA is 5 $\Omega\mu m^2$.

Figure 34:
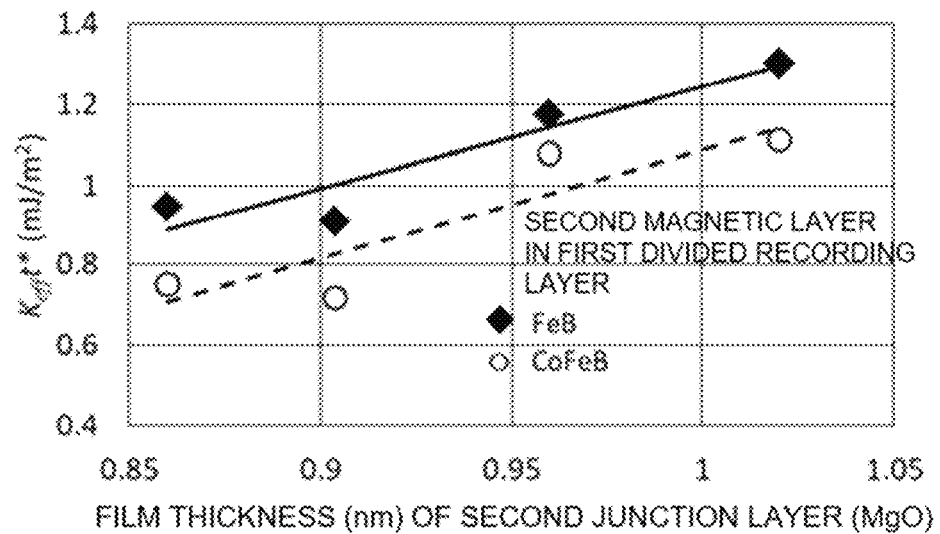
FIG. 34 is a graph showing the relationship between a second junction layer and an effective magnetic anisotropy energy density $K_{eff}t^*$ when a second magnetic layer is formed of FeB or CoFeB.

The configurations and evaluation results of the samples are shown in Table 10 and FIG. 34.

TABLE 10

| Sample No. | Second junction layer (nm) | Second magnetic layer in first divided recording layer | $K_{eff}t^*$ (mJ/m²) |
|---|---|---|---|
| 10-1 | 0.86 | FeB | 0.95 |
| 10-2 | 0.90 | FeB | 0.91 |
| 10-3 | 0.96 | FeB | 1.17 |
| 10-4 | 1.02 | FeB | 1.30 |
| 10-5 | 0.86 | CoFeB | 0.75 |
| 10-6 | 0.90 | CoFeB | 0.72 |
| 10-7 | 0.96 | CoFeB | 1.08 |
| 10-8 | 1.02 | CoFeB | 1.11 |

It is found in FIG. 34 that, when the second magnetic layer 2a2 of the first divided recording layer 2 is formed of FeB free of Co from CoFeB, the effective magnetic anisotropy energy density $K_{eff}t^*$ is further increased. Here, it is confirmed that, in the sample No. 10-1 to sample No. 10-8, the magnetoresistance ratio is in a range of 140% to 160%, and the high magnetoresistance ratio is maintained.

As described above, in the configuration in Modified Example 1 of Embodiment 3 and the like including the first divided recording layer 2, that is, in the configuration in which the Co/Fe ratio of the first magnetic layer 2a1 of the first divided recording layer 2 is larger than the Co/Fe ratio of the second magnetic layer 2a2 in the first divided recording layer 2, and the third magnetic layer 3a1, the magnetic coupling layer 3a2 and the fourth magnetic layer 3a3 in the second divided recording layer 3, it is possible to provide a magnetoresistance effect element in which a both high magnetoresistance ratio and a high effective magnetic anisotropy energy density $K_{eff}t^*$ are achieved while the resistance area product RA is reduced.

Embodiment 9

Figure 9:
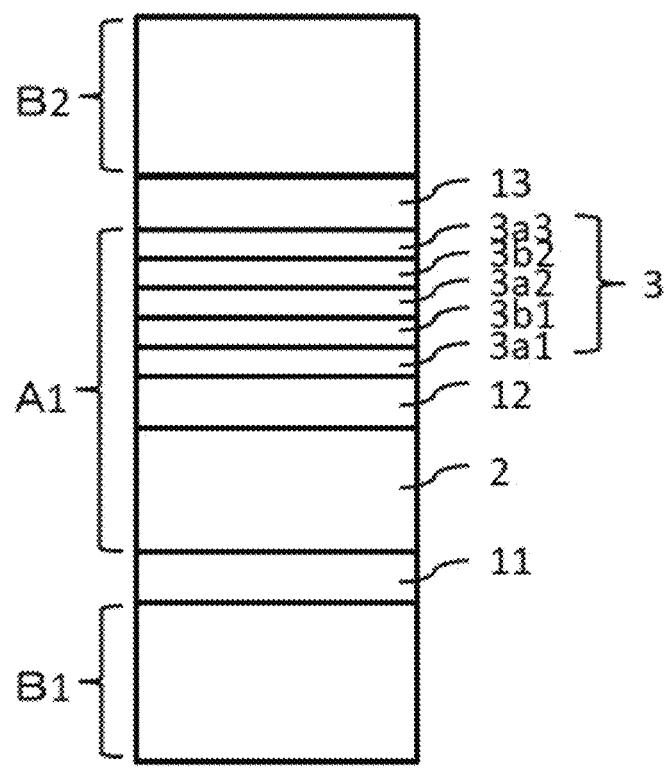
FIG. 9 shows a vertical cross-sectional view of another example of the configuration of the magnetoresistance effect element of the present invention.

FIG. 9 shows a basic configuration of Embodiment 9 of the present invention. The basic configuration of the magnetoresistance effect element includes the first reference layer B1/the first junction layer 11/the first divided recording layer 2/the second junction layer 12/the third magnetic layer 3a1/the second non-magnetic coupling layer 3b1/the magnetic coupling layer 3a2/the third non-magnetic coupling layer 3b2/the fourth magnetic layer 3a3/the third junction layer 13/the second reference layer B2 adjacently disposed in this order. The first divided recording layer 2/the second junction layer 12/the third magnetic layer 3a1/the second non-magnetic coupling layer 3b1/the magnetic coupling layer 3a2/the third non-magnetic coupling layer 3b2/the fourth magnetic layer 3a3 constitute the first recording layer A1, the first reference layer B1 and the first divided recording layer 2 are magnetically tunnel-junctioned by the first junction layer 11, and the fourth magnetic layer 3a3 and the second reference layer B2 are tunnel-junctioned by the third junction layer 13. In addition, the third magnetic layer 3a1/the second non-magnetic coupling layer 3b1/the magnetic coupling layer 3a2/the third non-magnetic coupling layer 3b2/the fourth magnetic layer 3a3 constitute the second divided recording layer 3.

When the magnetoresistance effect element is connected to a magnetic memory cell, it has a lower electrode layer provided on the side opposite to the first junction layer 11 of the first reference layer B1 and an upper electrode layer provided on the side opposite to the third junction layer 13 of the second reference layer B2.

Embodiment 9 is the same as Embodiment 2 except that it has the following characteristics.

The second reference layer B2 is a ferromagnetic layer which is disposed adjacent to the opposite side of the third junction layer 13 to the first recording layer A1 and in which the magnetization direction is fixed. The magnetization direction is desirably a direction perpendicular to a film surface.

The second reference layer B2 includes a ferromagnetic component containing at least one of Co, Fe, and Ni, and more preferably contains at least one of 3d ferromagnetic transition metal elements, and specifically, Co, Fe, Ni, CoFe, FeNi, CoNi, CoB, FeB, NiB, CoFeB, FePt, TbTeCo, MnAl, MnGa, and the like may be exemplified. Non-magnetic elements such as W, Ta, Hf, Zr, Nb, Mo, Ti, V, Cr, Si, Al, B, Pd, and Pt may be further contained.

In addition, a thin non-magnetic coupling layer may be inserted between ferromagnetic components of the second reference layer B2. Examples of materials of the non-magnetic coupling layer include Ta, W, Hf, Zr, Nb, Mo, Ti, Mg, and MgO.

The second reference layer B2 may be a single layer, laminated or multi-layered, and may have a laminated or thin-layer ferri structure with Pt, Ru, Ir, Rh, W, Ni, or the like or may have a laminated or thin-layer ferri structure with Pt, Ru, Ir, Rh, W, Ni, or the like.

In addition, a fixing layer or the like may be adjacent to the opposite side of the second reference layer B2 to the third junction layer 13.

In Embodiment 9, the third junction layer 13 is a tunnel barrier layer in which a material containing oxygen (O) is used. At least O and Mg are preferably contained so that preferably the combination of materials the third junction layer 13 interposed between the second reference layer B2 and the fourth magnetic layer 3a3 causes a large magnetoresistance change rate to be exhibited. In addition to MgO, oxygen-containing insulators such as $Al_2O_3$, $MgAl_2O_4$, $SiO_2$, TiO, and $Hf_2O$ may be used, and these insulators may contain a small amount of other elements. Among the elements combined as described above, the content of some elements may be a very small amount, and additives and the like used for improving characteristics of the material may be further contained.

In addition, for the third junction layer 13, it is more desirable to select an oxygen-containing material so that interfacial magnetic anisotropy is generated in the fourth magnetic layer 3a3 at an interface with the fourth magnetic layer 3a3, and MgO is more desirable in this respect.

The film thickness of the third junction layer 13 is preferably 0.5 nm or more and more preferably 0.8 nm or more in order to increase the magnetoresistance ratio.

In Embodiment 9, the third magnetic layer 3a1 in the second divided recording layer 3 is a ferromagnetic layer in which the magnetization direction can be reversed. The magnetization direction is desirably a direction perpendicular to a film surface.

The third magnetic layer 3a1 desirably contains at least a 3d ferromagnetic transition metal such as Co, Fe, or Ni, and more desirably contains at least Fe. Specific examples include Co, Fe, Ni, CoFe, FeNi, CoNi, CoB, FeB, NiB, CoFeB, FePt, TbTeCo, MnAl, MnGa, and the like, and among these, Fe, CoFe, FeB, CoFeB, and FePt are more desirable.

In addition, for the third magnetic layer 3al, a material having interfacial magnetic anisotropy in a direction perpendicular to a film surface at an interface with the second junction layer 12 is more desirable, and Fe, CoFe, FeB, and CoFeB are more desirable.

In addition, the third magnetic layer 3a1 may further contain a non-magnetic element such as W, Ta, Hf, Zr, Nb, Mo, Ti, V, Cr, Si, Al, B, Pd, Pt or the like. Among these, B and V are preferable in consideration of ease of handling.

In Embodiment 9, the fourth magnetic layer 3a3 in the second divided recording layer 3 is a ferromagnetic layer in which the magnetization direction can be reversed. The magnetization direction is desirably a direction perpendicular to a film surface.

The fourth magnetic layer 3a3 is not particularly limited as long as it is formed of a material having a large magnetoresistance ratio due to the magnetic tunnel junction in the third junction layer 13 interposed between it and the second reference layer B2, and desirably contains at least a 3d ferromagnetic transition metal such as Co, Fe, or Ni, and more desirably contains at least Co. Specific examples include Co, Fe, Ni, CoFe, FeNi, CoNi, CoB, FeB, NiB, CoFeB, FePt, TbTeCo, MnAl, MnGa, and the like, and among these, Co, CoFe, CoNi, CoB, and CoFeB are more desirable.

In addition, for the fourth magnetic layer 3a3, a material that increases the magnetoresistance ratio at an interface with the third junction layer 13 is more desirable, and Co, CoFe, CoNi, CoB, and CoFeB are more desirable.

In addition, the fourth magnetic layer 3a3 may further contain a non-magnetic element such as W, Ta, Hf, Zr, Nb, Mo, Ti, V, Cr, Si, Al, B, Pd, Pt or the like. Among these, B and V are preferable in consideration of ease of handling.

The Co/Fe ratio of the fourth magnetic layer 3a3 is desirably larger than the Co/Fe ratio of the third magnetic layer 3al. This is because the entire element allows both a high effective magnetic anisotropy energy density $K_{eff}t^*$ and a high magnetoresistance ratio to be achieved.

The Co/Fe ratio of the third magnetic layer 3a1 is preferably 0.11 or less and more preferably 0.07 or less. This is to increase the effective magnetic anisotropy energy density $K_{eff}t^*$.

In order to increase the magnetoresistance ratio, the Co/Fe ratio of the fourth magnetic layer 3a3 is preferably 0.05 or more, and more preferably 0.09 or more. On the other hand, in order to match the crystallinity of the fourth magnetic layer 3a3 with the crystallinity of the third junction layer 13 such as MgO whose crystal structure is bcc, when the fourth magnetic layer 3a3 is formed of CoFeB, preferably, Co:Fe does not exceed 75:25, that is, the Co/Fe ratio is 3 or less.

In addition, the B concentration of the fourth magnetic layer 3a3 is desirably lower than the B concentration of the third magnetic layer 3a1. Specifically, the B concentration of the fourth magnetic layer 3a3 is desirably 20 at. % or more and 35 at. % or less, more desirably 20 at. % or more and 30 at. % or less, and still more desirably 21.9 at. % or more and 30 at. % or less.

The total film thickness of the third magnetic layer 3a1, the magnetic coupling layer 3a2 and the fourth magnetic layer 3a3 is preferably in a range of 1.6 nm to 3.0 nm and more preferably in a range of 2.0 nm to 2.6 nm. This is because, even if the film thickness is thinner or even if the film thickness is thicker, when MgO or the like is used for the second junction layer 12 and the third junction layer 13, sufficient perpendicular magnetic anisotropy cannot be obtained for the second divided recording layer 3.

Embodiment 10

Figure 10:
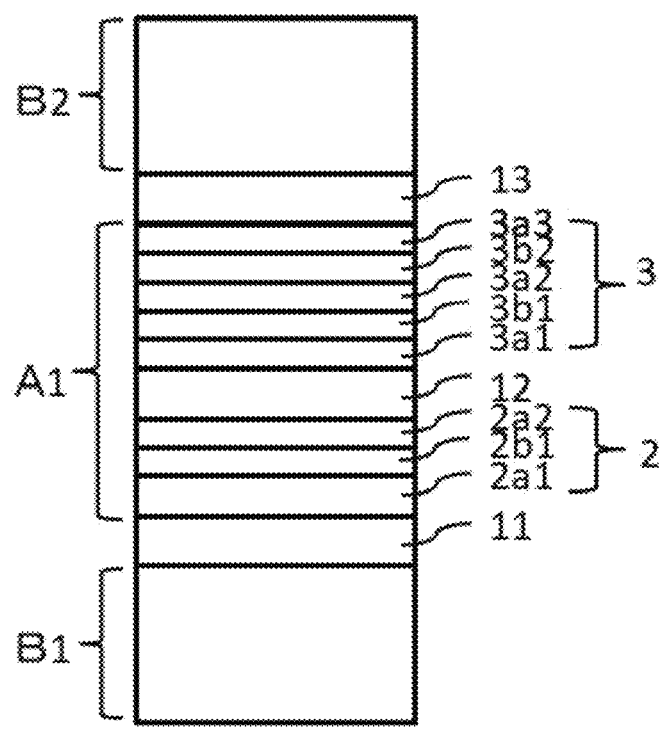
FIG. 10 shows a vertical cross-sectional view of another example of the configuration of the magnetoresistance effect element of the present invention.

FIG. 10 shows a basic configuration of Embodiment 10 of the present invention. The basic configuration of the magnetoresistance effect element includes the first reference layer B1/the first junction layer 11/the first magnetic layer 2a1/the first non-magnetic coupling layer 2b1/the second magnetic layer 2a2/the second junction layer 12/the third magnetic layer 3a1/the second non-magnetic coupling layer 3b1/the magnetic coupling layer 3a2/the third non-magnetic coupling layer 3b2/the fourth magnetic layer 3a3/the third junction layer 13/the second reference layer B2 adjacently disposed in this order. The first magnetic layer 2a1/the first non-magnetic coupling layer 2b1/the second magnetic layer 2a2/the second junction layer 12/the third magnetic layer 3a1/the second non-magnetic coupling layer 3b1/the magnetic coupling layer 3a2/the third non-magnetic coupling layer 3b2/the fourth magnetic layer 3a3 constitute the first recording layer A1, the first reference layer B1 and the first magnetic layer 2a1 are magnetically tunnel-junctioned by the first junction layer 11, and the fourth magnetic layer 3a3 and the second reference layer B2 are tunnel-junctioned by the third junction layer 13. In addition, the first magnetic layer 2a1/the first non-magnetic coupling layer 2b1/the second magnetic layer 2a2 constitute the first divided recording layer 2, and the third magnetic layer 3a1/the second non-magnetic coupling layer 3b1/the magnetic coupling layer 3a2/the third non-magnetic coupling layer 3b2/the fourth magnetic layer 3a3 constitute the second divided recording layer 3.

When the magnetoresistance effect element is connected to a magnetic memory cell, it has a lower electrode layer provided on the side opposite to the first junction layer 11 of the first reference layer B1 and an upper electrode layer provided on the side opposite to the third junction layer 13 of the second reference layer B2.

Embodiment 10 is the same as Embodiment 9 except that it has the following characteristics.

In Embodiment 10, the first magnetic layer 2a1 is a ferromagnetic layer in which the magnetization direction can be reversed. The magnetization direction is desirably a direction perpendicular to a film surface.

The first magnetic layer 2a1 is not particularly limited as long as it is formed of a material having a large magnetoresistance ratio due to the magnetic tunnel junction in the first junction layer interposed between it and the first reference layer B1, and 11 desirably contains at least a 3d ferromagnetic transition metal such as Co, Fe, or Ni and more desirably contains at least Co. Specific examples include Co, Fe, Ni, CoFe, FeNi, CoNi, CoB, FeB, NiB, CoFeB, FePt, TbTeCo, MnAl, MnGa, and the like, and among these, Co, CoFe, CoNi, CoB, and CoFeB are more desirable.

In addition, for the first magnetic layer 2a1, a material having interfacial magnetic anisotropy in a direction perpendicular to a film surface at an interface with the first junction layer 11 is more desirable, and CoFe and CoFeB are more desirable.

In addition, the first magnetic layer 2a1 may further contain a non-magnetic element such as W, Ta, Hf, Zr, Nb, Mo, Ti, V, Cr, Si, Al, B, Pd, Pt or the like. Among these, B and V are preferable in consideration of ease of handling.

In Embodiment 10, the second magnetic layer 2a2 is a ferromagnetic layer in which the magnetization direction can be reversed. The magnetization direction is desirably a direction perpendicular to a film surface.

The second magnetic layer 2a2 desirably contains at least a 3d ferromagnetic transition metal such as Co, Fe, or Ni, and more desirably contains at least Fe. Specific examples include Co, Fe, Ni, CoFe, FeNi, CoNi, CoB, FeB, NiB, CoFeB, FePt, TbTeCo, MnAl, MnGa, and the like, and among these, Fe, CoFe, FeB, CoFeB, and FePt are more desirable.

In addition, for the second magnetic layer 2a2, a material having interfacial magnetic anisotropy in a direction perpendicular to a film surface at an interface with the second junction layer 12 is more desirable, and Fe, CoFe, FeB, and CoFeB are still more desirable.

In addition, the second magnetic layer 2a2 may further contain a non-magnetic element such as W, Ta, Hf, Zr, Nb, Mo, Ti, V, Cr, Si, Al, B, Pd, Pt or the like. Among these, B and V are preferable in consideration of ease of handling.

The Co/Fe ratio of the first magnetic layer 2a1 is desirably larger than the Co/Fe ratio of the second magnetic layer 2a2 in order to increase the magnetoresistance ratio. This is because the entire element allows both a high effective magnetic anisotropy energy density $K_{eff}t^*$ and a high magnetoresistance ratio to be achieved.

The Co/Fe ratio of the second magnetic layer 2a2 is preferably 0.11 or less, and more preferably 0.07 or less. This is to increase the effective magnetic anisotropy energy density $K_{eff}t^*$.

The Co/Fe ratio of the first magnetic layer 2a1 is preferably 0.05 or more, and more preferably 0.09 or more. On the other hand, in order to match the crystallinity of the first magnetic layer 2a1 with the crystallinity of the first junction layer 11 such as MgO whose crystal structure is bcc, when the first magnetic layer 2a1 is formed of CoFeB, preferably, Co:Fe does not exceed 75:25, that is, the Co/Fe ratio is 3 or less.

In addition, the B concentration of the first magnetic layer 2a1 is desirably lower than the B concentration of the second magnetic layer 2a2. Specifically, the B concentration of the first magnetic layer 2a1 is desirably 20 at. % or more and 35 at. % or less, more desirably 20 at. % or more and 30 at. % or less, and still more desirably 21.9 at. % or more and 30 at. % or less.

The total film thickness of the first magnetic layer 2a1 and the second magnetic layer 2a2 is preferably in a range of 1.6 nm to 3.0 nm, and more preferably in a range of 2.0 nm to 2.6 nm. This is because, even if the film thickness is thinner or even if the film thickness is thicker, when MgO or the like is used for the first junction layer 11 and the second junction layer 12, sufficient perpendicular magnetic anisotropy cannot be obtained for the first divided recording layer 2.

-Co/Fe Ratio of Each Magnetic Layer in Element Having Two Reference Layers-

As described above, the element of Embodiment 10 shown in FIG. 10 has a configuration in which the Co/Fe ratio of the first magnetic layer 2a1 and the fourth magnetic layer 3a3 is larger than the Co/Fe ratio of the second magnetic layer 2a2 and the third magnetic layer 3a1.

Figure 35:
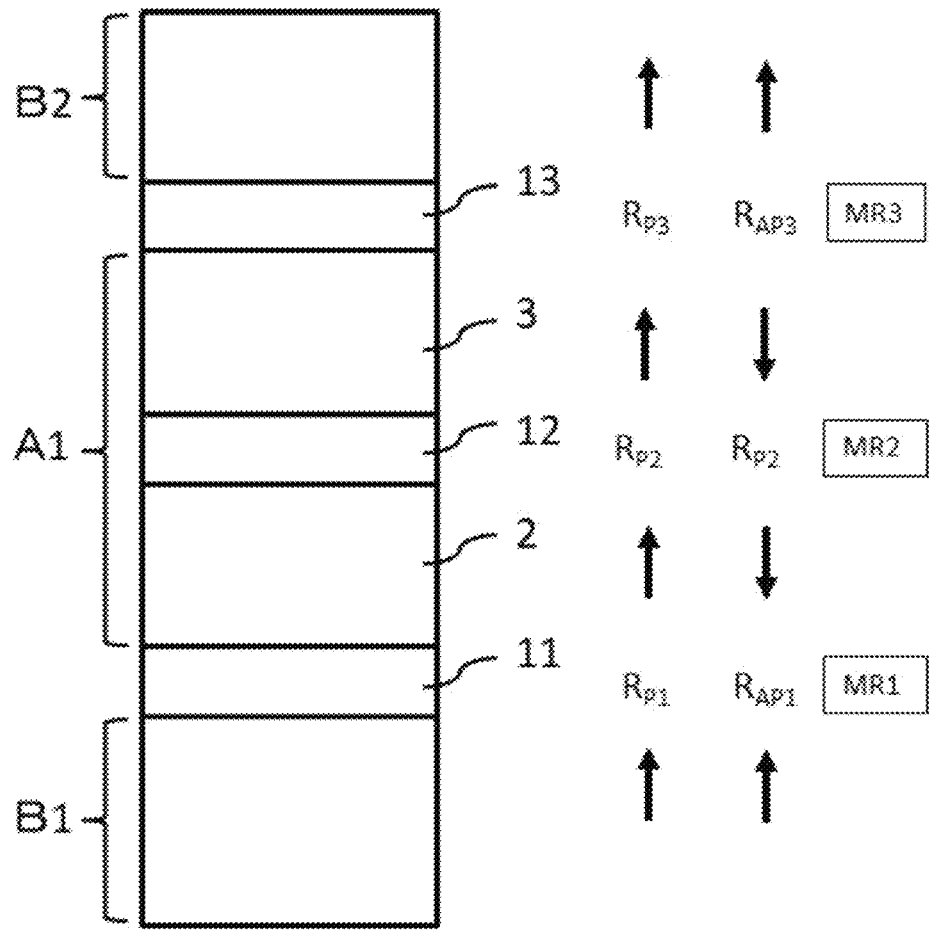
FIG. 35 is a diagram explaining a magnetoresistance ratio in a configuration of another example of the magnetoresistance effect element of the present invention.

The magnetoresistance ratio in the configuration of Embodiment 10 will be described with reference to FIG. 35. MR1 indicates a magnetoresistance ratio in the first junction layer 11, MR2 indicates a magnetoresistance ratio in the second junction layer 12, and MR3 indicates a magnetoresistance ratio in the third junction layer 13. In the first junction layer 11, $R_{P1}$ indicates a resistance when magnetization directions of the first reference layer B1 and the first divided recording layer 2 are parallel, and $R_{AP1}$ indicates a resistance when magnetization directions of the first reference layer B1 and the first divided recording layer 2 are antiparallel. In addition, in the second junction layer 12, $R_{P2}$ indicates a resistance when magnetization directions of the first divided recording layer 2 and the second divided recording layer 3 are parallel. In addition, in the third junction layer 13, $R_{P3}$ indicates a resistance when magnetization directions of the second divided recording layer 3 and the second reference layer B2 are parallel, and $R_{AP3}$ indicates a resistance when magnetization directions of the second divided recording layer 3 and the second reference layer B2 are antiparallel.

The magnetoresistance ratio MR of the entire element is represented by the following formula in Math. 5.

[Math. 5]

$$MR = \frac{(R_{AP1} + R_{P2} + R_{AP3}) - (R_{P1} + R_{P2} + R_{P3})}{R_{P1} + R_{P2} + R_{P3}}$$

$$= \frac{R_{AP1} - R_{P1} + R_{AP3} - R_{P3}}{R_{P1} + R_{P2} + R_{P3}}$$

$$= \frac{MR1 \times R_{P1} + MR3 \times R_{P3}}{R_{P1} + R_{P2} + R_{P3}} \left( \begin{array}{l} \therefore MR1 = \dfrac{R_{AP1} - R_{P1}}{R_{P1}}, \ MR1 \times R_{P1} = R_{AP1} - R_{P1} \\ MR3 = \dfrac{R_{AP3} - R_{P3}}{R_{P3}}, \ MR3 \times R_{P3} = R_{AP3} - R_{P3} \end{array} \right)$$

$$= \frac{MR1 \times R_{P1}A + MR3 \times R_{P3}A}{R_{P1}A + R_{P2}A + R_{P3}A}$$

$$= \frac{MR1 \times R_{P1}A + MR3 \times R_{P3}A}{RA} (\therefore RA = R_{P1}A + R_{P2}A + R_{P3}A)$$

Here, A indicates an element size (area), and each RA indicates a resistance area product in each layer.

As derived in the formula in Math. 5, MR, which is the magnetoresistance ratio of the entire element, does not include the term of MR2, which is the magnetoresistance ratio in the second junction layer 12. That is, the second junction layer 12 does not contribute to MR of the entire element. The reason for this is expressed by MR2=($R_{AP2}$−$R_{P2}$)/$R_{P2}$, but it is assumed that magnetization directions of the first divided recording layer 2 and the second divided recording layer 3 are always parallel, and thus the term of $R_{AP2}$ does not appear in the resistance.

One of the important points to realize such assumption is that magnetizations of the first divided recording layer 2 and the second divided recording layer 3 are ferromagnetically (magnetically) coupled.

It can be clearly understood in the formula in Math. 5 that the magnetoresistance ratio MR of the entire element depends on the magnetoresistance ratio MR1 in the first junction layer 11 and the magnetoresistance ratio MR3 in the third junction layer 13 but does not depend on the magnetoresistance ratio MR2 in the second junction layer 12. In addition, it is understood in the formula in Math. 5 that, in order to increase the magnetoresistance ratio MR of the entire element, the magnetoresistance MR1 ratio and the magnetoresistance ratio MR3 may be maximized and the resistance area product $R_{P2}$A in the second junction layer 12 may be made as small as possible.

That is, it is inferred that the magnetoresistance ratio MR of the entire element can be increased when the material of the first magnetic layer 2a1 within the first divided recording layer 2 is examined so that the magnetoresistance ratio MR1 is maximized and the material of the fourth magnetic layer 3a3 is examined so that the magnetoresistance ratio MR3 is maximized, and when the film thickness of the second junction layer 12 is reduced so that the resistance area product $R_{P2}$A in the second junction layer 12 is made as small as possible.

Then, the magnetoresistance ratio can be adjusted by the Co/Fe ratio of the layer based on the above examination in FIG. 20 and FIG. 21. At the same time, the effective magnetic anisotropy energy density $K_{eff}t^*$ can also be adjusted by the Co/Fe ratio of the layer based on the above examination in FIG. 19, FIG. 33 and FIG. 34. That is, also in the configuration exemplified in Embodiment 10, it is possible to provide a magnetoresistance effect element in which both a high magnetoresistance ratio and a high effective magnetic anisotropy energy density $K_{eff}t^*$ are achieved.

Embodiment 11

Figure 11:
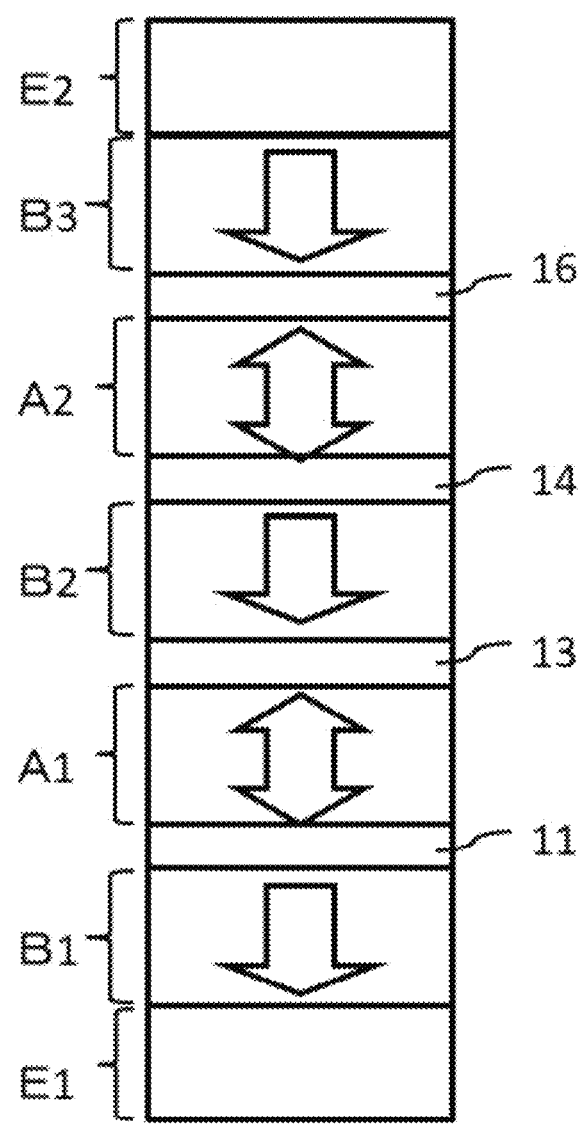
FIG. 11 shows a vertical cross-sectional view of another example of the configuration of the magnetoresistance effect element of the present invention.

FIG. 11 shows a basic configuration of Embodiment 11 of the present invention. The basic configuration of the magnetoresistance effect element includes the lower electrode E1/the first reference layer B1/the first junction layer 11/the first recording layer A1/the third junction layer 13/the second reference layer B2/a non-magnetic junction layer 14/a second recording layer A2/a non-magnetic junction layer 16/a third reference layer B3/the upper electrode E2 adjacently disposed in this order.

Embodiment 11 is the same as Embodiment 9 and Embodiment 10 except that it has the following characteristics.

The first recording layer A1 and the second recording layer A2 can have the configuration of the recording layer described in Embodiment 9 and Embodiment 10. The first reference layer B1, the second reference layer B2 and the third reference layer B3 can have the configuration of the reference layer described in Embodiment 9.

Embodiment 12

Figure 12:
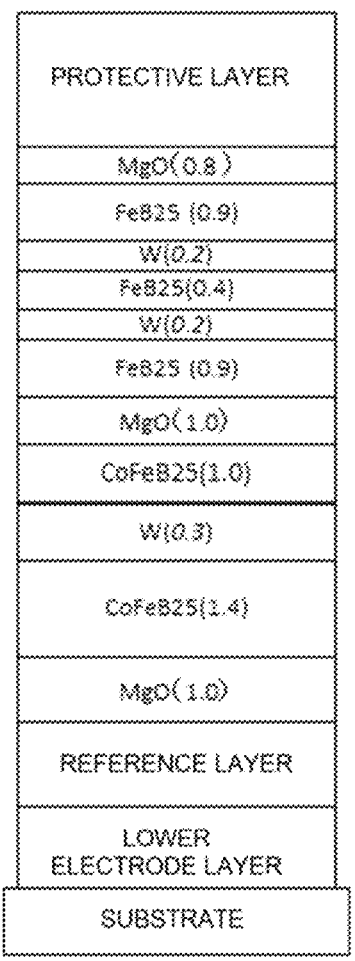
FIG. 12 shows a vertical cross-sectional view of another example of the configuration of the magnetoresistance effect element of the present invention.

FIG. 12 shows a configuration of Embodiment 12 of the present invention. The configuration of the magnetoresistance effect element includes a substrate/lower electrode/a reference layer/MgO (1.0 nm)/CoFeB25 (1.4 nm)/W (0.3 nm)/CoFeB25 (1.0 nm)/MgO (1.0 nm)/FeB25 (0.9 nm)/W (0.2 nm)/FeB25 (0.4 nm)/W (0.2 nm)/FeB25 (0.9 nm)/MgO (0.8 nm)/a protective layer adjacently disposed in this order.

Embodiment 13

Figure 13:
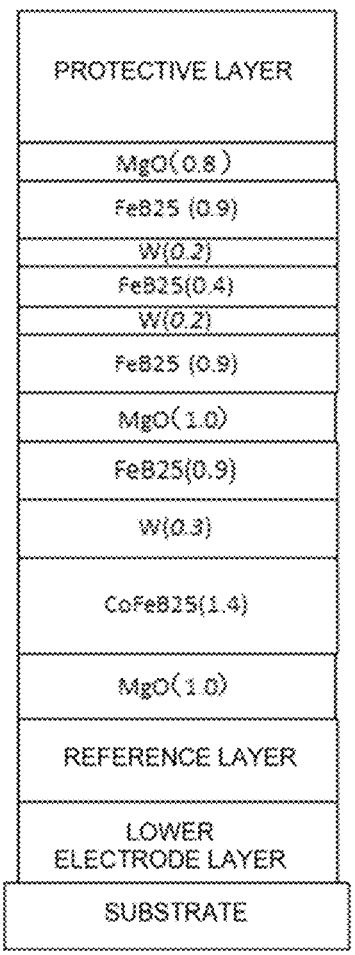
FIG. 13 shows a vertical cross-sectional view of another example of the configuration of the magnetoresistance effect element of the present invention.

FIG. 13 shows a configuration of Embodiment 13 of the present invention. The configuration of the magnetoresistance effect element includes a substrate/a lower electrode/a reference layer/MgO (1.0 nm)/CoFeB25 (1.4 nm)/W (0.3 nm)/FeB25 (0.9 nm)/MgO (1.0 nm)/FeB25 (0.9 nm)/W (0.2 nm)/FeB25 (0.4 nm)/W (0.2 nm)/FeB25 (0.9 nm)/MgO (0.8 nm)/a protective layer adjacently disposed in this order.

Here, Embodiment 13 is a specific configuration of the modified examples of Embodiments 3, 4, 7, and 8.

Embodiment 14

Figure 14:
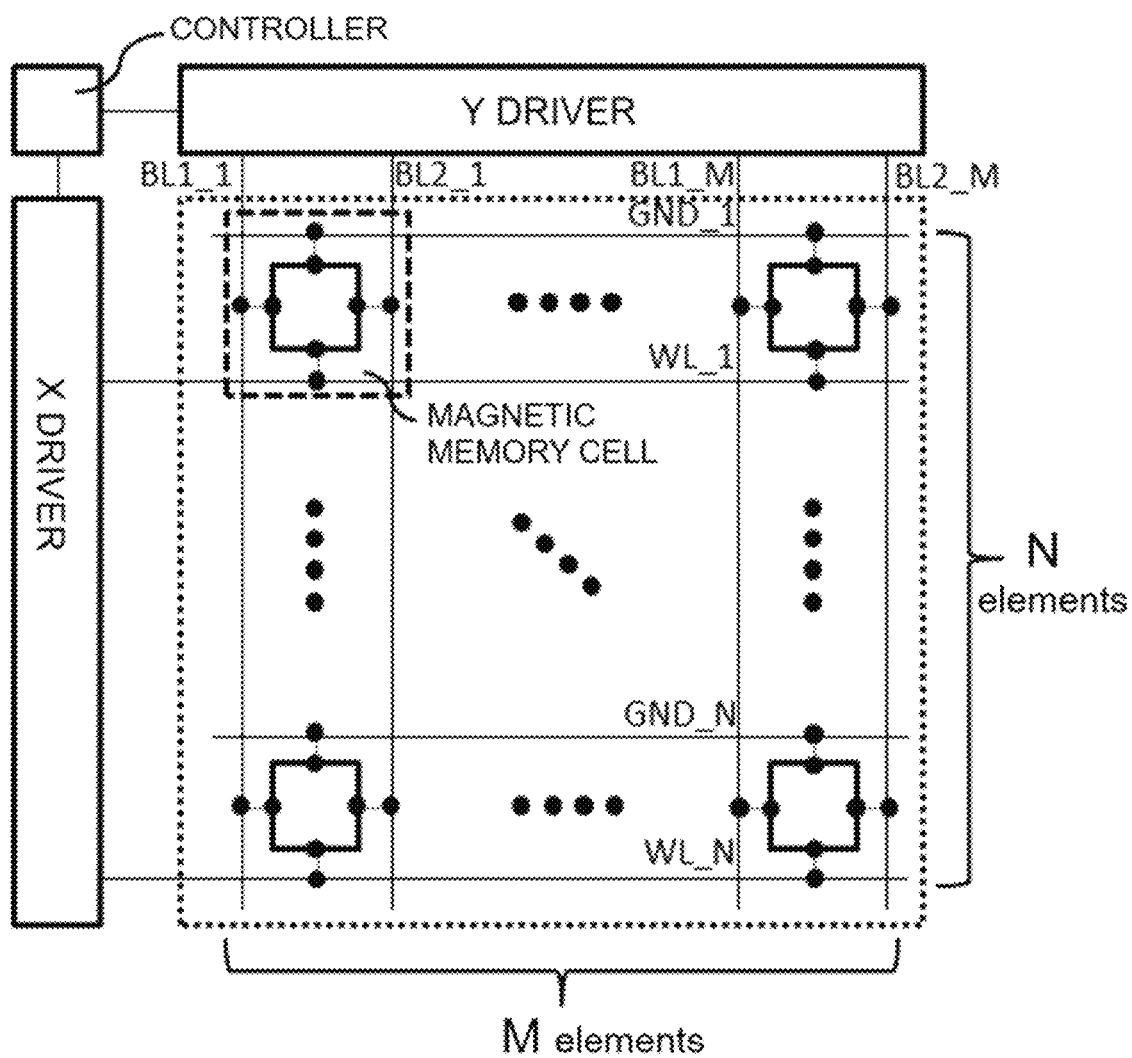
FIG. 14 is an example of a block diagram of a magnetic memory in which a plurality of magnetoresistance effect elements of the present invention are disposed.
Figure 15:
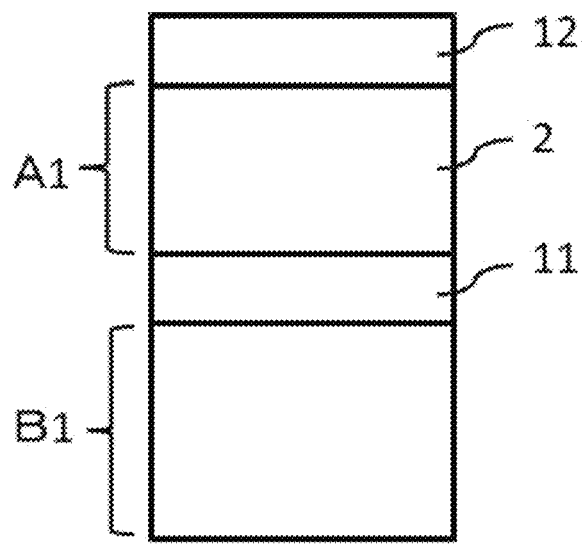
FIG. 15 is a vertical cross-sectional view of a configuration of a magnetoresistance effect element of prior art.

FIG. 14 shows an example of a magnetic memory including a plurality of magnetic memory cells having the configuration of Embodiments 1 to 13 as Embodiment 14.

The magnetic memory includes a memory cell array, an X driver, a Y driver, and a controller. The memory cell array includes magnetic memory cells disposed in an array form. The X driver is connected to a plurality of word lines (WL), the Y driver is connected to a plurality of bit lines (BL), and functions as a reading unit and a writing unit.

Embodiment 15

Figure 36A:
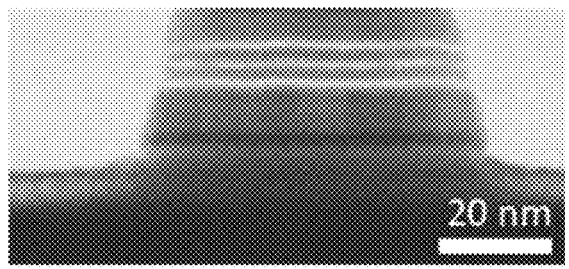
FIG. 36A shows a TEM image of the magnetoresistance effect element of the present invention.

FIG. 36A shows a TEM image of a cross section of an example of the magnetoresistance effect element of the present invention. Three streaks are observed in the TEM image, and it is found that it is possible to produce a magnetoresistance effect element having a so-called quadruple interface in which three junction layers, that is, the first junction layer 11, the second junction layer 12, and the third junction layer 13, are laminated on the recording layer.

Figure 36B:
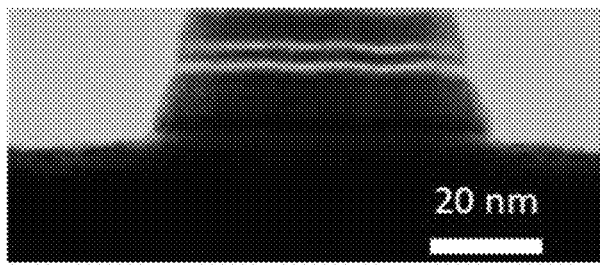
FIG. 36B shows a TEM image of a magnetoresistance effect element of prior art.

FIG. 36B shows a TEM image of a cross section of the magnetoresistance effect element of prior art. Two streaks are observed in the TEM image, and it is found that it is possible to produce a magnetoresistance effect element having a so-called double interface in which two junction layers are laminated on the recording layer.

Embodiment 16

In order to compare the magnetoresistance effect element of the present invention with the magnetoresistance effect element of prior art, an evaluation element is produced.

Figure 37A:
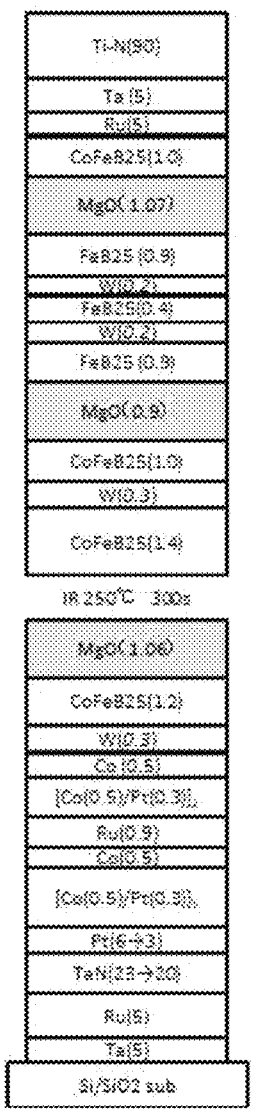
FIG. 37A shows a vertical cross-sectional view of another example of a configuration of the magnetoresistance effect element of the present invention.

FIG. 37A shows a vertical cross-sectional view of an evaluation element of the magnetoresistance effect element of the present invention. A Si/SiO$_2$ substrate, a reference layer, and a first junction layer (MgO, 1.06 nm) are laminated, and then heated with infrared (IR) at 250° C. for 300 seconds, and then CoFeB25 (1.4 nm)/W (0.3 nm)/CoFeB25 (1.0 nm)/MgO (0.9 nm)/FeB25 (0.9 nm)/W (0.2 nm)/FeB25 (0.4 nm)/W (0.2 nm)/FeB25 (0.9 nm)/MgO (1.07 nm)/CoFeB25 (1.0 nm)/Ru (5 nm)/Ta (5 nm)/Ti—N(90 nm) are then laminated in this order.

Figure 37B:
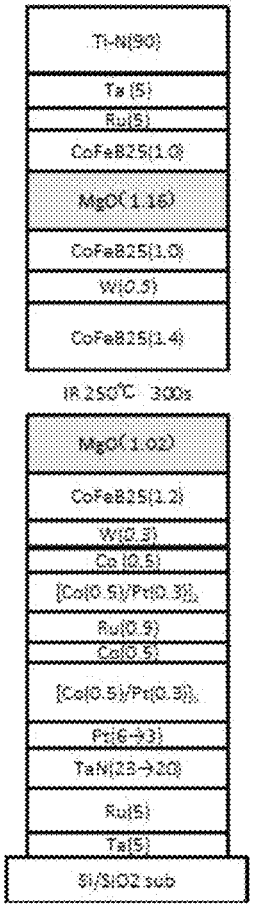
FIG. 37B shows a vertical cross-sectional view of an example of a configuration of a magnetoresistance effect element of prior art.

On the other hand, FIG. 37B shows a vertical cross-sectional view of an evaluation element of the magnetoresistance effect element of prior art. A Si/SiO$_2$ substrate, a reference layer, and a first junction layer (MgO, 1.02 nm) are laminated, and then heated with infrared (IR) at 250° C. for 300 seconds, and then CoFeB25 (1.4 nm)/W (0.5 nm)/CoFeB25 (1.0 nm)/MgO (1.16 nm)/CoFeB25 (1.0 nm)/Ru (5 nm)/Ta (5 nm)/Ti—N(90 nm) are then laminated in this order.

Three elements with an element size that is adjusted to be within about 50 nm to 100 nm are produced.

Figure 38:
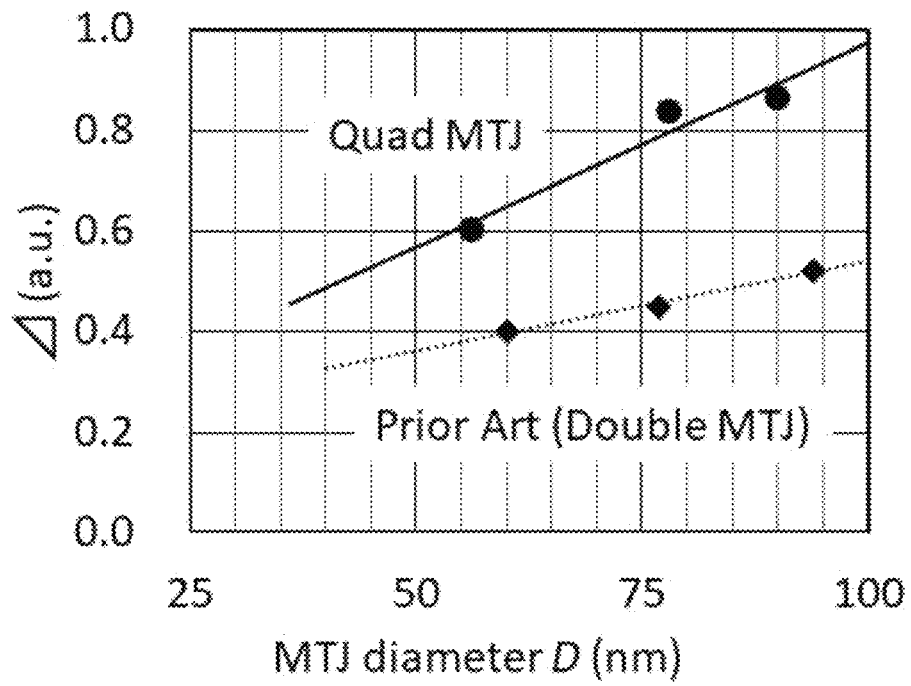
FIG. 38 is a graph in which the magnetoresistance effect element of the present invention and the magnetoresistance effect element of prior art are compared with respect to the thermal stability index Δ at each element size.

For the thermal stability index Δ at each element size, the magnetoresistance effect element of the present invention shown in FIG. 37A and the magnetoresistance effect element of prior art shown in FIG. 37B are compared. FIG. 38 shows the evaluation results.

Although the thermal stability index Δ depends on the element size, the thermal stability index Δ of the magnetoresistance effect element having a so-called quadruple interface of the present invention has a value that is about 1.5 to 2.0 times the thermal stability index Δ of the magnetoresistance effect element of prior art having a so-called double interface at any element size.

Figure 39:
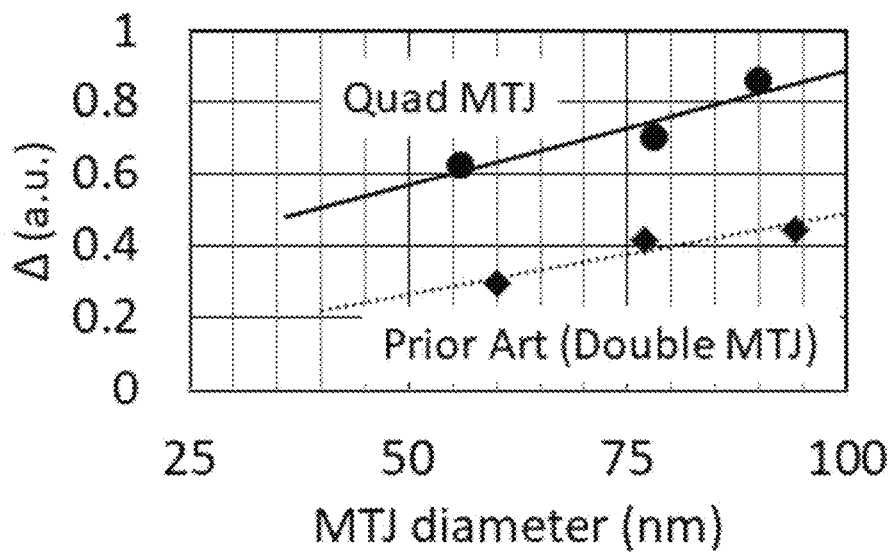
FIG. 39 is a graph in which the magnetoresistance effect element of the present invention and the magnetoresistance effect element of prior art are compared with respect to the thermal stability index Δ at each element size when maintained at 225° C.

In addition, for the thermal stability index Δ at each element size when maintained up to 225° C., the magnetoresistance effect element of the present invention shown in FIG. 37A and the magnetoresistance effect element of prior art shown in FIG. 37B are compared. FIG. 39 shows the evaluation results.

Similarly, although the thermal stability index Δ depends on the element size, the thermal stability index Δ of the magnetoresistance effect element having a so-called quadruple interface of the present invention has a value that is about 1.5 to 2.0 times the thermal stability index Δ of the magnetoresistance effect element of prior art having a so-called double interface at any element size.

Figure 40:
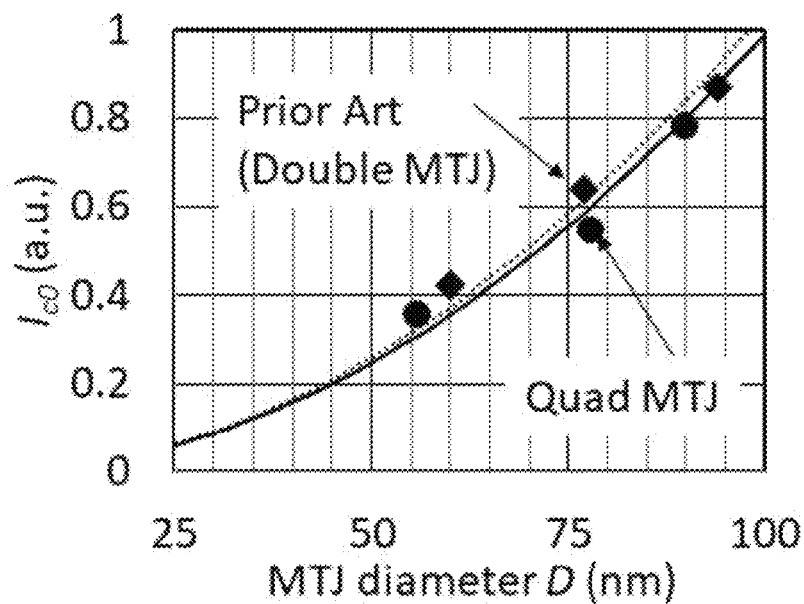
FIG. 40 is a graph in which the magnetoresistance effect element of the present invention and the magnetoresistance effect element of prior art are compared with respect to a write current $I_{C0}$ at each element size.

Next, for the write current $I_{C0}$ at each element size, the magnetoresistance effect element of the present invention shown in FIG. 37A and the magnetoresistance effect element of prior art shown in FIG. 37B are compared. FIG. 40 shows the evaluation results.

Although the write current $I_{C0}$ depends on the element size, there is no significant difference between the write current $I_{C0}$ of the magnetoresistance effect element having a so-called quadruple interface of the present invention and the write current $I_{C0}$ of the magnetoresistance effect element of prior art having a so-called double interface. That is, it is found that, even if the number of junction layers increases, the write current $I_{C0}$ does not increase.

Figure 41:
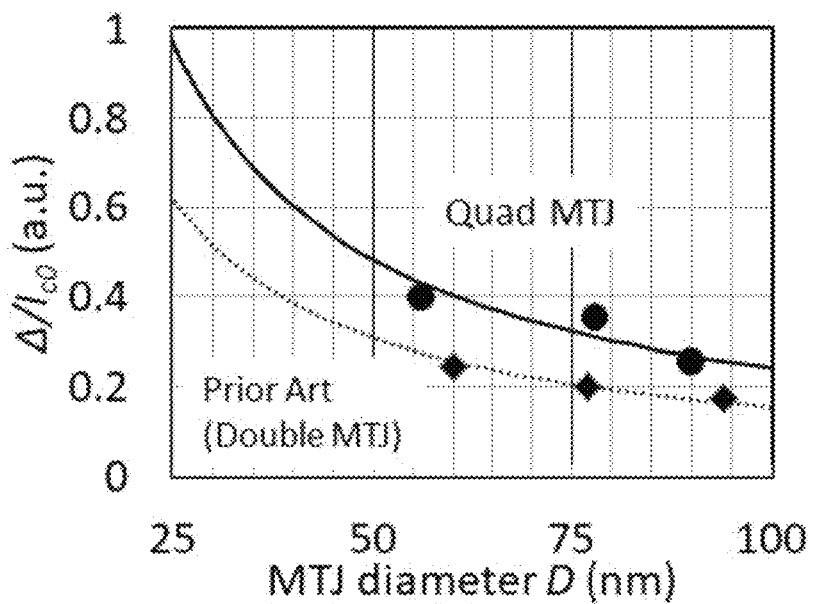
FIG. 41 is a graph in which the magnetoresistance effect element of the present invention and the magnetoresistance effect element of prior art are compared with respect to a performance index $(\Delta/I_{C0})$ at each element size.

The performance index $\Delta/I_{C0}$ is calculated based on the evaluation result of the thermal stability index Δ shown in FIG. 38 and the evaluation result of the write current $I_{C0}$ shown in FIG. 40, and FIG. 41 shows the relationship between the element size and the performance index $\Delta/I_{C0}$.

The performance index $\Delta/I_{C0}$ is obtained by dividing the thermal stability index Δ by the write current $I_{C0}$. Desirable performance of the element includes (1) a low recording current during recording, that is, a low $I_{C0}$, and (2) the recorded magnetic moment that is thermally stably maintained, that is, a large thermal stability index Δ. The index for measuring the performances (1) and (2) is $\Delta/I_{C0}$, and a larger index is desirable. When $I_{C0}$, which is the desirable performance (1), is smaller, this index is larger, and when the thermal stability index Δ, which is the desirable performance (2), is larger, this index is larger. This performance index $\Delta/I_{C0}$ is associated with a physical property value of the damping constant α, and used for evaluation as a useful index, and increasing the performance index $\Delta/I_{C0}$ is one of objectives of element development.

In FIG. 41, although the performance index $\Delta/I_{C0}$ depends on the element size, the performance index $\Delta/I_{C0}$ of the magnetoresistance effect element having a so-called quadruple interface of the present invention has a value that is about 1.5 to 2.0 times the performance index $\Delta/I_{C0}$ of the magnetoresistance effect element of prior art having a so-called double interface at any element size.

Embodiment 17

In order to compare the magnetoresistance effect element of the present invention with the magnetoresistance effect element of prior art according to the difference in configuration and processing, an evaluation element is produced.

Figures 42A, 42B, 42C, 42D, 42E:
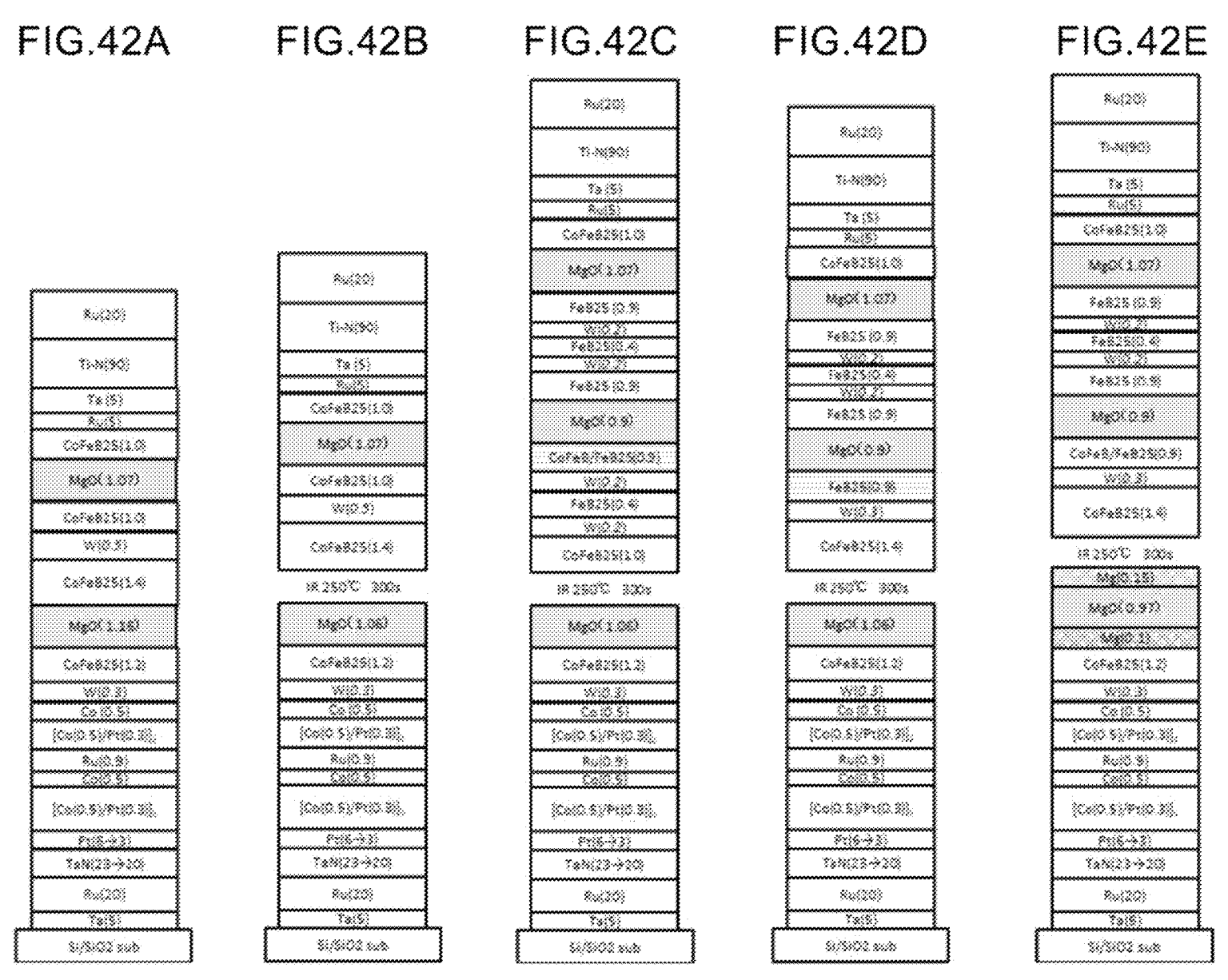

FIG. 42A shows a vertical cross-sectional view of an example of an evaluation element of the magnetoresistance effect element of prior art. A Si/SiO$_2$ substrate, a reference layer, a first junction layer (MgO, 1.16 nm), and CoFeB25 (1.4 nm)/W (0.5 nm)/CoFeB25 (1.0 nm)/MgO (1.07 nm)/CoFeB25 (1.0 nm)/Ru (5 nm)/Ta (5 nm)/Ti—N(90 nm)/Ru (20 nm) are laminated in this order to obtain a sample 11-1.

FIG. 42B shows a vertical cross-sectional view of an evaluation element of an example of the magnetoresistance effect element of prior art. A Si/SiO$_2$ substrate, a reference layer, and a first junction layer (MgO, 1.06 nm) are laminated and then heated with infrared (IR) at 250° C. for 300 seconds, and CoFeB25 (1.4 nm)/W (0.5 nm)/CoFeB25 (1.0 nm)/MgO (1.07 nm)/CoFeB25 (1.0 nm)/Ru (5 nm)/Ta (5 nm)/Ti—N(90 nm)/Ru (20 nm) are then laminated in this order to obtain a sample 11-2.

FIG. 42C shows a vertical cross-sectional view of an example of the evaluation element of the magnetoresistance effect element of the present invention. A Si/SiO$_2$ substrate, a reference layer, and a first junction layer (MgO, 1.06 nm) are laminated and then heated with infrared (IR) at 250° C. for 300 seconds and CoFeB25 (1.0 nm)/W (0.2 nm)/FeB25 (0.4 nm)/W (0.2 nm)/[CoFeB or FeB25] (0.9 nm)/MgO (0.9 nm)/FeB25 (0.9 nm)/W (0.2 nm)/FeB25 (0.4 nm)/W (0.2 nm)/FeB25 (0.9 nm)/MgO (1.07 nm)/CoFeB25 (1.0 nm)/Ru (5 nm)/Ta (5 nm)/Ti—N(90 nm)/Ru (20 nm) are then laminated in this order to obtain a sample 11-3.

FIG. 42D shows a vertical cross-sectional view of an example of the evaluation element of the magnetoresistance effect element of the present invention. A Si/SiO$_2$ substrate, a reference layer, and a first junction layer (MgO, 1.06 nm) are laminated and then heated with infrared (IR) at 250° C. for 300 seconds, and CoFeB25 (1.4 nm)/W (0.3 nm)/FeB25 (0.9 nm)/MgO (0.9 nm)/FeB25 (0.9 nm)/W (0.2 nm)/FeB25 (0.4 nm)/W (0.2 nm)/FeB25 (0.9 nm)/MgO (1.07 nm)/CoFeB25 (1.0 nm)/Ru (5 nm)/Ta (5 nm)/Ti—N(90 nm)/Ru (20 nm) are then laminated in this order to obtain a sample 11-4.

FIG. 42E shows a vertical cross-sectional view of an example of the evaluation element of the magnetoresistance effect element of the present invention. A Si/SiO$_2$ substrate, a reference layer, a Mg layer (0.1 nm)/a first junction layer (MgO, 0.97 nm)/Mg (0.15 nm) are laminated and then heated with infrared (IR) at 250° C. for 300 seconds, and CoFeB25 (1.4 nm)/W (0.3 nm)/CoFeB or FeB25 (0.9 nm)/MgO (0.9 nm)/FeB25 (0.9 nm)/W (0.2 nm)/FeB25 (0.4 nm)/W (0.2 nm)/FeB25 (0.9 nm)/MgO (1.07 nm)/CoFeB25 (1.0 nm)/Ru (5 nm)/Ta (5 nm)/Ti—N(90 nm)/Ru (20 nm) are then laminated in this order to obtain a sample 11-5.

Figure 43:
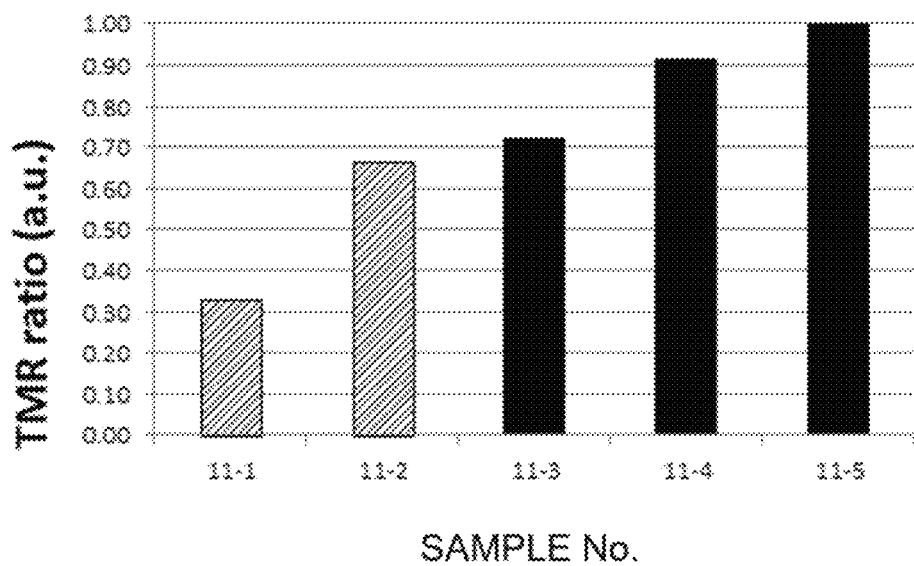
FIG. 43 is a graph showing a tunnel magnetoresistance ratio (TMR ratio) for each magnetoresistance effect element having a different element configuration and processing method.

FIG. 43 and Table 11 show the tunnel magnetoresistance ratio (TMR ratio) when the resistance area product RA of each sample is 5 $\Omega\mu m^2$. It is found that the tunnel magnetoresistance ratio (TMR ratio) is increased when the first junction layer MgO is heated with IR after lamination, when the magnetoresistance effect element having a so-called interface is used instead the quadruple of magnetoresistance effect element having a so-called double interface, when the Co/Fe ratio of the magnetic layer of the first divided recording layer 2 adjacent to the second junction layer MgO is reduced, and also when the first junction layer MgO is interposed between Mg layers.

TABLE 11

| Sample No. | Element and processing | TMR ratio (a.u.) | RA ($\Omega\mu m^2$) |
|---|---|---|---|
| 11-1 | Element having double interface | 0.33 | 5 |
| 11-2 | Element having double interface/heat with IR | 0.67 | 5 |
| 11-3 | Element having quadruple interface (second magnetic layer contains Co/heat with IR | 0.72 | 5 |
| 11-4 | Element having quadruple interface (second magnetic layer contains no Co/heat with IR | 0.91 | 5 |
| 11-5 | Element having quadruple interface (Mg barrier infirst junction layer)/heat with IR | 1.00 | 5 |

Embodiment 18

Figure 44:
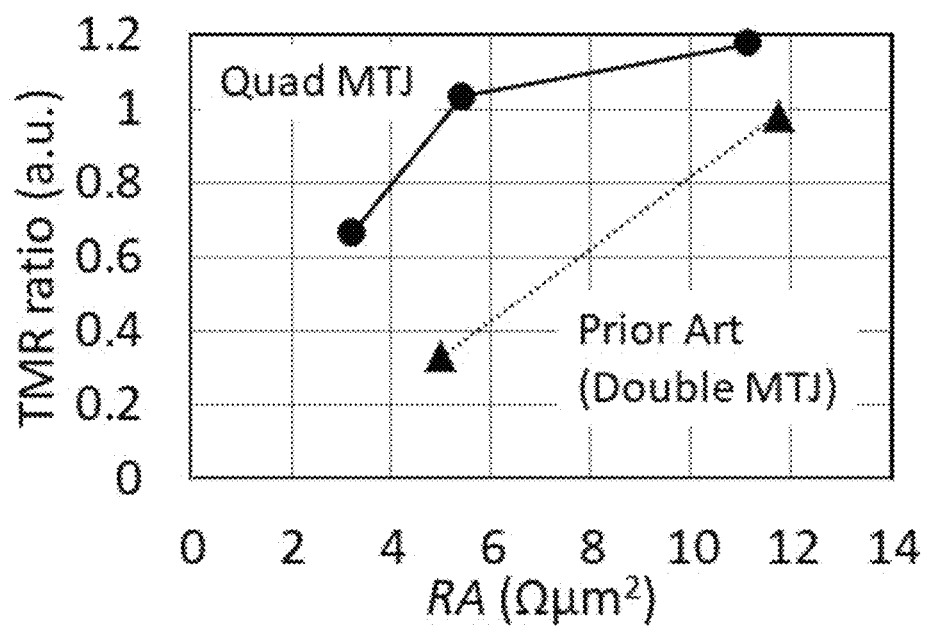
FIG. 44 is a graph in which the magnetoresistance effect element of the present invention and the magnetoresistance effect element of prior art are compared with respect to a correlation between the resistance area product RA and the tunnel magnetoresistance ratio (TMR ratio).

FIG. 44 shows the correlation between the resistance area product RA ($\Omega\mu m^2$) and the tunnel magnetoresistance ratio (TMR ratio) of the magnetoresistance effect element of the present invention and the magnetoresistance effect element of prior art.

It is found that, when the resistance area product RA is low as 5 $\Omega\mu m^2$, the tunnel magnetoresistance ratio (TMR ratio) of the magnetoresistance effect element of prior art having a so-called double interface is lowered to ½ or less, but the tunnel magnetoresistance ratio (TMR ratio) of the magnetoresistance effect element having a so-called quadruple interface of the present invention can maintain a high value. That is, the magnetoresistance effect element of the present invention can lower the resistance area product RA without lowering the tunnel magnetoresistance ratio (TMR ratio).

Embodiment 19

FIG. 45A shows a configuration of an element for evaluating performance when CoFeB is replaced with FeB in the third magnetic layer 3a1 and the fourth magnetic layer 3a3 of the second divided recording layer 3.

When the film thickness of FeB is 0 nm, the Co/Fe ratio is maximized, and when the film thickness of FeB is 1 nm, the Co/Fe ratio is minimized.

The evaluation element in FIG. 45A is annealed at 400° C. for 1 hour, the magnetization curve is measured, and the relationship between the film thickness of FeB and the effective magnetic anisotropy energy density $K_{eff}t2$ is determined.

FIG. 45B and Table 12 show the evaluation results. It is found that, when the film thickness of FeB is larger, that is, when the Co/Fe ratio is lower, the effective magnetic anisotropy energy density $K_{eff}t2$ is larger.

TABLE 12

| Sample No. | FeB thickness t (nm) | Keff$^{r2}$ (mJ/m$^2$) |
|---|---|---|
| 12-1 | 0.0 | 0.77 |
| 12-2 | 0.2 | 0.79 |
| 12-3 | 0.4 | 0.87 |
| 12-4 | 0.6 | 0.91 |
| 12-5 | 1.0 | 0.92 |

That is, at an interface between the second junction layer 12 and the third junction layer 13, the effective magnetic anisotropy energy density $K_{eff}t2$ increases as the amount of Co decreases, and the effective magnetic anisotropy energy density $K_{eff}t^*$ shown in Math. 4 increases. As a result, the thermal stability index Δ can be increased as shown in Math. 1.

Embodiment 20

FIG. 46 to FIG. 57 show an evaluation model used for evaluating the relationship between the thermal stability index Δ and the magnetic coupling force as Embodiment 20 and the evaluation results. Here, in Embodiment 20, the first divided recording layer 2 is a first divided recording layer FL1, the second divided recording layer 3 is a second divided recording layer FL2, and a magnetic coupling force acting between the first divided recording layer FL1 and the second divided recording layer FL2 is defined as an exchange magnetic coupling force Jex_mid.

It is thought that the exchange magnetic coupling force Jex_mid between the first divided recording layer FL1 and the second divided recording layer FL2 has an important influence on the thermal stability index Δ. Therefore, the relationship between the exchange magnetic coupling force Jex_mid and the thermal stability index Δ is estimated.

FIG. 46 shows a model used for calculation. $K_{eff1}$ and $K_{eff2}$ indicate an effective magnetic anisotropy energy volume density of the first divided recording layer FL1 and the second divided recording layer FL2, t1 and t2 indicate a film thickness of the first divided recording layer FL1 and the second divided recording layer FL2, $M_s1$ and $M_s2$ indicate a saturation magnetic flux density of the first divided recording layer FL1 and the second divided recording layer FL2, and $A_{stiff}1$ and $A_{stiff}2$ indicate an exchange stiffness constant of the first divided recording layer FL1 and the second divided recording layer FL2.

Figure 47:
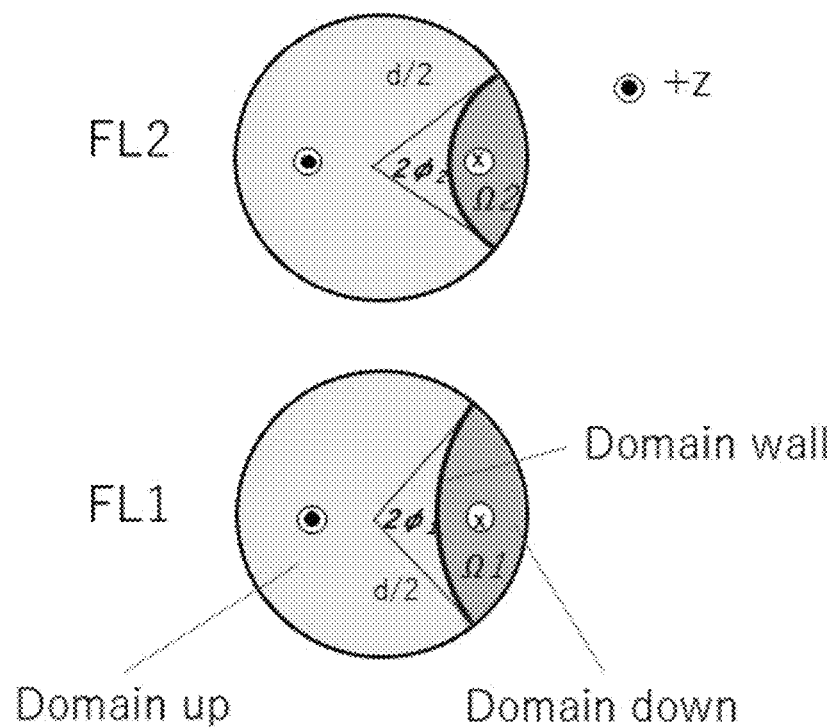
FIG. 47 shows a magnetization state of each divided recording layer.

FIG. 47 shows the magnetization state of the first divided recording layer FL1 and the second divided recording layer FL2 of the magnetic component. It is assumed that the first divided recording layer FL1 and the second divided recording layer FL2 form two magnetic domains with different magnetization directions. The magnetization of one magnetic domain (Domain up) is in the +z direction, and the magnetization of the other magnetic domain (Domain down) is in the −z direction. A parameter φ is introduced in order to express the size of the other magnetic domain (Domain down). As shown in FIG. 47, an angle formed by two tangents drawn from the center of the element to the other magnetic domain (Domain down) is defined as 2 φ. The area of the other magnetic domain (Domain down) is defined as Ω. A magnetic domain wall (Domain wall) appears at the boundary between one magnetic domain (Domain up) and the other magnetic domain (Domain down). The length of the magnetic domain wall (Domain wall) is defined as Λ.

The magnetic energy of the first divided recording layer FL1 and the second divided recording layer FL2 is represented by Formula (1) in Math. 6.

[Math. 6]

$$E(\varnothing1,\varnothing2)=\Lambda1(\varnothing1)t_1\sigma_{w1}+\Lambda2(\varnothing2)t_2\sigma_{w2}+2(J_{ex\_mid}+J_{stat})|\Omega1(\varnothing1)-\Omega2(\varnothing2)| \quad (1)$$

Here, $J_{ex\_mid}$ and $J_{stat}$ indicate an exchange magnetic coupling force and a magnetostatic coupling force between the first divided recording layer FL1 and the second divided recording layer FL2, and $\sigma_{w1}$ and $\sigma_{w2}$ indicate an energy per unit area of the magnetic domain wall of the first divided recording layer FL1 and the second divided recording layer FL2. $\sigma_{w1}$ and $\sigma_{w2}$ are represented by Formulae (2) and (3) in Math. 7.

[Math. 7]

$$\sigma_{w1}=4(A_{stiff}1K_{eff1}/2)^{1/2} \quad (2)$$

$$\sigma_{w2}=4(A_{stiff}2K_{eff2}/2)^{1/2} \quad (3)$$

The lengths Λ1 and Λ2 of the magnetic domain wall formed in the first divided recording layer FL1 and the second divided recording layer FL2 are represented by Formulae (4) and (5) in Math. 8.

[Math. 8]

$$\Lambda1(\varnothing1)=d(\pi/2-\varnothing1)\tan\varnothing1 \quad (4)$$

$$\Lambda2(\varnothing2)=d(\pi/2-\varnothing2)\tan\varnothing2 \quad (5)$$

Areas Ω1 and Ω2 of the other magnetic domain (Domain down) formed in the first divided recording layer FL1 and the second divided recording layer FL2 are represented by Formulae (6) and (7) in Math. 9.

[Math. 9]

$$\Omega1(\varnothing1)=d^2\varnothing1/4+d^{2/4}\{(\pi/2-\varnothing2)\tan^2\varnothing1-\tan\varnothing1\} \quad (6)$$

$$\Omega2(\varnothing2)=d^2\varnothing2/4+d^{2/4}\{(\pi/2-\varnothing2)\tan^2\varnothing2-\tan\varnothing2\} \quad (7)$$

Figure 48:
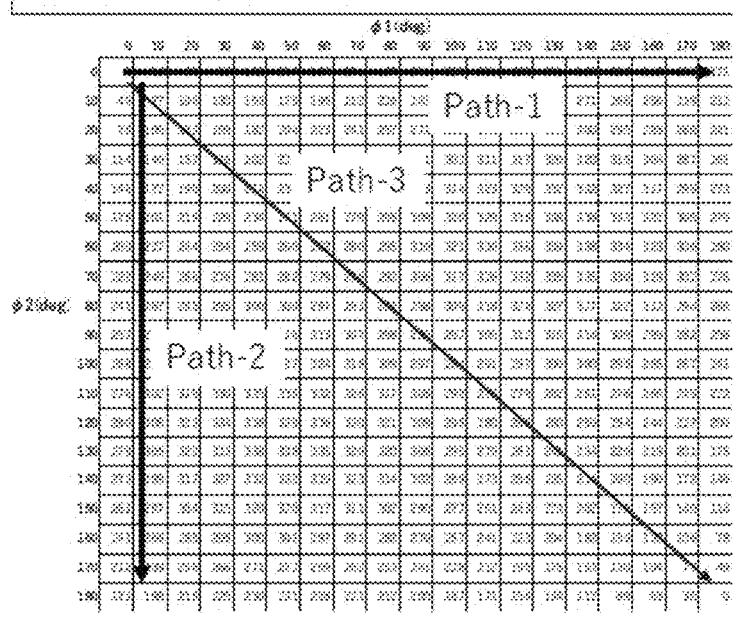
FIG. 48 shows a magnetization reversal path of the divided recording layer.

In order to calculate the thermal stability index Δ, the energy curve of the magnetic energy represented by Formula (1) is calculated. FIG. 48 shows an example of the result.

Figure 50:
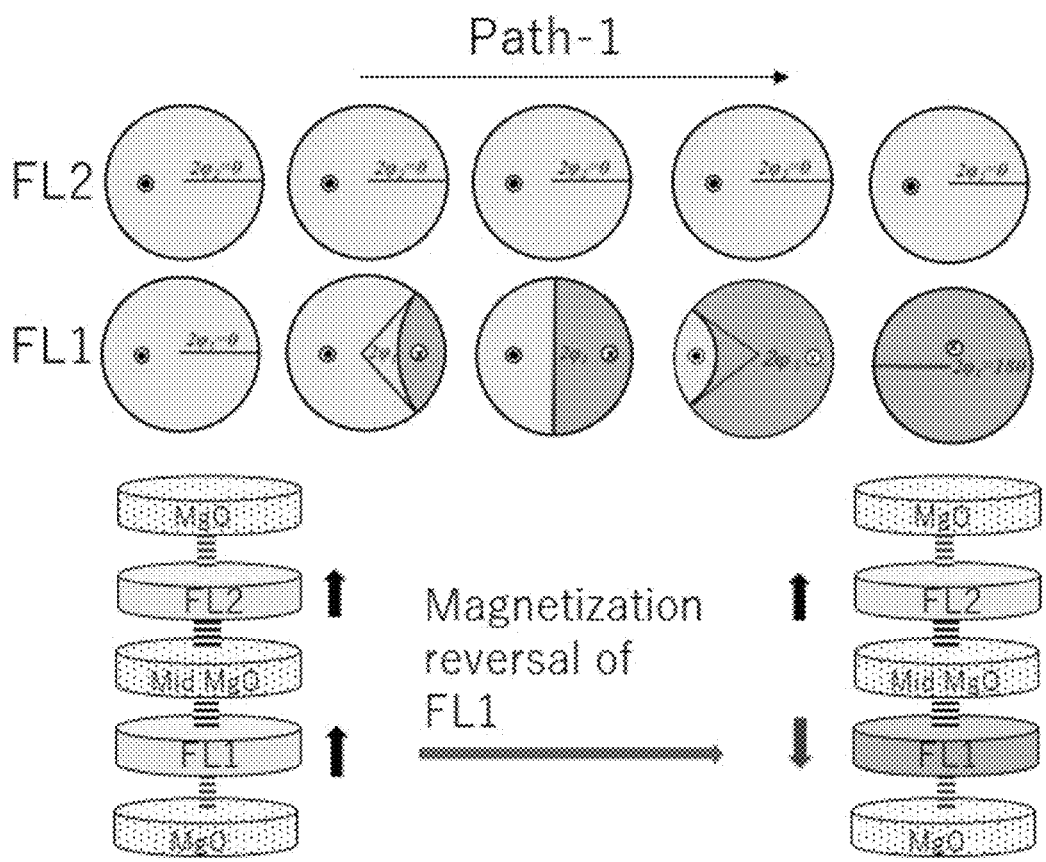
FIG. 50 shows change in the magnetization state of each divided recording layer in Path-1.
Figure 51:
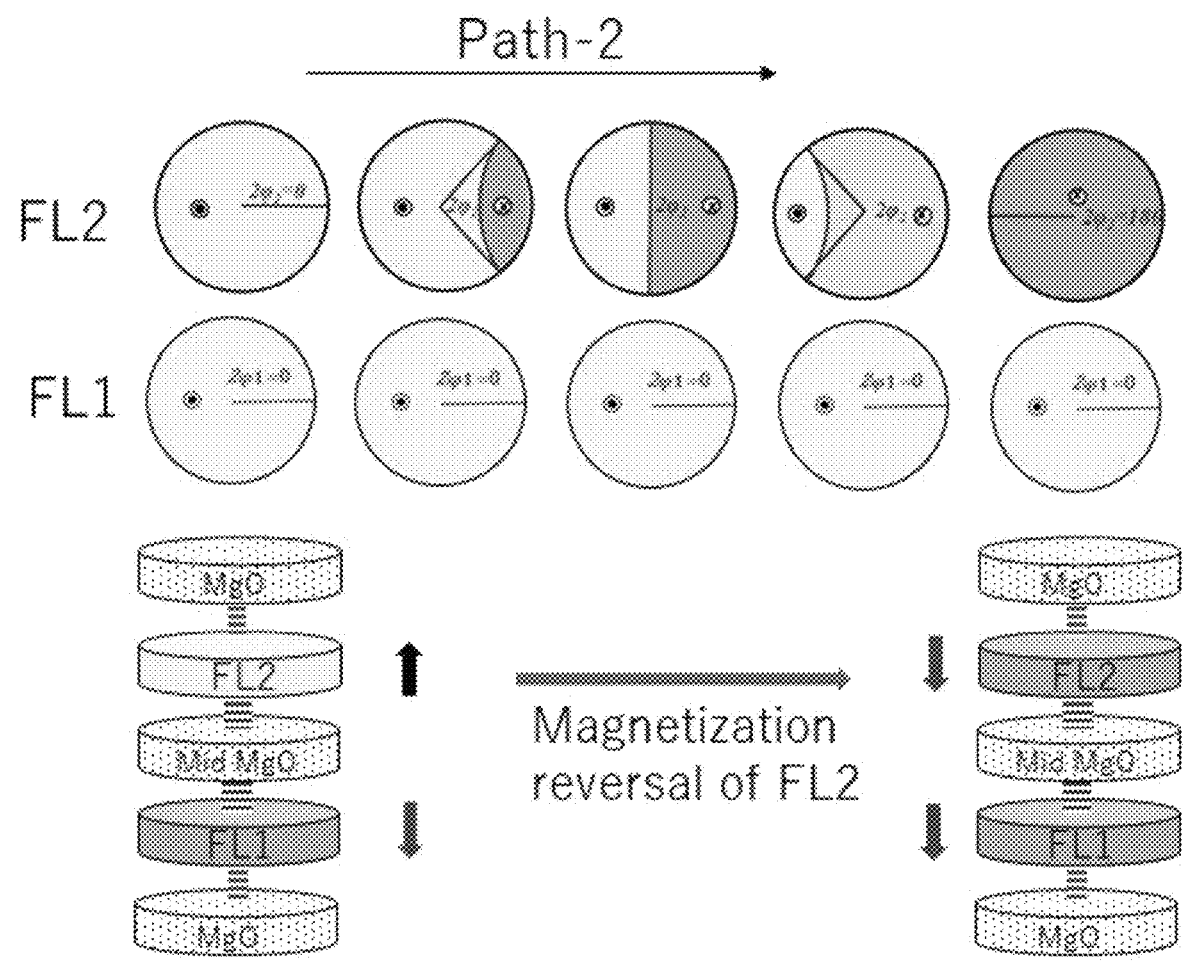
FIG. 51 shows change in the magnetization state of each divided recording layer in Path-2.
Figure 52:
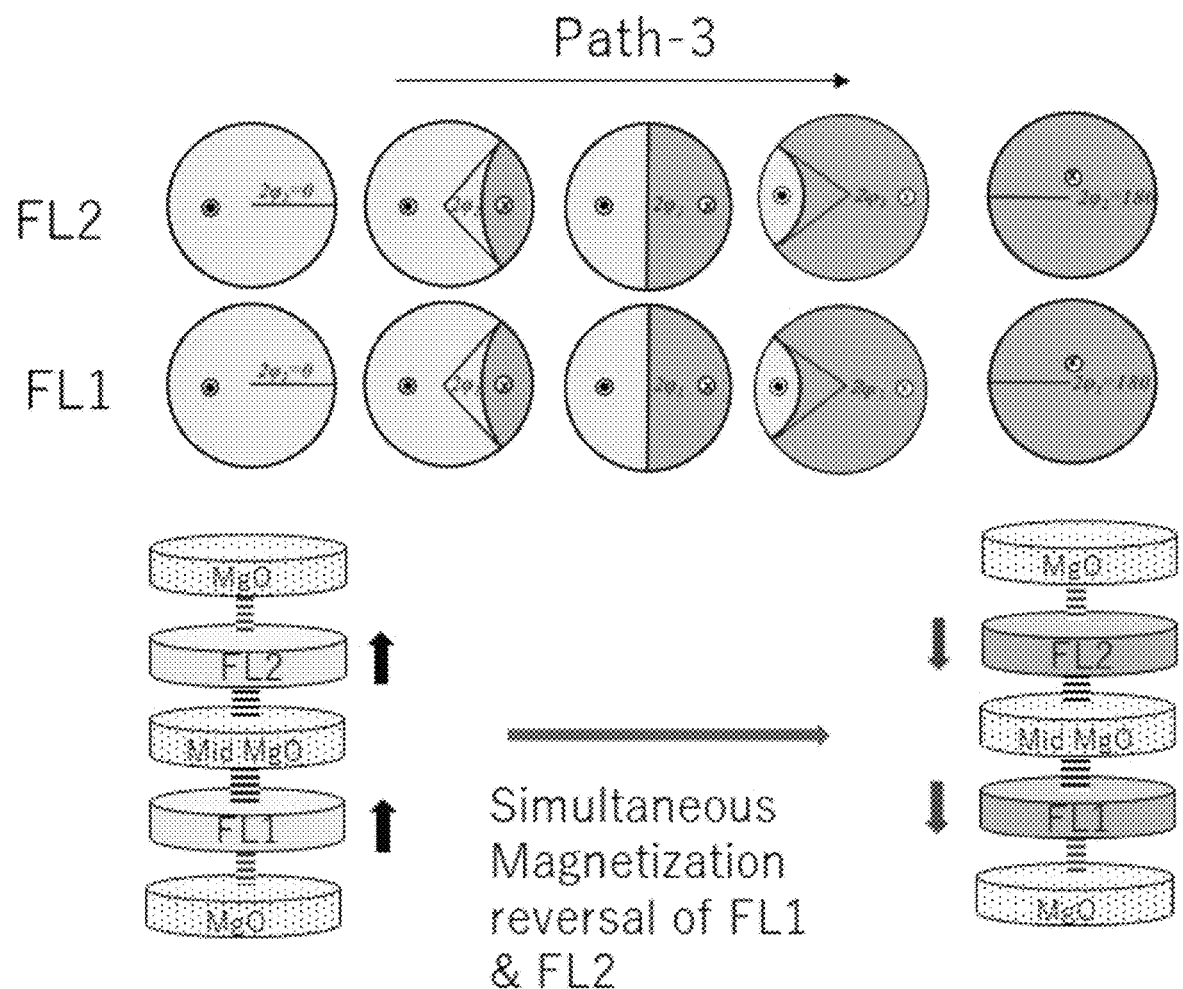
FIG. 52 shows change in the magnetization state of each divided recording layer in Path-3.

The numerical values in the squares designated by the coordinates (φ1, φ2) indicate magnetic energy represented by Formula (1). The coordinates (φ1, φ2)=(0,0) represent the state in which the magnetization of the first divided recording layer FL1 and the second divided recording layer FL2 is oriented in the +z direction, the coordinates (φ1, φ2)=(0, 180) represent the state in which the magnetization of the first divided recording layer FL1 is oriented in the +z direction and the magnetization of the second divided recording layer FL2 is oriented in the −z direction, the coordinates (φ1, φ2)=(180, 0) represent the state in which the magnetization of the first divided recording layer FL1 is oriented in the −z direction and the magnetization of the second divided recording layer FL2 is oriented in the +z direction, and the coordinates (φ1, φ2)=(180, 180) represent the state in which both the magnetization of the first divided recording layer FL1 and the magnetization of the second divided recording layer FL2 are oriented in the −z direction. The path in which the magnetization of the second divided recording layer FL2 does not change in the +z direction and only magnetization reversal of the first divided recording layer FL1 occurs is Path-1 in FIG. 48, and means that (φ1, φ2) moves from the coordinates (0, 0) to the coordinates (180, 0). The path in which the magnetization of the first divided recording layer FL1 does not change in the +z direction and only magnetization reversal of the second divided recording layer FL2 occurs is Path-2 in FIG. 48, and means that ($\varphi$1, $\varphi$2) moves from the coordinates (0,0) to the coordinates (0, 180). The path in which both the first divided recording layer FL1 and the second divided recording layer FL2 are magnetically reversed at the same time means that ($\varphi$1, $\varphi$2) moves from the coordinates (0,0) to the coordinates (180, 180) in FIG. 48. The fact that the magnetization of the recording layer is thermally stable means that no magnetization reversal occurs in Path-1, Path-2 or Path-3. There are other possible magnetization reversal paths in this energy curve, but paths other than Path-1, Path-2 and Path-3 need not be taken into account because they have a higher energy. FIG. 50 to FIG. 52 show the states of magnetization reversals of Path-1, Path-2 and Path-3.

FIG. 50 shows change in the magnetization state in Path-1 of FIG. 48. The magnetization of the second divided recording layer FL2 is constant in the +z direction and does not change, but in the initial state, the first divided recording layer FL1 is in a single magnetic domain state of one magnetic domain (Domain up) in which the magnetization is oriented in the +z direction, and the other magnetic domain (Domain down) grows, finally, the state changes to a single magnetic domain state of the other magnetic domain (Domain down) in which the magnetization is oriented in the −z direction.

FIG. 51 shows change in the magnetization state in Path-2 of FIG. 48. The magnetization of the first divided recording layer FL1 is constant in the +z direction and does not change, but in the initial state, the second divided recording layer FL2 is in a single magnetic domain state of one magnetic domain (Domain up) in which the magnetization is oriented in the +z direction, and the other magnetic domain (Domain down) grows, finally, the state changes to a single magnetic domain state of the other magnetic domain (Domain down) in which the magnetization is oriented in the −z direction.

FIG. 52 shows change in the magnetization state in Path-3 of FIG. 48. In the initial state, both the first divided recording layer FL1 and the second divided recording layer FL2 are in a single magnetic domain state of one magnetic domain (Domain up) in which the magnetization is oriented in the +z direction, and the other magnetic domain (Domain down) grows in both the first divided recording layer FL1 and the second divided recording layer FL2, finally, the magnetizations of both the first divided recording layer FL1 and the second divided recording layer FL2 change to a single magnetic domain state of the other magnetic domain (Domain down) oriented in the −z direction.

Figure 49:
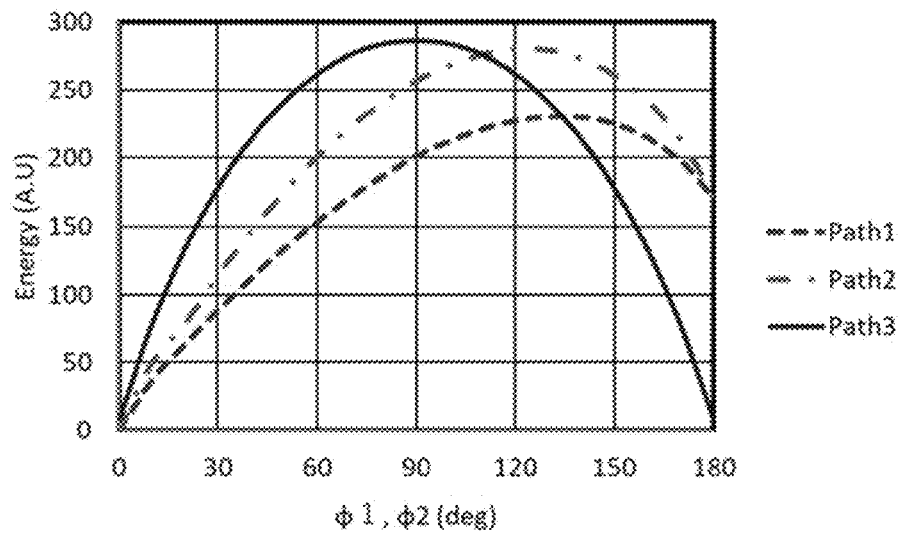
FIG. 49 shows change in magnetic energy of each path of magnetization reversal.

FIG. 49 shows the change in the magnetic energy of each path when magnetization reversal of Path-1, Path-2 and Path-3 occurs, with the energy of $\varphi$=0 as zero. All of the paths have an energy peak between $\varphi$=0 and 180, and magnetization reversal does not occur unless this peak is exceeded. This peak is an energy barrier of each path. In the example in FIG. 49, since the energy of Path-1 is the smallest, the magnetization reversal of Path-1 is most likely to occur, and this peak value is a thermal stability index $\Delta$.

Figure 53:
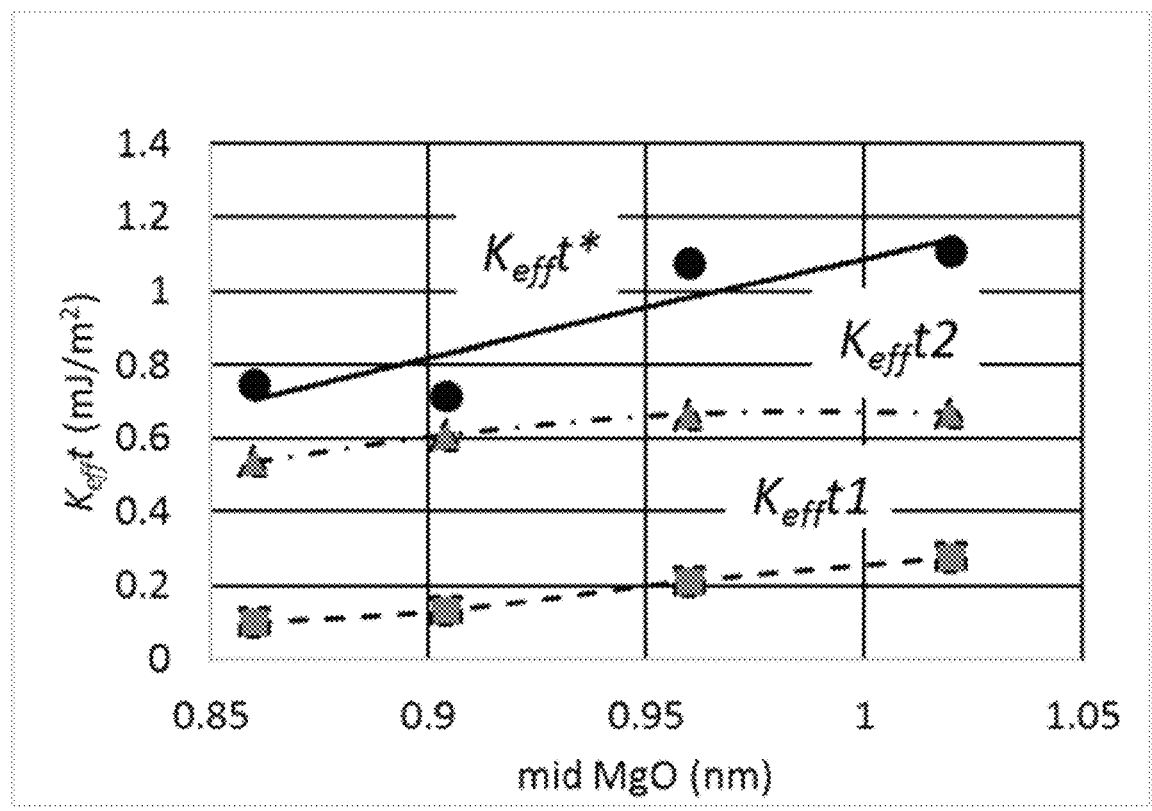
FIG. 53 shows the dependence of the effective magnetic anisotropy energy density on the film thickness of an intermediate MgO layer.
Figures 56A, 56B, 56C:
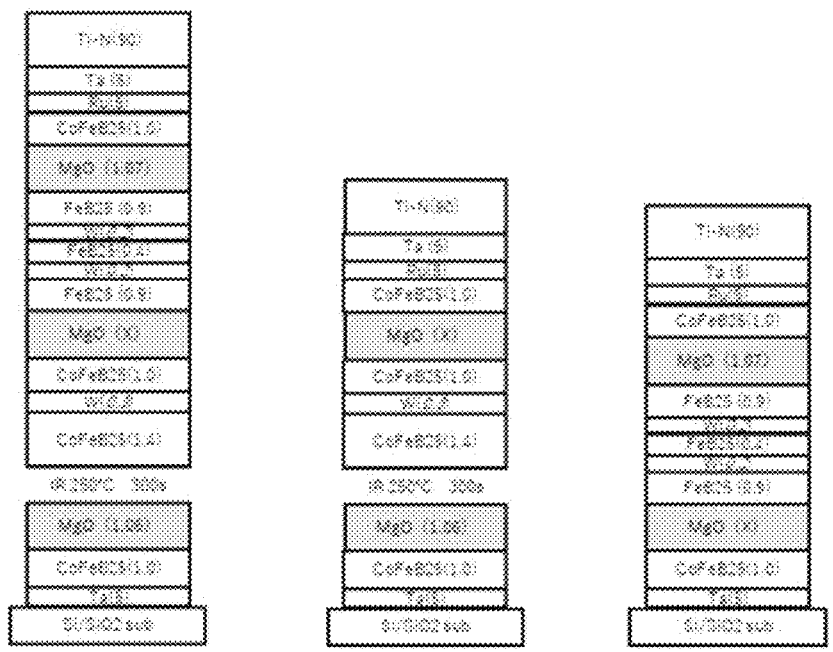
FIG. 56A shows a configuration of an evaluation sample of an effective magnetic anisotropy energy density.
FIG. 56B shows a configuration of an evaluation sample of an effective magnetic anisotropy energy density.
FIG. 56C shows a configuration of an evaluation sample of an effective magnetic anisotropy energy density.
Figure 57:
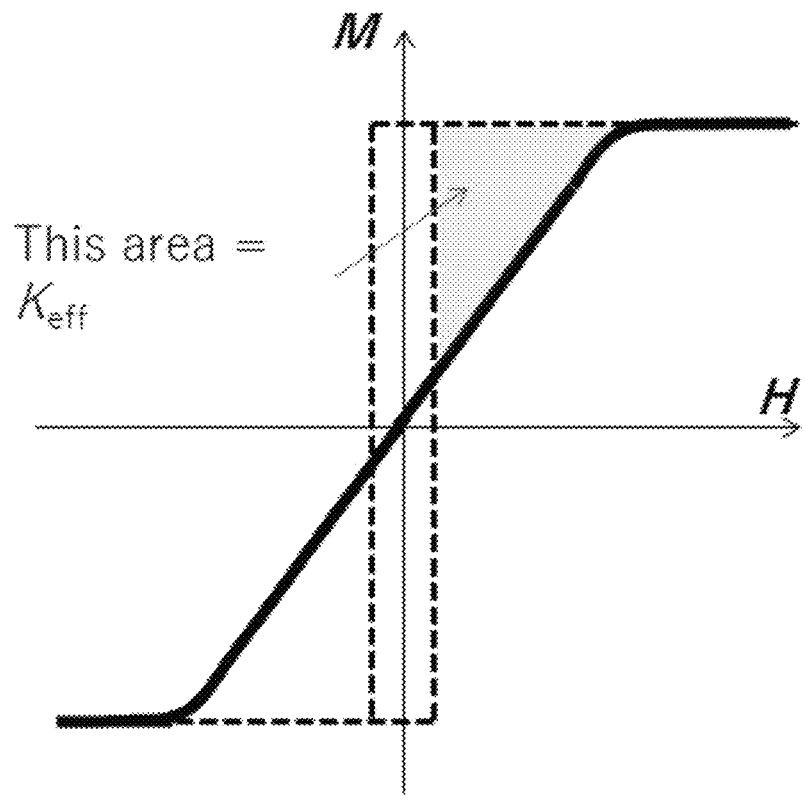
FIG. 57 shows a schematic diagram in which M-H curves in a direction perpendicular to a film surface and a direction parallel to a film surface are plotted.

FIG. 53 shows the dependence of the effective magnetic anisotropy energy densities $K_{eff}$t1, and $K_{eff}$t2, $K_{eff}$t* on the film thickness of the intermediate MgO. FIG. 56A to FIG. 56C show the structure of the sample used for evaluation. FIG. 56A shows a configuration for the effective magnetic anisotropy energy volume density $K_{eff}$ of the first divided recording layer FL1 and the second divided recording layer FL2 as a whole, FIG. 56B shows a configuration for evaluating the effective magnetic anisotropy energy volume density $K_{eff1}$ of the first divided recording layer FL1, and FIG. 56C shows a configuration for evaluating the effective magnetic anisotropy energy volume density $K_{eff2}$ of the second divided recording layer FL2. For measurement, a vibration sample type magnetic measurement device is used. By sweeping a magnetic field in a direction perpendicular to a film surface (out of plane) and a direction parallel to a film surface (in plane), and measuring a magnetic moment in the direction, two magnetization curves (M-H loop) in the direction perpendicular to a film surface (out of plane) and the direction parallel to a film surface (in plane) are obtained. FIG. 57 shows a schematic diagram in which an M-H curve in the direction perpendicular to a film surface (out of plane) and an M-H curve in the direction parallel to a film surface (in plane) are plotted on the same M-H plane. The area interposed between two M-H curves in the drawing is an effective magnetic anisotropy energy volume density $K_{eff}$.

As described above, the material configuration of the first divided recording layer FL1 is a configuration in which the MR ratio is maximized, and the second divided recording layer FL2 has a material configuration in which perpendicular magnetic anisotropy is maximized. Therefore, as can be seen from FIG. 53, the effective magnetic anisotropy energy density $K_{eff}$t1 has a value that is considerably smaller than the effective magnetic anisotropy energy density $K_{eff}$t2. For calculation, the values of the effective magnetic anisotropy energy density $K_{eff}$t1 and the effective magnetic anisotropy energy density $K_{eff}$t2, and the value (0.21 mJ/m$^2$ and 0.66 mJ/m$^2$) of the intermediate MgO (0.96 nm) are used. In addition, for the exchange stiffness constant $A_{stiff}$1 and the exchange stiffness constant $A_{stiff}$1, 5.3 pJ/m which is a measured value of the CoFeB alloy, is used.

Here, the effective magnetic anisotropy energy density $K_{eff}$ t* is a product of the effective magnetic anisotropy energy volume density $K_{eff}$ and the film thickness (t1+t2) obtained from the sample in FIG. 56A, the effective magnetic anisotropy energy density $K_{eff}$ t1 is a product of the effective magnetic anisotropy energy volume density $K_{eff}$ and the film thickness t1 obtained from the sample in FIG. 56B, and the effective magnetic anisotropy energy density $K_{eff}$ t2 is a product of the effective magnetic anisotropy energy volume density $K_{eff}$2 and the film thickness t2 obtained from the sample in FIG. 56C.

Figure 54:
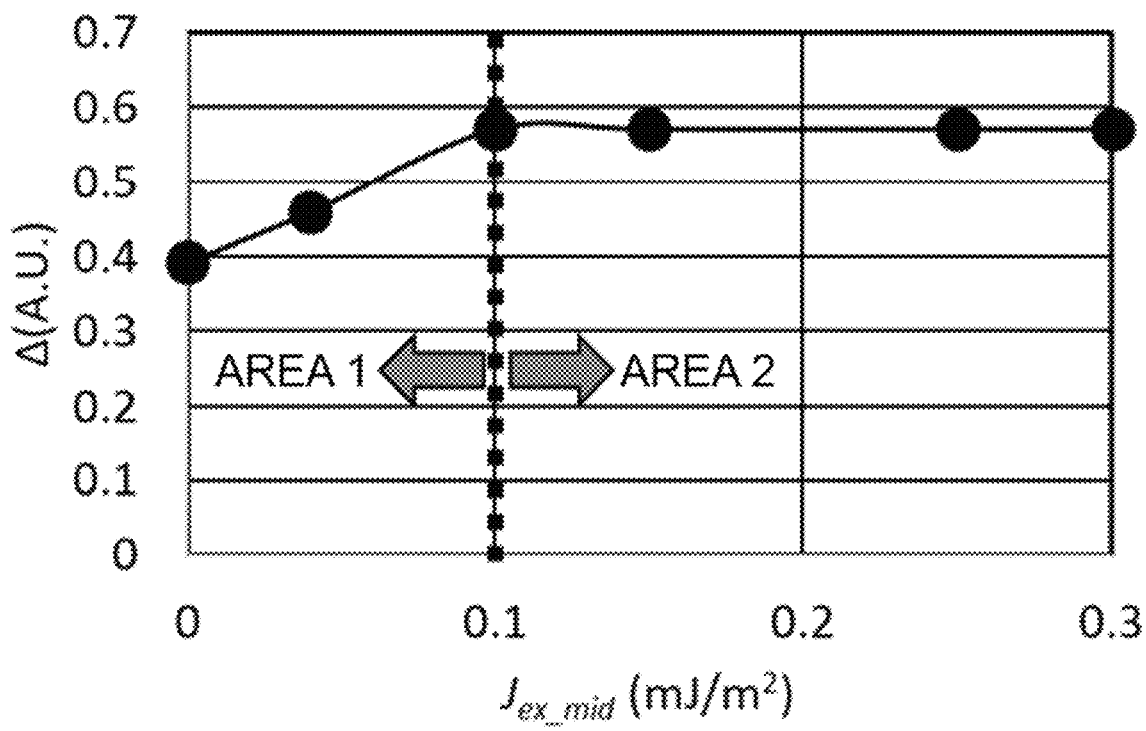
FIG. 54 shows the dependence of the thermal stability index Δ on the exchange magnetic coupling force.

In an element with a diameter d=56 nm, the exchange magnetic coupling force Jex_mid is set to 0, 0.04, 0.1, 0.15, 0.25, 0.3 mJ/m$^2$, and the magnetic energy curved surface E ($\varphi$1, $\varphi$2) of $\varphi$1-$\varphi$2 calculated from Formula (1) is calculated with each value of the exchange magnetic coupling force Jex_mid, and the smallest value among the energy barriers of Path-1, Path-2 and Path-3 is defined as a thermal stability index $\Delta$. FIG. 54 shows the dependence of the calculated thermal stability index $\Delta$ on the exchange magnetic coupling force Jex_mid. Here, for the magnetostatic coupling force $J_{stat}$, 0.12 mJ/m$^2$ is used.

As a result, when the exchange magnetic coupling force Jex_mid increases in a range of 0 to 0.1 mJ/m$^2$, the thermal stability index $\Delta$ increases, and $\Delta$ is a constant value when the exchange magnetic coupling force Jex_mid is 0 to 0.1 mJ/m$^2$ or more. In FIG. 54, an area with an exchange magnetic coupling force Jex_mid of 0.1 or less is defined as an area 1, and an area with an exchange magnetic coupling force Jex_mid of 0.1 or more is defined as an area 2. As can be seen from FIG. 49, which is a calculation example with an exchange magnetic coupling force Jex_mid of =0.04 mJ/m$^2$, in the area 1, Path-1 has the smallest energy barrier among Path-1, Path-2 and Path-3, and in the area 1, the thermal stability index Δ is determined in a magnetization reversal mode in which only the first divided recording layer FL1 is reversed.

Figure 55:
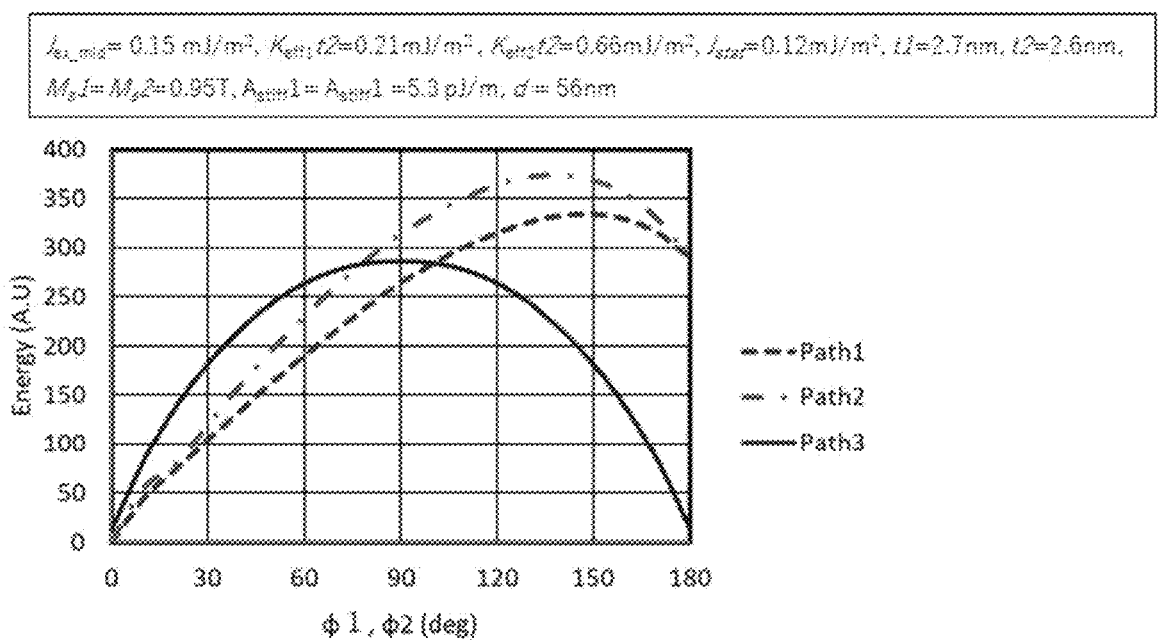
FIG. 55 shows an energy curve in each magnetization reversal path.

FIG. 55 shows an example of energy curves of Path-1, Path-2 and Path-3 when the exchange magnetic coupling force Jex_mid is 0.15 mJ/m². The energy barrier of Path-3 is the smallest as compared with the energy barriers of Path-1 and Path-2. In the area 2, the thermal stability index Δ is determined in Path-3, that is, in a magnetization reversal mode in which the first divided recording layer FL1 and the second divided recording layer FL2 are reversed at the same time.

Based on the above, in order to maximize the thermal stability index Δ, in the MTJ element, it is desirable that the exchange magnetic coupling force Jex_mid be a value of 0.1 mJ/m² or more.

The layer configurations shown in the embodiments of the present invention may be adjacently disposed in order, and a lamination method, a lamination order, up, down, right and left orientations and the like are not limited.

REFERENCE SIGNS LIST

11 First junction layer
12 Second junction layer
13 Third junction layer
14, 16 Non-magnetic junction layer
2 First divided recording layer
2a1 First magnetic layer
2a2 Second magnetic layer
2b1 First non-magnetic coupling layer
3 Second divided recording layer
3a1 Third magnetic layer
3a2 Magnetic coupling layer
3a3 Fourth magnetic layer
3b1 Second non-magnetic coupling layer
3b2 Third non-magnetic coupling layer
A1 First recording layer
A2 Second recording layer
B1 First reference layer
B2 Second reference layer
B3 Third reference layer
E1 Lower electrode
E2 Upper electrode
BL1 First bit line
BL2 Second bit line
GND Ground line
WL Word line
FL1 First divided recording layer
FL2 Second divided recording layer

The invention claimed is:

1. A magnetoresistance effect element, comprising:
a first reference layer (B1);
a first junction layer (11) that is provided in direct contact to the first reference layer (B1);
a first divided recording layer (2) that is provided in direct contact to an opposite side of the first junction layer (11) to the first reference layer (B1);
a second junction layer (12) that is provided in direct contact to an opposite side of the first divided recording layer (2) to the first junction layer (11);
a second divided recording layer (3) that is provided in direct contact to an opposite side of the second junction layer (12) to the first divided recording layer (2); and
a third junction layer (13) that is provided in direct contact to an opposite side of the second divided recording layer (3) to the second junction layer (12), wherein
the first junction layer (11), the second junction layer (12) and the third junction layer (13) contain oxygen (O) and Mg, and the first junction layer (11) is a tunnel barrier layer,
the first divided recording layer (2), the second junction layer (12) and the second divided recording layer (3) constitute a first recording layer (A1),
the first divided recording layer (2) contains at least Co and Fe, and has an interfacial magnetic anisotropy in a direction perpendicular to a film surface at an interface with the first junction layer (11) and at an interface with the second junction layer (12),
a crystal structure at an interface with an entire first divided recording layer (2) or the first junction layer (11) is bcc,
the second divided recording layer (3) contains at least Fe,
a Co/Fe ratio of the entire first divided recording layer (2) is larger than a Co/Fe ratio of the entire second divided recording layer (3),
a film thickness of the second junction layer (12) is 1.0 nm or less,
the Co/Fe ratio of the first divided recording layer (2) is 0.18 or more and 3 or less, and
a Boron (B) concentration of the entire first divided recording layer (2) is lower than a Boron (B) concentration of the entire second divided recording layer (3), and 20 at. % or more and 35 at. % or less.

2. The magnetoresistance effect element according to claim 1, wherein
the second divided recording layer (3) includes
a third magnetic layer (3a1) that is provided in direct contact to the second junction layer (12),
a second non-magnetic coupling layer (3b1) that is provided in direct contact to an opposite side of the third magnetic layer (3a1) to the second junction layer (12),
a magnetic coupling layer (3a2) that is provided in direct contact to an opposite side of the second non-magnetic coupling layer (3b1) to the third magnetic layer (3a1),
a third non-magnetic coupling layer (3b2) that is provided in direct contact to an opposite side of the magnetic coupling layer (3a2) to the second non-magnetic coupling layer (3b1), and
a fourth magnetic layer (3a3) that is provided in direct contact to an opposite side of the third non-magnetic coupling layer (3b2) to the magnetic coupling layer (3a2) and provided in direct contact to the third junction layer (13).

3. The magnetoresistance effect element according to claim 1, wherein
the first divided recording layer (2) includes
a first magnetic layer (2a1) that is provided in direct contact to the first junction layer (11),
a first non-magnetic coupling layer (2b1) that is provided in direct contact to an opposite side of the first magnetic layer (2a1) to the first junction layer (11), and
a second magnetic layer (2a2) that is in direct contact to an opposite side of the first non-magnetic coupling layer (2b1) to the first magnetic layer (2a1) and provided in direct contact to the second junction layer (12).

4. The magnetoresistance effect element according to claim 1, further comprising a second reference layer (B2) that is provided in direct contact to an opposite side of the third junction layer (13) to the first recording layer (A1).

5. A film formation method for a magnetoresistance effect element, the film formation method comprising:
- a step of depositing a first junction layer (11) on a deposited first reference layer (B1);
- a step of performing treatment of heating a film in which the deposited first junction layer (11) is an uppermost part;
- a step of performing treatment of cooling the film that has been applied the treatment of heating;
- a step of depositing a first divided recording layer (2) on the first junction layer (11) of the film that has been applied the treatment of cooling;
- a step of depositing a second junction layer (12) on the deposited first divided recording layer (2);
- a step of depositing a second divided recording layer (3) on the deposited second junction layer (12);
- a step of depositing a third junction layer (13) on the deposited second divided recording layer (3); and
- a step of depositing a second reference layer (B2) or an upper electrode (E2) on the deposited third junction layer (13), wherein
the second junction layer (12) is not applied treatment of heating and cooling before the step of depositing the second divided recording layer (3); and
the third junction layer (13) is not applied treatment of heating and cooling before the step of depositing the second reference layer (B2) or the upper electrode (E2).

6. The film formation method according to claim 5, wherein
the first junction layer (11), the second junction layer (12) and the third junction layer (13) contain oxygen (O), and the first junction layer (11) is a tunnel barrier layer,
the first divided recording layer (2), the second junction layer (12) and the second divided recording layer (3) constitute a first recording layer (A1), and
a Co/Fe ratio of the first divided recording layer (2) is larger than a Co/Fe ratio of the second divided recording layer (3).

7. The film formation method according to claim 5, wherein a temperature of the heat treatment is in a range of 150° C. to 400° C., and a time of the heat treatment is in a range of 100 seconds to 400 seconds.

8. A magnetic memory comprising the magnetoresistance effect element according to claim 1.

* * * * *